United States Patent
Jhan et al.

(10) Patent No.: US 12,376,336 B2
(45) Date of Patent: Jul. 29, 2025

(54) SEMICONDUCTOR DEVICE WITH IMPROVED SOURCE/DRAIN CONTACT AND METHOD FOR FORMING THE SAME

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Shun-Siang Jhan, Kaohsiung (TW); Ang-Sheng Chou, Hsinchu (TW); I-Chih Ni, New Taipei (TW); Chih-I Wu, Taipei (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 615 days.

(21) Appl. No.: 17/698,696

(22) Filed: Mar. 18, 2022

(65) Prior Publication Data
US 2023/0317852 A1 Oct. 5, 2023

(51) Int. Cl.
*H10D 30/67* (2025.01)
*H01L 21/02* (2006.01)
(Continued)

(52) U.S. Cl.
CPC ... *H10D 30/6713* (2025.01); *H01L 21/02631* (2013.01); *H10D 30/031* (2025.01);
(Continued)

(58) Field of Classification Search
CPC ......... H01L 21/02488; H01L 21/02568; H01L 21/0259; H01L 21/02631; H01L 21/823412; H01L 21/823418; H01L 29/78618; H01L 29/41733; H01L 29/66742; H01L 29/78696; H01L 29/78684; H01L 29/78681
(Continued)

(56) References Cited

U.S. PATENT DOCUMENTS

2016/0218205 A1* 7/2016 Hsu .................. H01L 29/66462
2016/0268382 A1* 9/2016 Colinge ............ H01L 21/76895
(Continued)

OTHER PUBLICATIONS

CRC Handbook of Chemistry and Physics 95th Edition melting point Au Bi Pt Pd (Year: 2014).*
(Continued)

*Primary Examiner* — Eva Y Montalvo
*Assistant Examiner* — Jiyoung Oh
(74) *Attorney, Agent, or Firm* — Maschoff Brennan

(57) ABSTRACT

A method includes forming a 2-D semiconductor material layer over a substrate; forming source/drain contacts over source/drain regions of the 2-D semiconductor material layer; and forming a gate structure over a channel region of the 2-D semiconductor material layer. Forming the source/drain contacts includes performing a first deposition process to deposit a first metal layer over the 2-D semiconductor material layer; and after the first deposition process is completed, performing a second deposition process to deposit a second metal layer over the first metal layer, in which the second metal layer has a higher melting point than the first metal layer.

20 Claims, 54 Drawing Sheets

(51) Int. Cl.
    H10D 30/01        (2025.01)
    H10D 84/01        (2025.01)
    H10D 84/03        (2025.01)
(52) U.S. Cl.
    CPC ..... H10D 30/6729 (2025.01); H10D 30/6757 (2025.01); H10D 84/0128 (2025.01); H10D 84/013 (2025.01); H10D 84/038 (2025.01)
(58) Field of Classification Search
    USPC ........................................................ 257/288
    See application file for complete search history.

(56) References Cited

U.S. PATENT DOCUMENTS

2019/0080982 A1* 3/2019 Bultitude ................ H01L 25/50
2021/0057524 A1* 2/2021 Lin ......................... H10D 30/47

OTHER PUBLICATIONS

Daniel S. Schulman et al., "Contact Engineering for 2D Materials and Devices." Chemical Society Reviews, vol. 47, No. 9, May 7, 2018, pp. 3037-3058.
Zhonghan Cao et al., "Low Schottky Barrier Contacts to 2H-MoS2 by SN Electrodes." Applied Physics Letters, vol. 116, No. 2, Jan. 13, 2020.
Bum-Kyu Kim et al., "Origins of Genuine Ohmic Van Der Waals Contact between Indium and MoS2." Npj 2D Materials and Applications, vol. 5, Jan. 8, 2021.
Kappera Rajesh et al., "Phase-Engineered Low-Resistance Contacts for Ultrathin MoS2 Transistors." Nature Materials, Aug. 31, 2014.
Kishan Ashokbhai Patel et al., "Ultra-Scaled MoS2 Transistors and Circuits Fabricated without Nanolithography." 2D Materials, vol. 7, Nov. 21, 2019.
The International Roadmap for Devices and Systems "More Moore" IEEE, 2020.
The International Roadmap for Devices and Systems "Executive Summary 2020 Edition" IEEE, 2020.
Connor J. McClellan et al. "Effective n-type doping of monolayer MoS2 by AlOx." 2017 75th Annual Device Research Conference (DRC). IEEE, Jun. 25, 2017.
Amritesh Rai et al., "Air Stable Doping and Intrinsic Mobility Enhancement in Monolayer Molybdenum Disulfide by Amorphous Titanium Suboxide Encapsulation." Nano Letters, Jun. 19, 2015.
Yan Wang et al., "Van der Waals contacts between three-dimensional metals and two-dimensional semiconductors." Nature 568(7750), Mar. 27, 2019.
Xu Cui et al., "Low-Temperature Ohmic Contact to Monolayer MoS2 by Van Der Waals Bonded CO/h-BN Electrodes." Nano Letters, vol. 17, No. 8, Jul. 10, 2017.
Divya Somvanshi et al., "Nature of Carrier Injection in Metal/2d-Semiconductor Interface and Its Implications for the Limits of Contact Resistance." Physical Review B, vol. 96, No. 205423, Nov. 15, 2017.
Chris D. English et al., "Improved Contacts to MoS2 Transistors by Ultra-High Vacuum Metal Deposition." Nano Letters, vol. 16, No. 6, May 27, 2016.
Kirby K. H. Smithe et al., "Low Variability in Synthetic Monolayer MoS2 Devices." ACS Nano, Jul. 11, 2017, pp. 8456-8463.

* cited by examiner

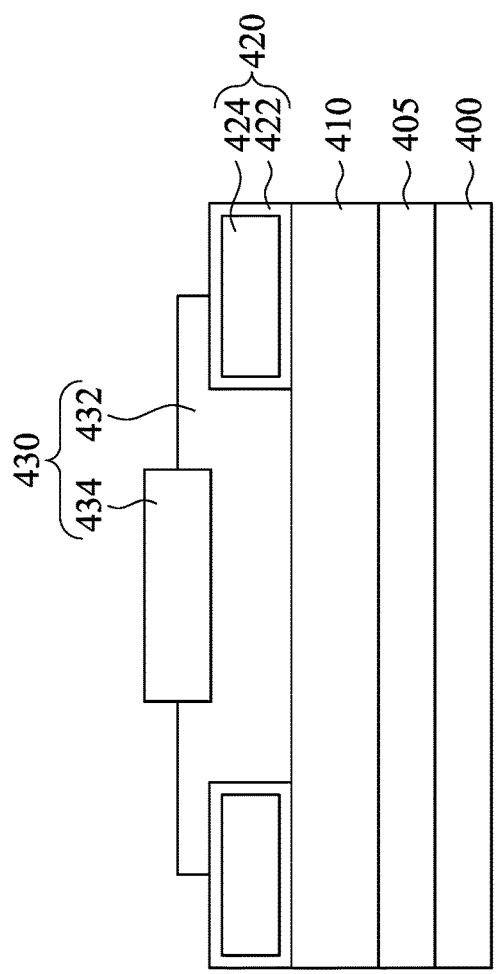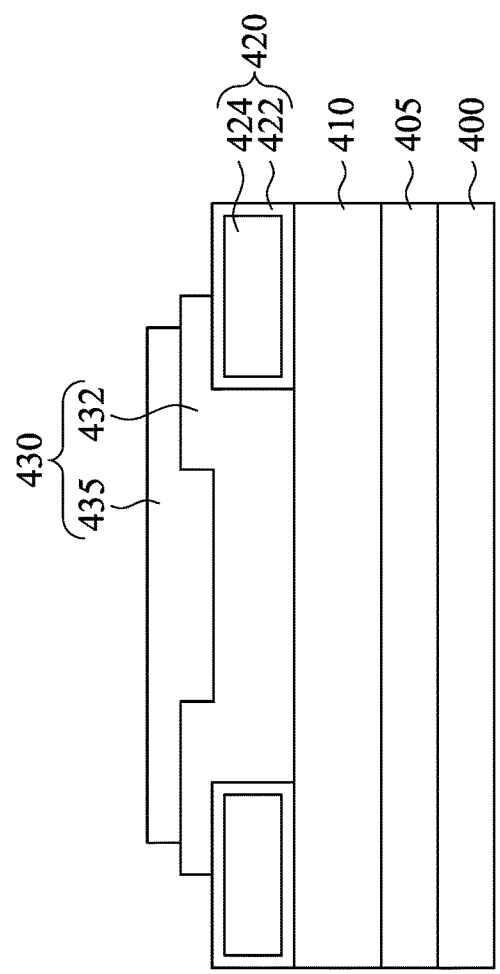

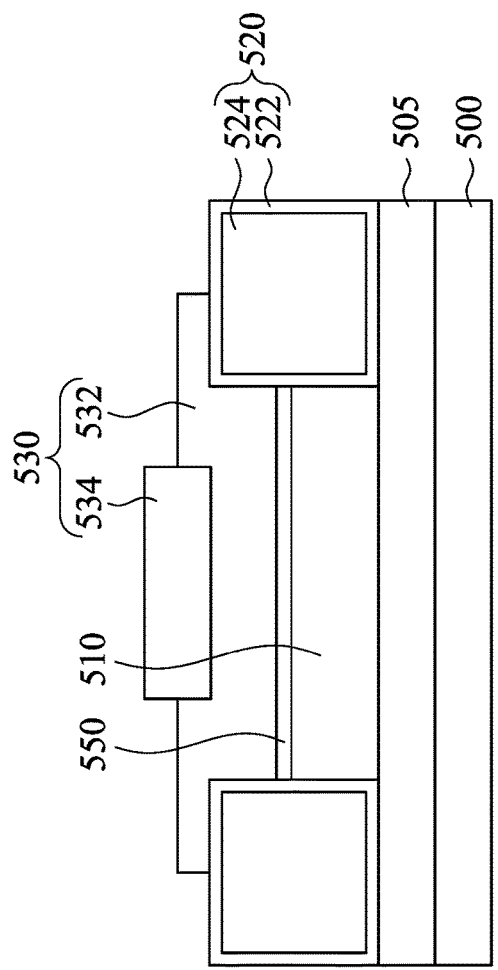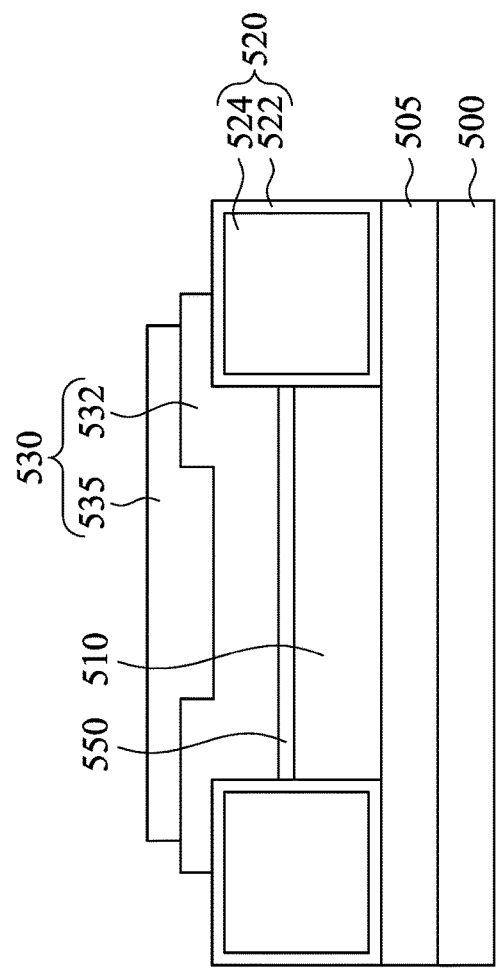

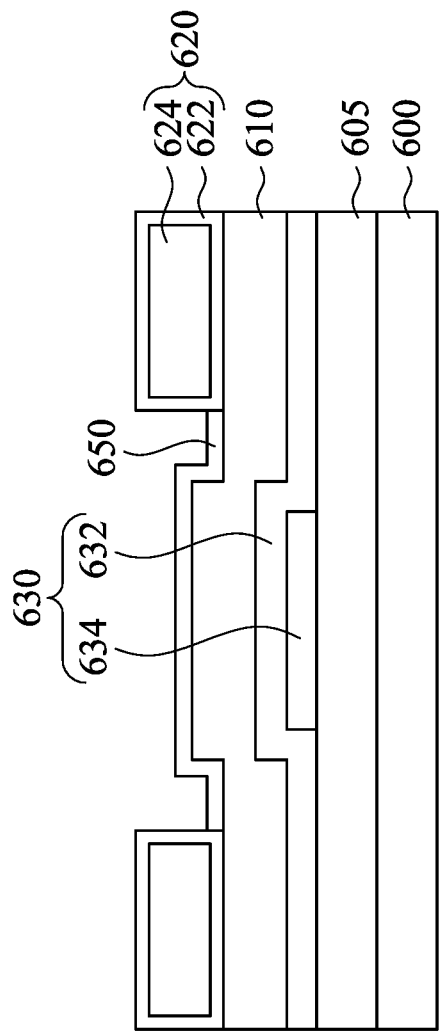
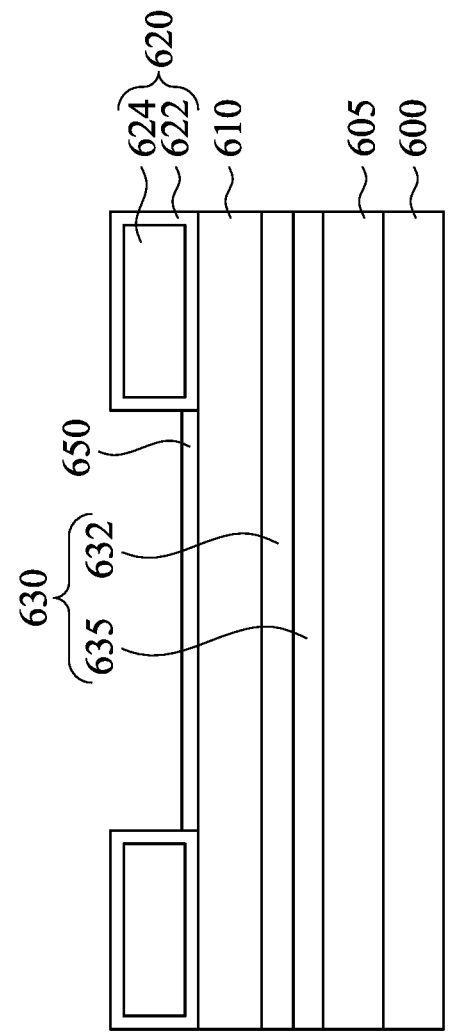
Fig. 43D
Fig. 43E

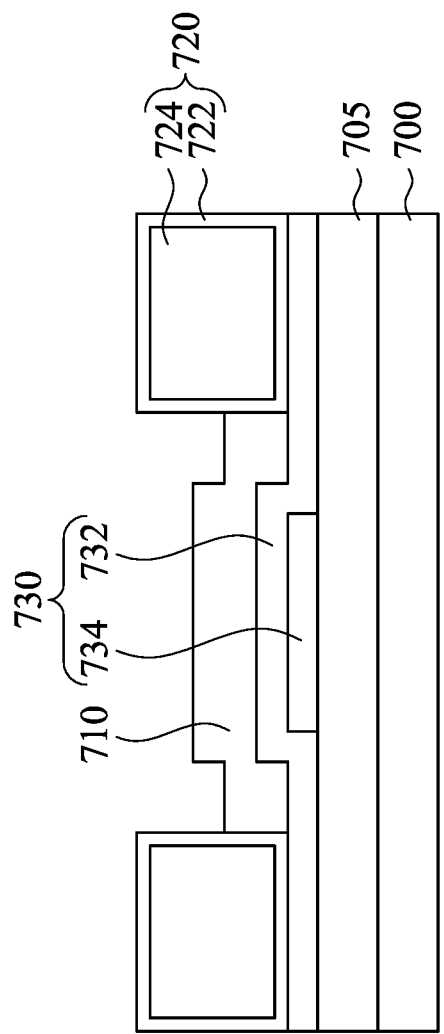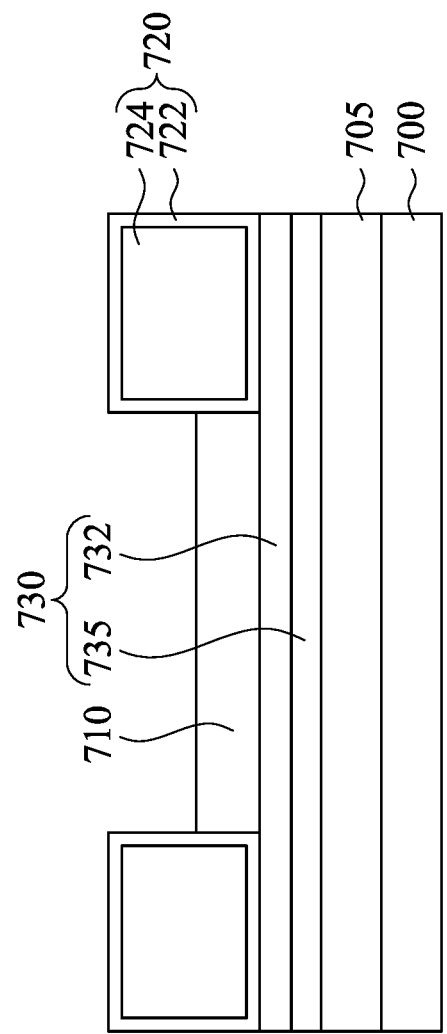

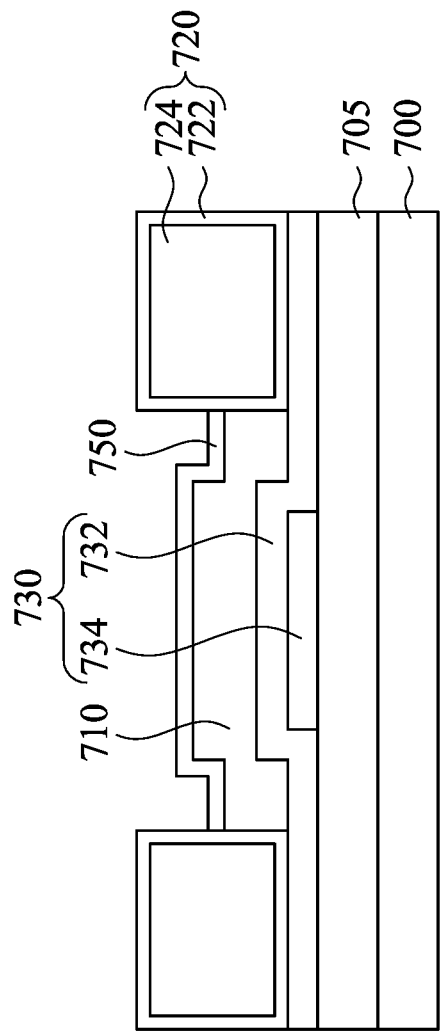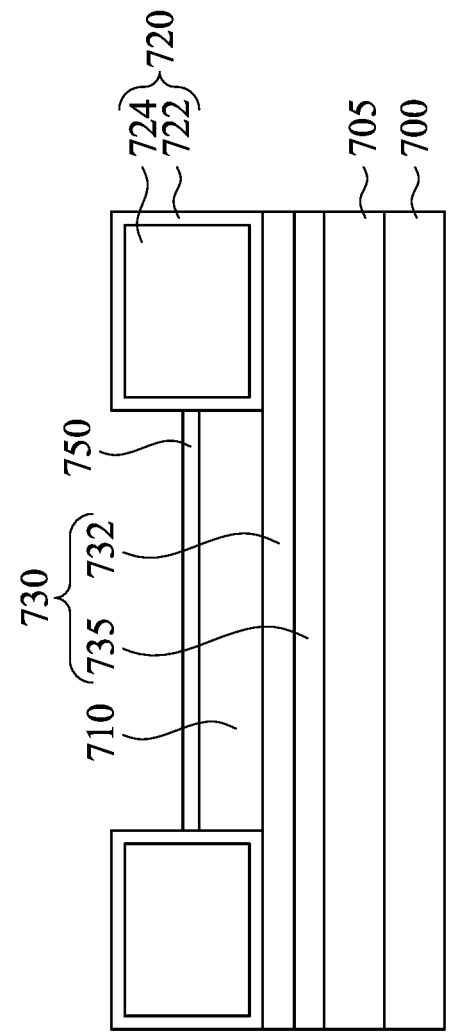

SEMICONDUCTOR DEVICE WITH IMPROVED SOURCE/DRAIN CONTACT AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 41A to 41E illustrate semiconductor devices in accordance with some embodiments of the present disclosure.

FIGS. 42A to 42E illustrate semiconductor devices in accordance with some embodiments of the present disclosure.

FIGS. 43A to 43E illustrate semiconductor devices in accordance with some embodiments of the present disclosure.

FIGS. 44A to 44E illustrate semiconductor devices in accordance with some embodiments of the present disclosure.

DETAILED DESCRIPTION

Figure 1B:
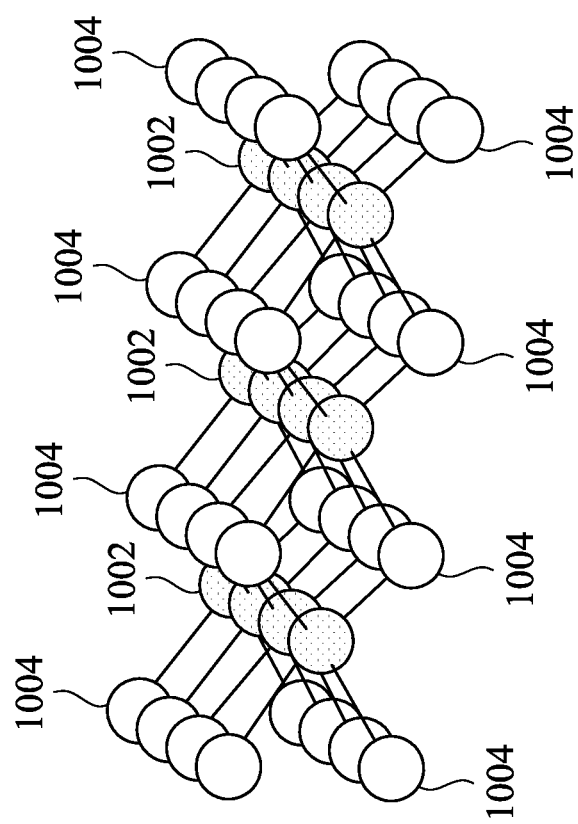
FIGS. 1A to 8 illustrate a method in various stages of fabricating a semiconductor device in accordance with some embodiments of the present disclosure.

The following disclosure provides many different embodiments, or examples, for implementing different features of the provided subject matter. Specific examples of components and arrangements are described below to simplify the present disclosure.

These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A to 8 illustrate a method in various stages of fabricating a semiconductor device in accordance with some embodiments of the present disclosure.

Figure 1A:
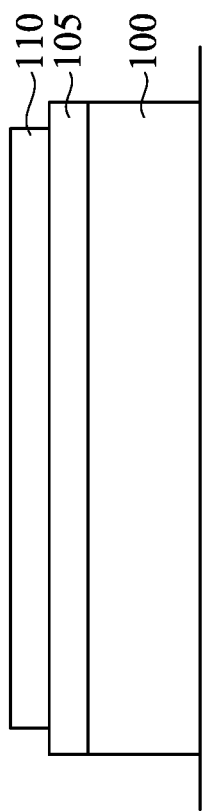

Reference is made to FIG. 1A. Shown there is a substrate 100. In some embodiments, the substrate 100 may function to provide mechanical and/or structure support for features or structures that are formed in the subsequent steps. These features or structures may be parts or portions of a semiconductor device (e.g. a transistor or a memory device) that may be formed on or over the substrate 100.

Generally, the substrate 100 illustrated in FIG. 1A may include a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally include the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates. In some other embodiments, the substrate 100 may include sapphire (e.g. crystalline $Al_2O_3$), e.g. a large grain or a single crystalline layer of sapphire or a coating of sapphire. As another example, the substrate 100 may be a sapphire substrate, e.g. a transparent sapphire substrate comprising, as an example, α-$Al_2O_3$. Other elementary semiconductors like germanium may also be used for substrate 100.

A dielectric layer 105 is formed over the substrate 100. In some embodiments, the dielectric layer 105 may be made of silicon oxide, silicon oxynitride, aluminum oxide, a combination thereof, or another suitable material. In some embodiments, the dielectric layer 105 includes a high dielectric constant material (high-k material), in accordance with some embodiments. The high-k material includes metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, another suitable material, or a combination thereof, in accordance with some embodiments. The high-k material includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or a combination thereof, in accordance with some embodiments. In some embodiments, the dielectric layer 105 can be formed by suitable deposition process, such as CVD, PVD, ALD, or the like. In some embodiments, the dielectric layer 105 has a thickness in a range from about 10 nm to about 100 nm.

A 2-D material layer 110 is formed over the substrate 100. In some embodiments, the 2-D material layer 110 is in direct contact with top surface of the dielectric layer 105. As used herein, consistent with the accepted definition within solid state material art, a "2-D material" may refer to a crystalline material consisting of a single layer of atoms. As widely accepted in the art, "2-D material" may also be referred to as a "mono-layer" material. In this disclosure, "2-D material" and "mono-layer" material are used interchangeably without differentiation in meanings, unless specifically pointed out otherwise. The 2-D material layer 110 may be 2-D materials of suitable thickness. In some embodiments, a 2-D material includes a single layer of atoms in each of its mono-layer structure, so the thickness of the 2-D material refers to a number of mono-layers of the 2-D material, which can be one mono-layer or more than one mono-layer. The coupling between two adjacent mono-layers of 2-D material includes van der Waals forces, which are weaker than the chemical bonds between/among atoms within the single mono-layer.

In some embodiments, the 2-D material layer 110 may be 2-D semiconductor (or semiconductive) materials, which are usually few-layer thick and exist as stacks of strongly bonded layers with weak interlayer van der Waals attraction, allowing the layers to be mechanically or chemically exfoliated into individual, atomically thin layers. The 2-D semiconductor materials are promising candidates of the channel, source, and drain materials of transistors. Examples of 2-D semiconductor materials include transition metal dichalcogenides (TMDs), graphene, layered III-VI chalcogenide, graphene, hexagonal Boron Nitride (h-BN), black phosphorus or the like. The 2-D semiconductor may include one or more layers and can have a thickness within the range of about 0.5-100 nm in some embodiments. One advantageous feature of the few-layered 2D semiconductor is the high electron mobility value. In some embodiments, the 2-D material layer 110 will serve as a channel layer, and thus the 2-D material layer 110 can also be referred to as a 2-D material channel layer.

FIG. 1B illustrates a molecular diagram of a transition metal dichalcogenide compound (e.g., the 2-D material layer 110) according to some embodiments of the present disclosure. The one-molecule thick TMD material layer includes atoms 1002 of a transition metal and atoms 1004 of a chalcogenide. The transition metal atoms 1002 may form a layer in a middle region of the one-molecule thick TMD material layer, and the chalcogen atoms 1004 may form a first layer over the middle layer of transition metal atoms 1002, and a second layer underlying the middle layer of transition metal atoms 1002. The transition metal atoms 1002 may be W atoms or Mo atoms, while the chalcogen atoms 1004 may be S atoms, Se atoms, or Te atoms. Throughout the description, the illustrated cross-bonded layers including one layer of transition metal atoms 1002 and two layers of chalcogen atoms 1004 in combination are referred to as a mono-layer of TMD. Similar to graphene, transition metal dichalcogenide materials align in generally planar mono-layers. Also similar to graphene, transition metal dichalcogenide materials exhibit high conductivity and carrier mobility.

In some embodiment where the 2-D material layer 110 is made of TMD mono-layers, the TMD mono-layers may include molybdenum disulfide ($MoS_2$), tungsten disulfide ($WS_2$), tungsten diselenide ($WSe_2$), or the like. In some embodiments, $MoS_2$ and $WS_2$ may be formed on the 2-D material layer 110, using suitable approaches. For example, $MoS_2$ and $WS_2$ may be formed by micromechanical exfoliation and coupled over the substrate 2-D material layer 110, or by sulfurization of a pre-deposited molybdenum (Mo) film or tungsten (W) film over the 2-D material layer 110. In alternative embodiments, $WSe_2$ may be formed by micromechanical exfoliation and coupled over the 2-D material layer 110, or by selenization of a pre-deposited tungsten (W) film over the 2-D material layer 110 using thermally cracked Se molecules.

In some embodiments, forming of the 2-D material layer 110 also includes treating the 2-D material layer 110 to obtain expected electronic properties of the 2-D material layer 110. The treating processes include thinning (namely, reducing the thickness of the 2-D material layer 110), doping, or straining, to make the 2-D material layer 110 exhibit certain semiconductor properties, e.g., including direct bandgap.

Figure 2:
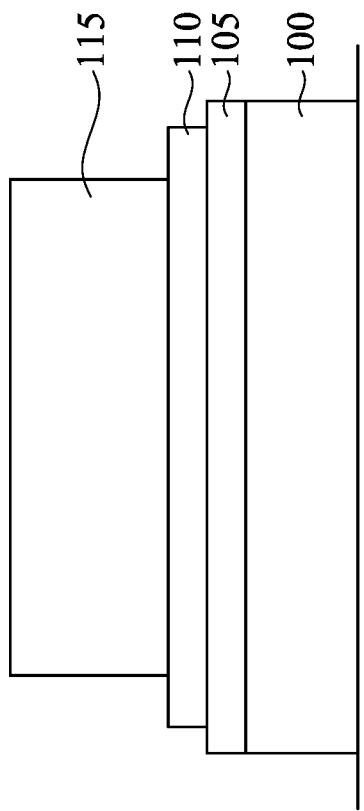

Reference is made to FIG. 2. A mask layer 115 is formed over the 2-D material layer 110 for patterning as will be discussed in FIG. 3. In some embodiments, the mask layer 115 is a photoresist. The photoresist may be suitable material used in the art, such as Poly(methyl methacrylate) (PMMA), Poly(methyl glutarimide) (PMGI), Phenol formaldehyde resin (DNQ/Novolac), SU-8, and may be either positive or negative photoresist. The material of mask layer 115 may be applied as a liquid and, generally, spin-coated to ensure uniformity of thickness.

Figure 3:
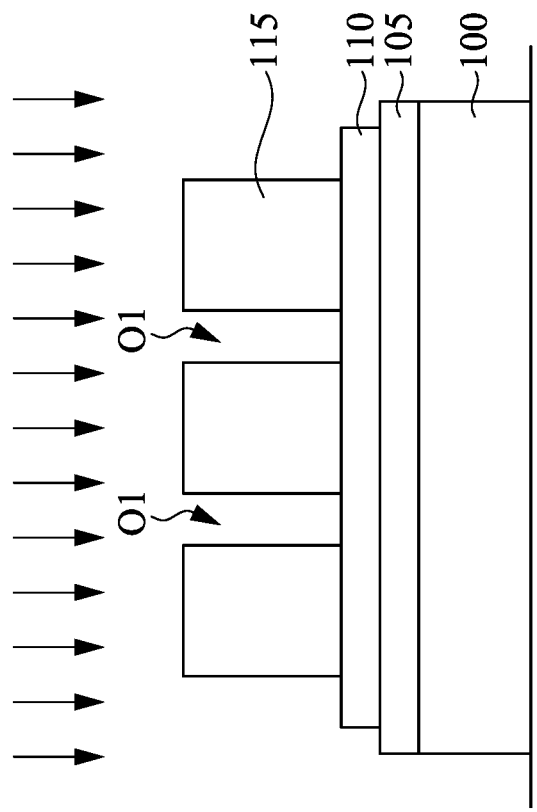

Reference is made to FIG. 3. The mask layer 115 is patterned, so as to form openings O1 in the mask layer 115 that expose the top surface of the 2-D material layer 110. In some embodiments, the mask layer 115 may be patterned using photolithography patterning processes. The photolithography patterning processes may include photoresist coating, soft baking, mask aligning, exposure, post-exposure baking, developing the photoresist, rinsing, drying (e.g., hard baking), other suitable processes, and/or combinations thereof.

Figure 4B:
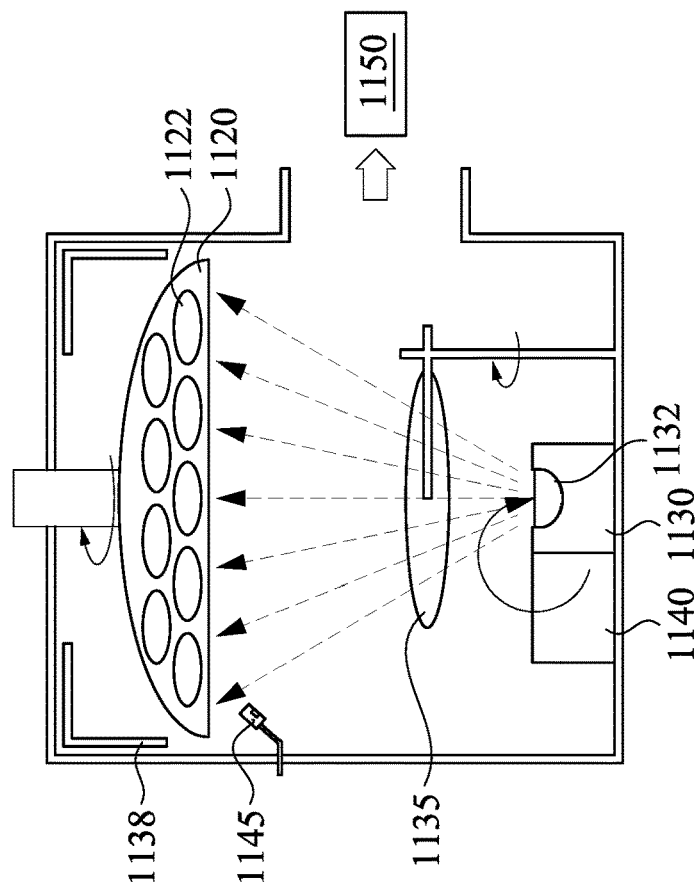
Figure 4A:
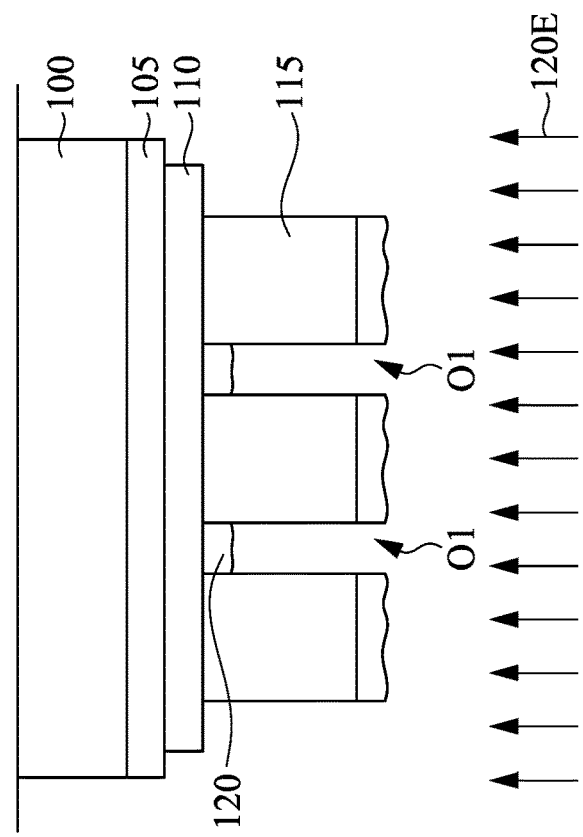

Reference is made to FIGS. 4A and 4B, in which FIG. 4B is a deposition chamber in accordance with some embodiments of the present disclosure. A first deposition process is performed to form a first metal layer 120 over the structure of FIG. 3. In greater details, the first metal layer 120 is formed in the openings O1 of the mask layer 115 and in contact with the top surface of the 2-D material layer 110.

The first metal layer 120 may also be formed over the top surface of the mask layer 115. Here, the "top surface" of the mask layer 115 or the 2-D material layer 110 may be a surface of the mask layer 115 or the 2-D material layer 110 distal to the substrate 100.

The first deposition process may be formed using an e-gun evaporation deposition chamber as will be described in FIG. 4B. For example, a wafer, where the structure of FIG. 3 disposed on, may be moved into an e-gun evaporation deposition chamber. Then, the structure is flipped over and is fixed in the e-gun evaporation deposition chamber. An evaporated first metal 120E is generated in the e-gun evaporation deposition chamber, and condenses over the structure of FIG. 3 to form the first metal layer 120.

The evaporated first metal 120E and the first metal layer 120 may be made of a metal including low melting point, such as tin (Sn), bismuth (Bi), indium (In), or other suitable metals. In some embodiments, the first metal layer 120 may be deposited with a deposition rate in a range from about 0.5 Å/second to about 1.0 Å/second at a high vacuum. For example, the pressure of the e-gun evaporation deposition chamber may be kept lower than $1\times10^{-6}$ torr, such as $1\times10^{-7}$ torr, during the deposition of the first metal layer 120. In some embodiments, the first metal layer 120 has a thickness in a range from about 15 nm to about 25 nm, such as 20 nm in some embodiments. Here, the metal including "low melting point" can be referred to as a metal having a melting point lower than the thermal budget of back-end-of-line (BEOL), such as about 450° C. In some embodiments, the melting point of the low melting point metal may be in a range from about 100° C. to about 300° C.

FIG. 4B is an example of an e-gun evaporation deposition chamber in accordance with some embodiments of the present disclosure. The e-gun evaporation deposition chamber includes a substrate holder 1120. In some embodiments, the substrate holder 1120 has a dome shape, and thus can also be referred to as a substrate dome. The substrate holder 1120 includes a plurality of slots 1122 where wafers are disposed. For example, a wafer including the structure of FIG. 3 may be flipped over and be placed in one of the slots 1122 of the substrate holder 1120.

The e-gun evaporation deposition chamber further includes a crucible 1130 filled with metal source 1132 and an electron source 1138 (or electron gun). In some embodiments, the electron source 1138 emits free electrons within the vacuum chamber using a filament. These free electrons are guided by a magnetic field into the crucible 1130 containing the metal source 1132. Energy associated with the free electrons is absorbed by the solid precursor of metal source 1132, producing an impact region that experiences a rapid rise in temperature. As a result, a portion of the metal source 1132 either liquefies or sublimes, liberating vapor into the e-gun evaporation deposition chamber. A shutter 1135 can open so as to allow evaporation of at least a portion of the metal source 1132 into the evaporation chamber, the evaporated particles of the metal source 1132 may condense on the wafers to produce a thin film over the wafers.

The e-gun evaporation deposition chamber further includes a heater 1140. In some embodiments, the heater 1140 is heating means for heating the wafers in the slots 1122 of the substrate holder 1120 to an appropriate temperature to improve property such as adhesiveness of the thin film to be vapor deposited on the wafers in the slots 1122 of the substrate holder 1120. The e-gun evaporation deposition chamber further includes a crystal type film thickness meter 1145. In some embodiments, the crystal type film thickness meter 1145 is used to determine whether the film thickness of the thin films formed on the wafers has reached a predetermined required film thickness. The e-gun evaporation deposition chamber further includes a vacuum pump 1150. In some embodiments, the vacuum pump 1150 can create a vacuum environment in the e-gun evaporation deposition chamber, which allows the evaporated particles to travel directly to a deposition target, such as the wafers disposed in the slots 1122 of the substrate holder 1120.

Figure 5:
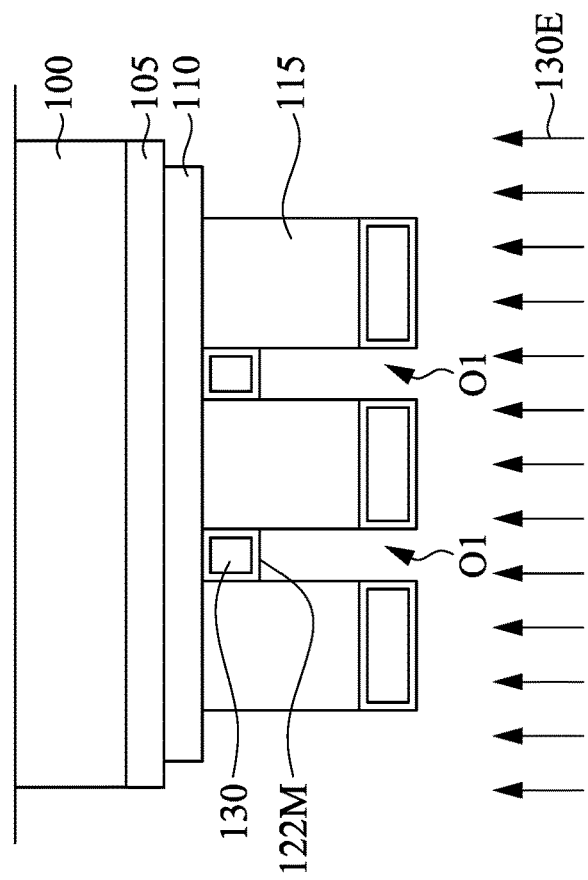

Reference is made to FIG. 5. After the first deposition process of FIG. 4A is completed, a second deposition process is performed to form a second metal layer 130 over the structure of FIG. 4A. In greater details, the second metal layer 130 is formed in the openings O1 of the mask layer 115. The second metal layer 130 may also be formed over the top surface of the mask layer 115.

Similar to the first deposition process, the second deposition process may also be formed using the e-gun evaporation deposition chamber as described in FIG. 4B. For example, a wafer, where the structure of FIG. 4A disposed, may be moved into the e-gun evaporation deposition chamber. Then, the structure is flipped over and is fixed in the e-gun evaporation deposition chamber. An evaporated second metal 130E is generated in the e-gun evaporation deposition chamber, and condenses over the structure of FIG. 4A to form the second metal layer 130. The difference between the first deposition process and the second deposition process is that the materials of the metal source (e.g., the metal source 1132 of FIG. 4B) are different.

The evaporated second metal 130E and the second metal layer 130 may be made of a metal including high melting point, such as gold (Au), platinum (Pt), palladium (Pd), or other suitable metals. In some embodiments, the second metal layer 130 may be deposited with a deposition rate in a range from about 1.0 Å/second to about 2.0 Å/second at a high vacuum. For example, the pressure of the e-gun evaporation deposition chamber may be kept lower than $1\times10^{-6}$ torr, such as $1\times10^{-7}$ torr, during the deposition of the second metal layer 130. In some embodiments, the second metal layer 130 has a thickness in a range from about 15 nm to about 25 nm, such as 20 nm in some embodiments. Here, the metal including "high melting point" can be referred to as a metal having a melting point higher than the thermal budget of back-end-of-line (BEOL), such as about 450° C. In some embodiments, the melting point of the high melting point metal may be in a range from about 1000° C. to about 1700° C.

In some embodiments, the material of the evaporated first metal 120E and the first metal layer 120 (see FIG. 4A) has a lower melting point than the material of the evaporated second metal 130E and the second metal layer 130. Accordingly, a higher temperature is needed to change the material of the second metal layer 130 from solid phase to gas phase (e.g., the evaporated second metal 130E) than to change the material of the first metal layer 120 from solid phase to gas phase (e.g., the evaporated first metal 120E). As a result, during the second deposition process of FIG. 5, the high temperature second metal layer 130 will "re-melt" the first metal layer 120 of FIG. 4A, and will change the first metal layer 120 from solid phase to liquid phase (or gas phase). For example, the solid first metal layer 120 is re-melted to a melted first metal layer 122M as shown in FIG. 5.

As mentioned above, the second metal layer 130 has a higher melting point than the first metal layer 120 (see FIG. 4A). Therefore, when temperature decreases, the material of the second metal layer 130 will change to solid phase prior to the material of the first metal layer 120 changes to solid phase. As shown in FIG. 5, during the second deposition process, a solid second metal layer 130 may be formed, while the melted first metal layer 122M may be still in a liquid phase (or gas phase) so that the liquid-phase first metal 122 is flowable on the solid-phase second metal 130. Thus, after the melted first metal layer 122M turns into solid phase due to cooling down, the melted first metal layer 122M will be conformally coated on surfaces of the second metal layer 130. In greater details, in the cross-sectional view of FIG. 5, the melted first metal layer 122M is coated on top surface, opposite sidewalls, and bottom surfaces of the second metal layer 130. Stated another way, the melted first metal layer 122M is coated on at least four sides of the second metal layer 130 in the cross-sectional view of FIG. 5. Accordingly, the melted first metal layer 122M may separate the second metal layer 130 from sidewalls of the mask layer 115. In some embodiments, the first metal layer 122 has a thickness that is less than a thickness of the first metal layer 120 (see FIG. 4A), this is because the first metal layer 120 is re-melted and is coated on a larger surface of the second metal layer 130.

Figure 6:
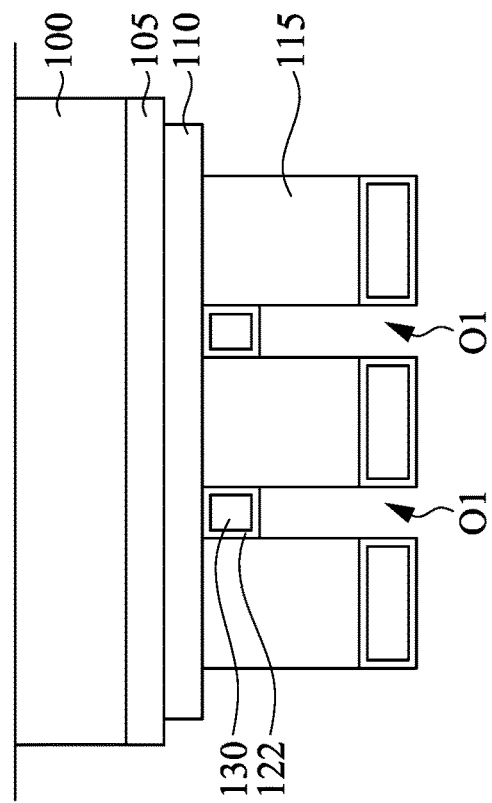

Reference is made to FIG. 6. After the second deposition of FIG. 5 is completed, the second metal layer 130 and the first metal layer 122 are formed. In greater details, the melted first metal layer 122M of FIG. 5 becomes the solid first metal layer 122 when temperature decreases. That is, during the processes described in FIGS. 4A to 6, the first metal layer 120 is first deposited over the substrate via a first deposition process. A second metal layer 130 is then deposited over the substrate via a second deposition process, while the first metal layer 120 is re-melted during the second deposition process and becomes the melted first metal layer 122M. The melted first metal layer 122M then becomes the solid-phase first metal layer 122.

Figure 7A:
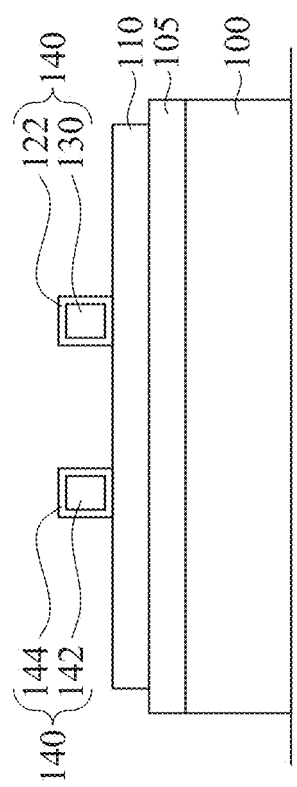
Figure 7B:
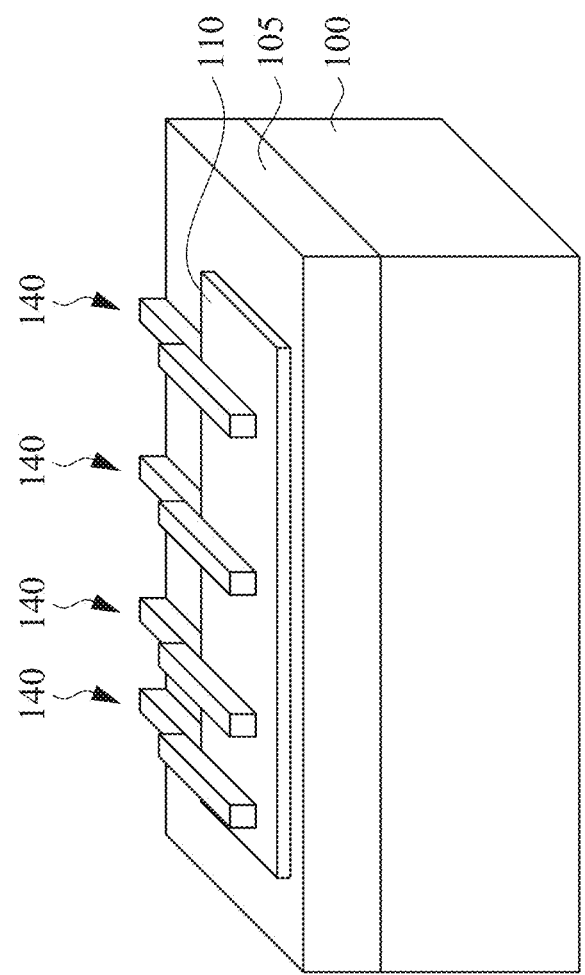

Reference is made to FIGS. 7A and 7B, in which FIG. 7B is a schematic view of FIG. 7A. The mask layer 115 is removed. In some embodiments where the mask layer 115 is a photoresist, the mask layer 115 may be removed by a lift-off process. Portions of the first metal layer 122 and the second metal layer 130 over the top surface of the mask layer 115 are removed together with the mask layer 115, while leaving portions of the first metal layer 122 and the second metal layer 130 in the openings O1 of the mask layer 115 remain over the 2-D material layer 110. After the mask layer 115 is removed, metal structures 140 are formed. In greater details, each of the metal structures 140 includes the remaining portions of the first metal layer 122 and the second metal layer 130. In some embodiments, the metal structures 140 may be formed over source/drain portions of the 2-D material layer 110 and will serve as source/drain contacts in the final transistor device, and thus the metal structures 140 can also be referred to as source/drain contacts 140 or source/drain conductive contacts 140.

From another view point, each of the metal structures 140 has an inner portion 142 and an outer portion 144 wrapping the inner portion 142. That is, the outer portion 144 covers the top surface, the opposite sidewalls, and the bottom surface of the inner portion 142. In some embodiments, each of the metal structures 140 is a mixture of a first metal and a second metal. For example, the first metal is a material of the first metal layer 122, which includes a low melting point metal, such as tin (Sn), bismuth (Bi), indium (In), or other suitable metals. The second metal is a material of the second metal layer 130, which includes a high melting point metal, such as gold (Au), platinum (Pt), palladium (Pd), or other suitable metals. In some embodiments, an atomic concentration of the first metal in the outer portion 144 is greater than an atomic concentration of the second metal in the outer portion 144. Moreover, an atomic concentration of the first metal in the inner portion 142 is lower than an atomic concentration of the second metal in the inner portion 142. Stated differently, an atomic concentration of the first metal in the outer portion 144 is greater than an atomic concentration of the first metal in the inner portion 142. Furthermore, an atomic concentration of the second metal in the outer portion 144 is lower than an atomic concentration of the second metal in the inner portion 142. Yet from another view point, along the top surface, the sidewalls, and the bottom surface of each of the metal structures 140, an atomic concentration of the first metal is higher than an atomic concentration of the second metal. Furthermore, an atomic concentration of the first metal at a middle portion of each of the metal structures 140 is lower than an atomic concentration of the second metal at the middle portion of each of the metal structures 140.

FIG. 7B is a schematic view of FIG. 7A. In FIG. 7B, four metal structures 140 are illustrated. In some embodiments, each of the metal structures 140 may extend from the top surface of the 2-D material layer 110 to the top surface of the dielectric layer 105.

Figure 8:
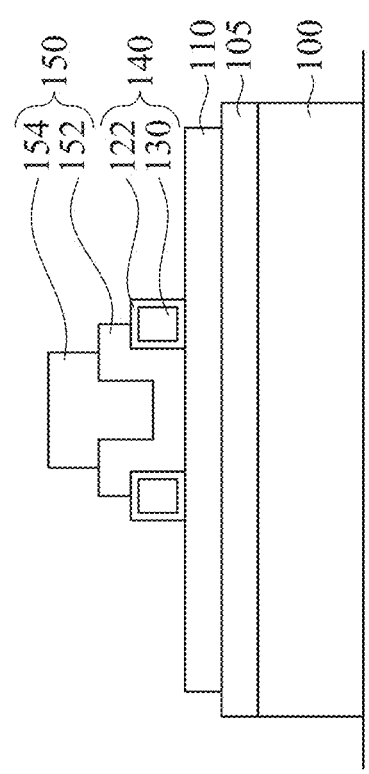

Reference is made to FIG. 8. A gate structure 150 is formed over the substrate 100 and covering a channel portion of the 2-D material layer 110. In some embodiments, gate structure 150 includes a gate dielectric layer 152 and a gate electrode 154 over the gate dielectric layer 152. In some embodiments, the 2-D material layer 110, the gate structure 150, and the source/drain contacts 140 may collectively serve as a transistor.

In greater details, the gate dielectric layer 152 is formed in contact with the 2-D material layer 110 and covering the channel region of the 2-D material layer 110. Moreover, the gate dielectric layer 152 is in contact with sidewalls of the first metal layer 122 of the metal structures 140. In some embodiments, because the second metal layer 130 is wrapped by the first metal layer 122, the second metal layer 130 is separated from the gate dielectric layer 152 of the gate structure 150.

The gate dielectric layer 152 includes silicon oxide, silicon oxynitride, a combination thereof, or another suitable material. In some embodiments, the gate dielectric layer 152 includes a high dielectric constant material (high-k material), in accordance with some embodiments. The high-k material includes metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, another suitable material, or a combination thereof, in accordance with some embodiments. The high-k material includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or a combination thereof, in accordance with some embodiments. The gate dielectric layer 152 is formed using a chemical vapor deposition process or another suitable process.

The gate electrode 154 can be formed of suitable electrically conductive material, including polysilicon and metal including one or more layers of aluminum, copper, titanium, tantalum, tungsten, cobalt, molybdenum, nickel, manganese, silver, palladium, rhenium, iridium, ruthenium, platinum, zirconium, tantalum nitride, nickel silicide, cobalt silicide, TIN, WN, TiAl, TiAlN, TaCN, TaC, TaSiN, metal alloys, other suitable materials, and/or combinations thereof. The gate electrode 154 may be formed by one or more deposition processes, such as chemical vapor deposition (CVD), atomic layer deposition (ALD), physical vapor deposition (PVD) (sputtering), electroplating, and/or other suitable method, followed by one or more etching process to pattern the deposited materials of gate electrode 154.

In some embodiments where the first deposition process is omitted, namely only the second metal layer (e.g., the second metal layer 130) is deposited, the second metal layer having a higher melting point may case thermal damage to the underlying 2-D material layer (e.g., the 2-D material layer 110) and will result in a higher contact resistance. In some embodiments where only the second metal layer is deposited, an additional cooling system is disposed on a backside of the wafer to prevent thermal damage from the second metal layer with high temperature. However, this will also result in a poor crystallinity of the second metal layer, and therefore will result in a poor device performance.

On the other hand, in some embodiments where the second deposition process is omitted, namely only the first metal layer (e.g., the first metal layer 120) is deposited, although the first metal layer may not cause thermal damage to the underlying structure, cluster effect may be induced during forming the first metal layer, and thus the first metal layer does not adhere well over the substrate and over the 2-D material layer.

In some embodiments of the present disclosure, a method of forming source/drain contacts is provided, in which a first deposition process is performed to deposit a first metal layer (e.g., the first metal layer 120), and then a second deposition process is performed to deposit a second metal layer (e.g., the second metal layer 130) having a higher melting point than the first metal layer. Accordingly, during the second deposition process, the second metal layer may re-melt the first metal layer, and cause the melted first metal layer (e.g., the melted first metal layer 122M) coated on surfaces of the second metal layer. The melted first metal layer can act as a buffer layer to prevent the second metal layer from causing thermal damage. Furthermore, the resulting source/drain contacts (e.g., the source/drain contacts 140) may include better crystallinity and adhesion, which in turn will lower the contact resistance. Moreover, the source/drain contacts can be formed without using additional cooling system. Accordingly, the device performance may be improved.

Figure 9:
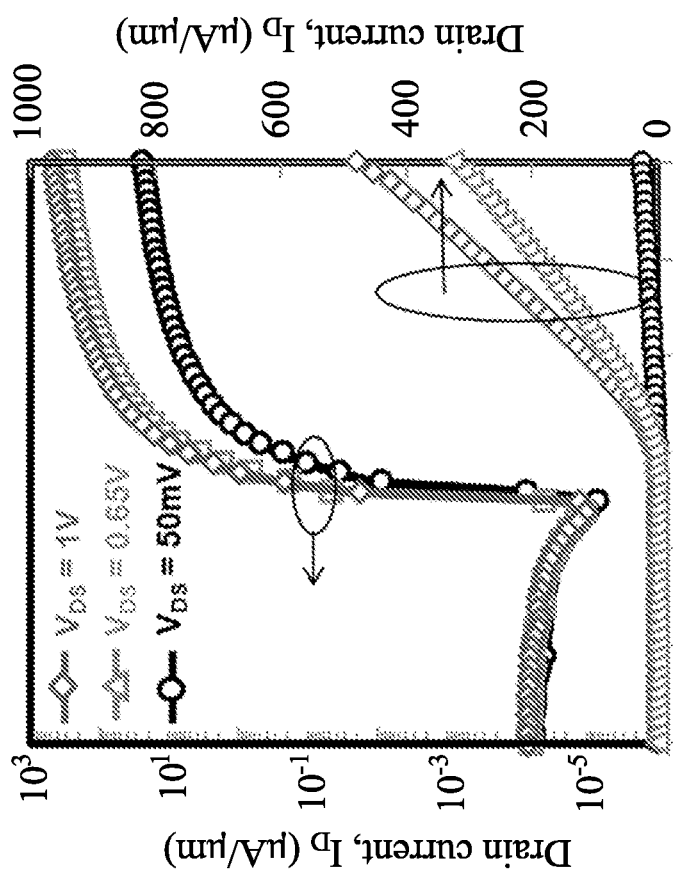
FIG. 9 is an experiment result of a semiconductor device in accordance with some embodiments of the present disclosure.

FIG. 9 is an experiment result of a semiconductor device in accordance with some embodiments of the present disclosure. In particular, the experiment result of FIG. 9 is obtained from the semiconductor device of FIG. 8, in which the 2-D material layer 110 of FIG. 8 is made of $MoS_2$, the first metal layer 122 of the source/drain contact 140 is made of Sn, and the second metal layer 130 of the source/drain contact 140 is made of Au. The results show that when drain-voltage $V_{DS}$ is about 1V, the on-current $I_{on}$ of the device can be up to about 480 µA/µm, which is better than the samples which only include the first metal layer 122 or only include the second metal layer 130.

Figure 10:
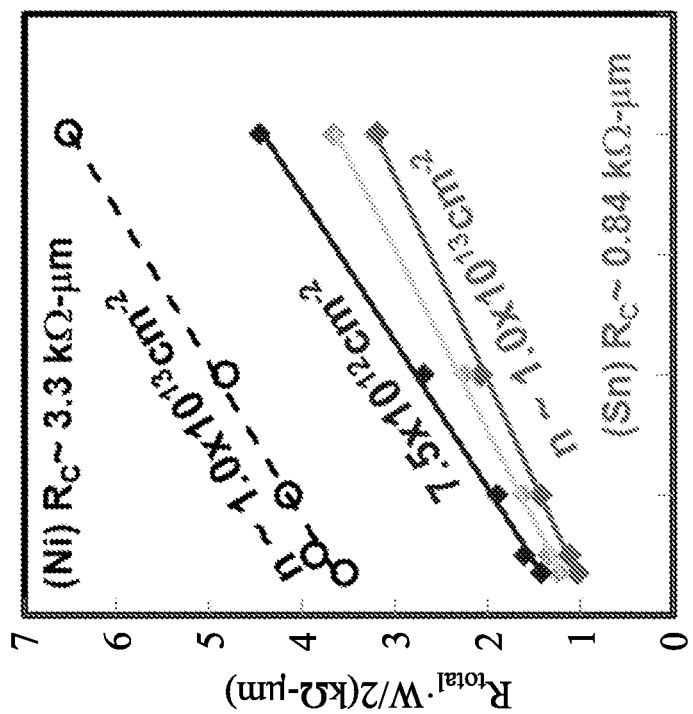
FIG. 10 is an experiment result of a semiconductor device in accordance with some embodiments of the present disclosure.

FIG. 10 is an experiment result of a semiconductor device in accordance with some embodiments of the present disclosure. In particular, the experiment result of FIG. 10 is obtained from the semiconductor device of FIG. 8, in which the 2-D material layer 110 of FIG. 8 is made of $MoS_2$, the first metal layer 122 of the source/drain contact 140 is made of Sn, and the second metal layer 130 of the source/drain contact 140 is made of Au. The results show that the contact resistance of the disclosed source/drain contacts 140 is down to about 0.84 kΩ·µm when the channel length is about 35 nm, the carrier density is about $1\times10^{13}$ cm$^{-2}$, and without intentional doping of the 2-D material layer 110. In comparison, if the source/drain contacts are made of Ni (high melting point), the contact resistance of the source/drain contacts is about 3.3 kΩ·µm when the channel length is about 35 nm.

Figure 11:
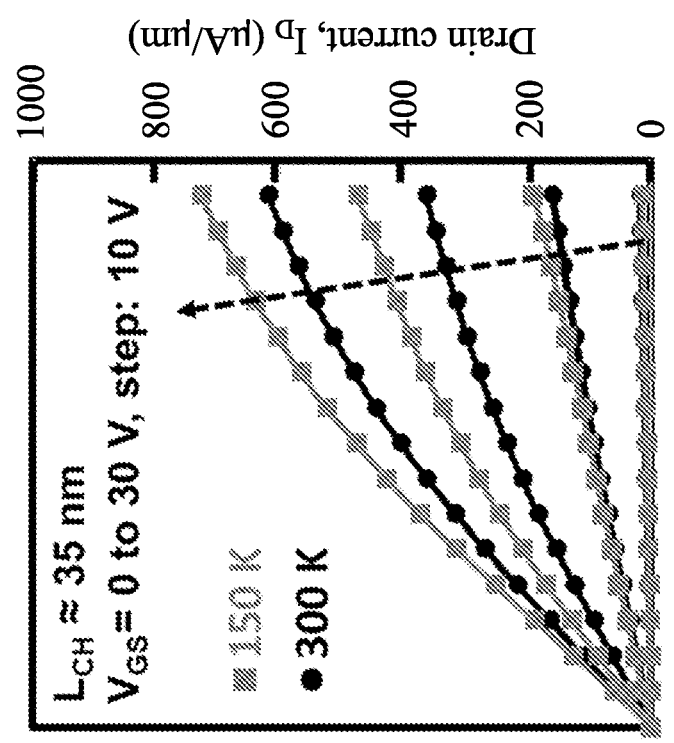
FIG. 11 is an experiment result of a semiconductor device in accordance with some embodiments of the present disclosure.

FIG. 11 is an experiment result of a semiconductor device in accordance with some embodiments of the present disclosure. In particular, the experiment result of FIG. 11 is obtained from the semiconductor device of FIG. 8, in which the 2-D material layer 110 of FIG. 8 is made of $MoS_2$, the first metal layer 122 of the source/drain contact 140 is made of Sn, and the second metal layer 130 of the source/drain contact 140 is made of Au. The results show that at different temperatures (e.g., 150K and 300K), the drain current show linearity when gate voltage increases from 0 to 30V. The high current linearity implies that the interface between the 2-D material layer 110 and the first metal layer 122 (e.g., Sn—$MoS_2$ interface) has negligible Schottky barrier height, and therefore a low contact resistance at the interface.

Figure 12:
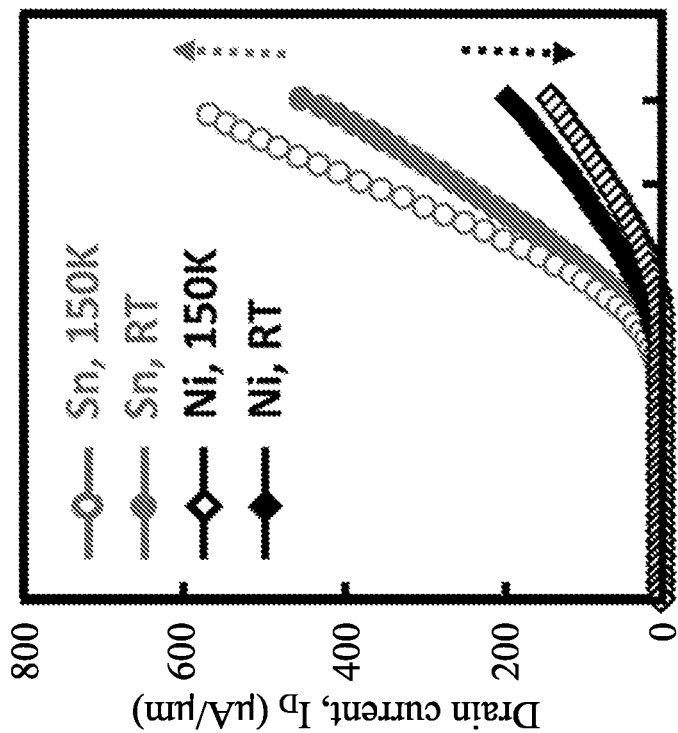
FIG. 12 is an experiment result of a semiconductor device in accordance with some embodiments of the present disclosure.

FIG. 12 is an experiment result of a semiconductor device in accordance with some embodiments of the present disclosure. In particular, the experiment result of FIG. 12 is obtained from the semiconductor device of FIG. 8, in which the 2-D material layer 110 of FIG. 8 is made of $MoS_2$, the first metal layer 122 of the source/drain contact 140 is made of Sn, and the second metal layer 130 of the source/drain contact 140 is made of Au. The results show that the electrical property of the disclosed source/drain contacts 140 is improved at low temperature (e.g., room temperature; RT). However, if the source/drain contacts are made of Ni (high melting point), the electrical property thereof is deteriorated at low temperature (e.g., room temperature; RT). This is because when the source/drain contact 140 includes Sn and Au, the contact resistance of the source/drain contact 140 is low, and the overall impedance is channel-dominated. Accordingly, when temperature decreases, the mobility of the device will increase because of less phonon collision under low temperature, and thus the current will increase. However, for Ni source/drain contact, the contact resistance is high, and thus the overall impedance is contact-dominated. Because the carriers in the Ni source/drain contact are conducted by thermal emission, the current will therefore decrease at low temperature, and will result in a high total resistance.

FIGS. 13 to 40 illustrate a method in various stages of fabricating a semiconductor device in accordance with some embodiments of the present disclosure.

Figure 13:
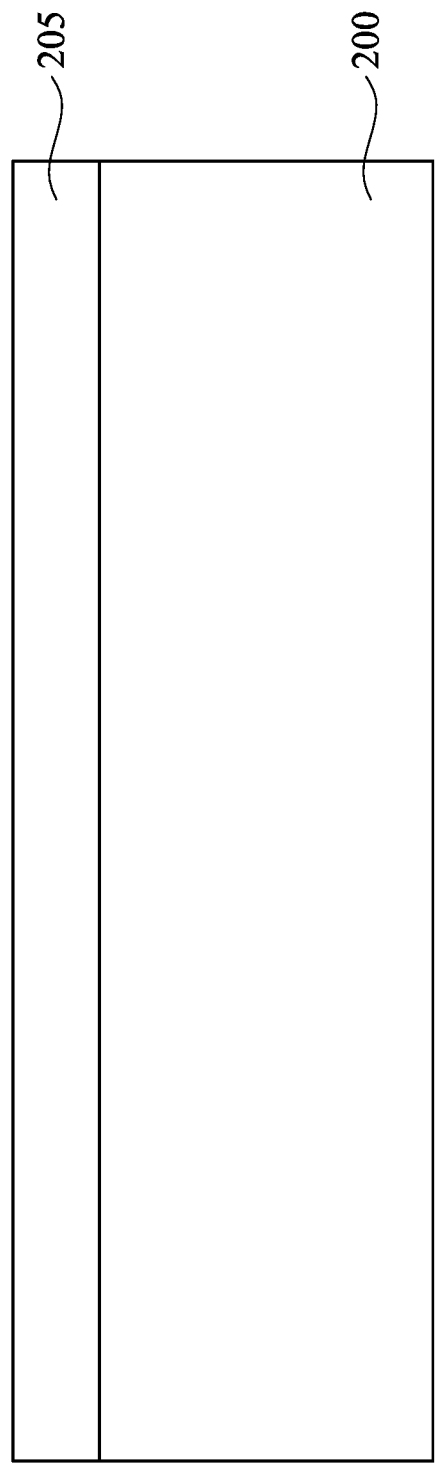
FIGS. 13 to 40 illustrate a method in various stages of fabricating a semiconductor device in accordance with some embodiments of the present disclosure.

Reference is made to FIG. 13. Shown there is a substrate 200. The substrate 200 may be similar to the substrate 100 as described in FIGS. 1A to 8. The substrate 200 may be doped. For example, the substrate 200 may be doped with p-type impurities, and thus the substrate 200 can be referred to as a p-type substrate 200.

A photoresist layer 205 is formed over the substrate 200. The photoresist layer 205 may be suitable material used in the art, such as Poly(methyl methacrylate) (PMMA), Poly (methyl glutarimide) (PMGI), Phenol formaldehyde resin (DNQ/Novolac), SU-8, and may be either positive or negative photoresist.

Figure 14:
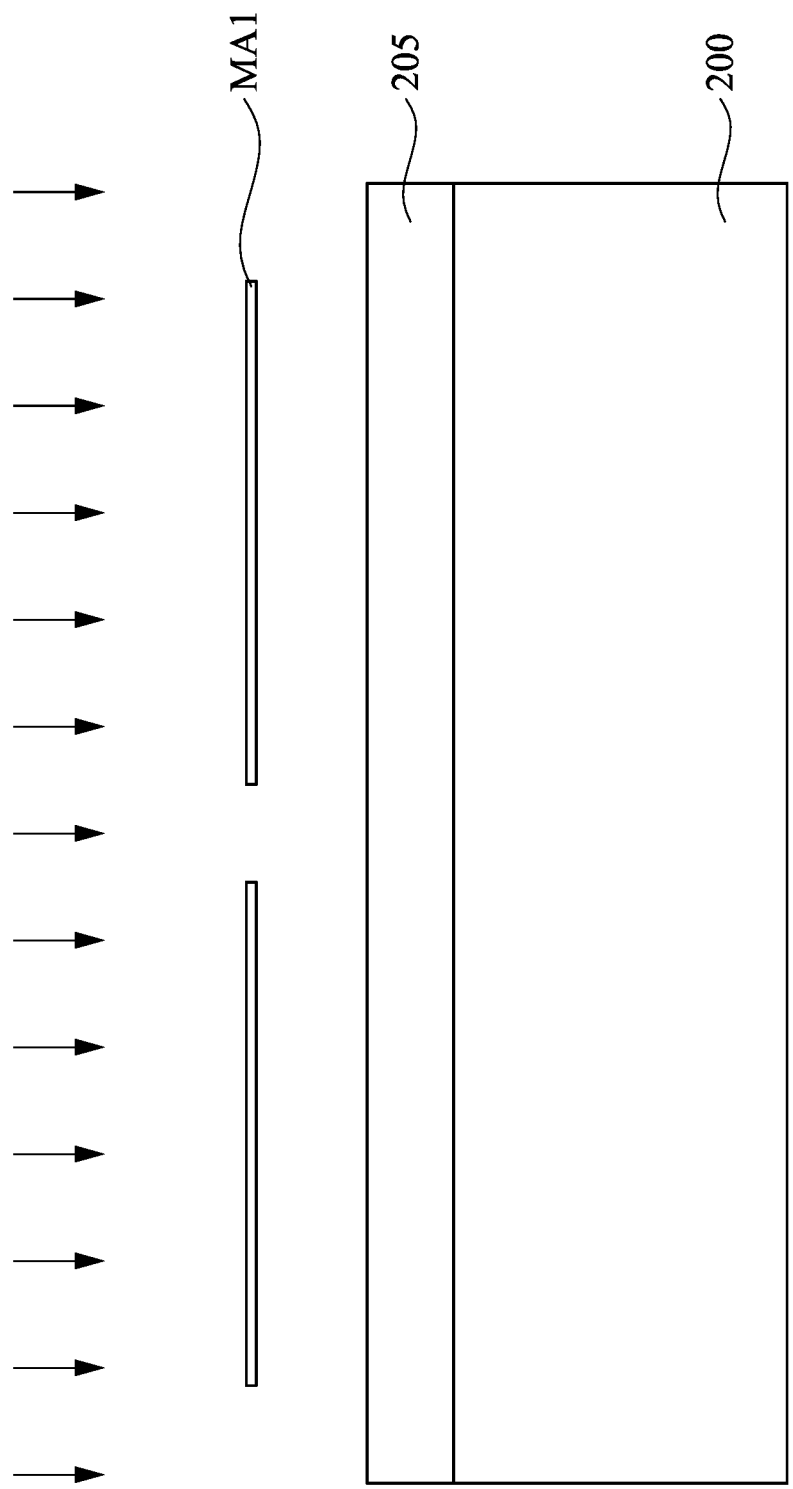

Reference is made to FIG. 14. An exposure process is performed to the photoresist layer 205 using a mask MA1. In some embodiments, portions of the photoresist layer 205 are exposed through the mask MA1.

Figure 15:
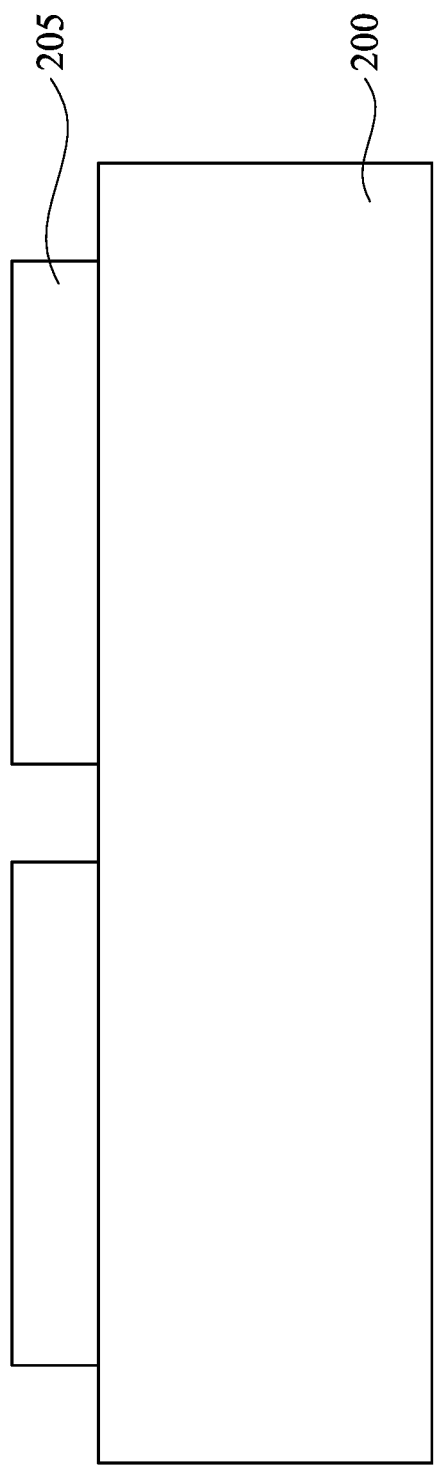

Reference is made to FIG. 15. The portions of the photoresist layer 205 that are exposed during the exposure process are removed through a development process. After the portions of the photoresist layer 205 are removed, portions of the top surface of the substrate 200 are exposed by the photoresist layer 205.

Figure 16:
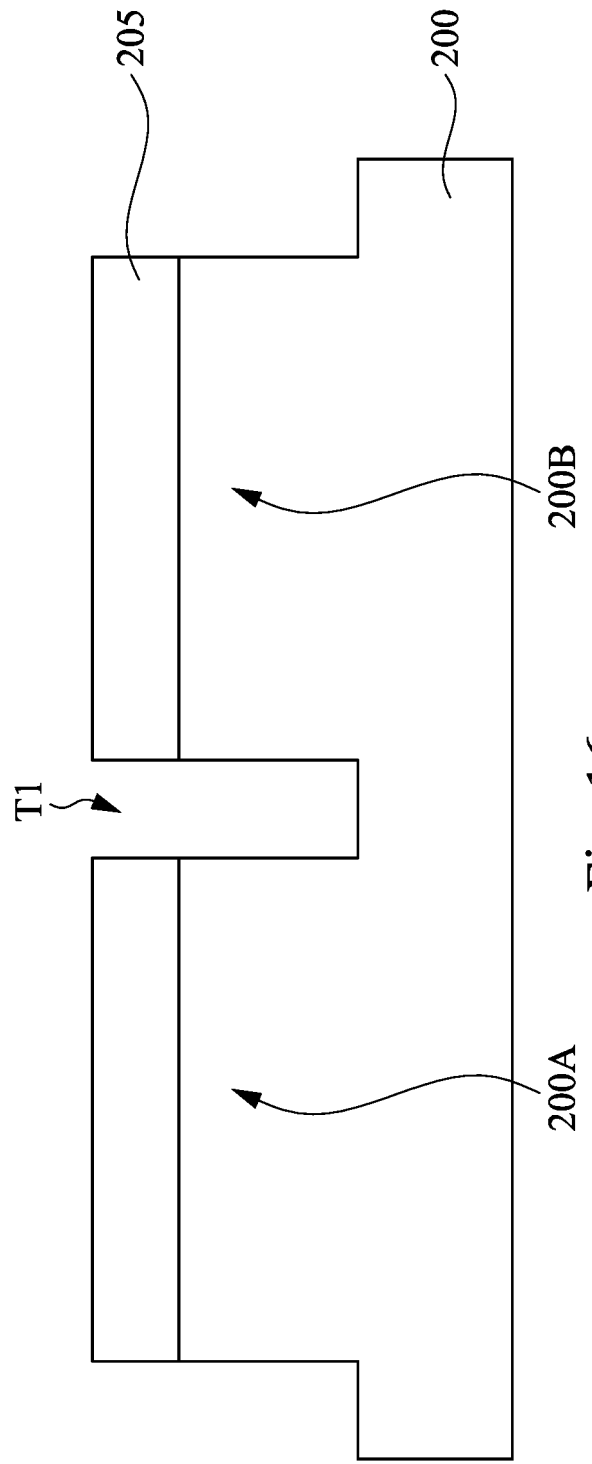

Reference is made to FIG. 16. An etching process is performed to the substrate 200, by using the patterned photoresist layer 205 as an etch mask. As a result, trenches T1 are formed in the substrate 200. In some embodiments, the substrate 200 may include a first protrusion portion 200A and a second protrusion portion 200B, in which the first protrusion portion 200A and the second protrusion portion 200B are separated by a trench T1.

Figure 17:
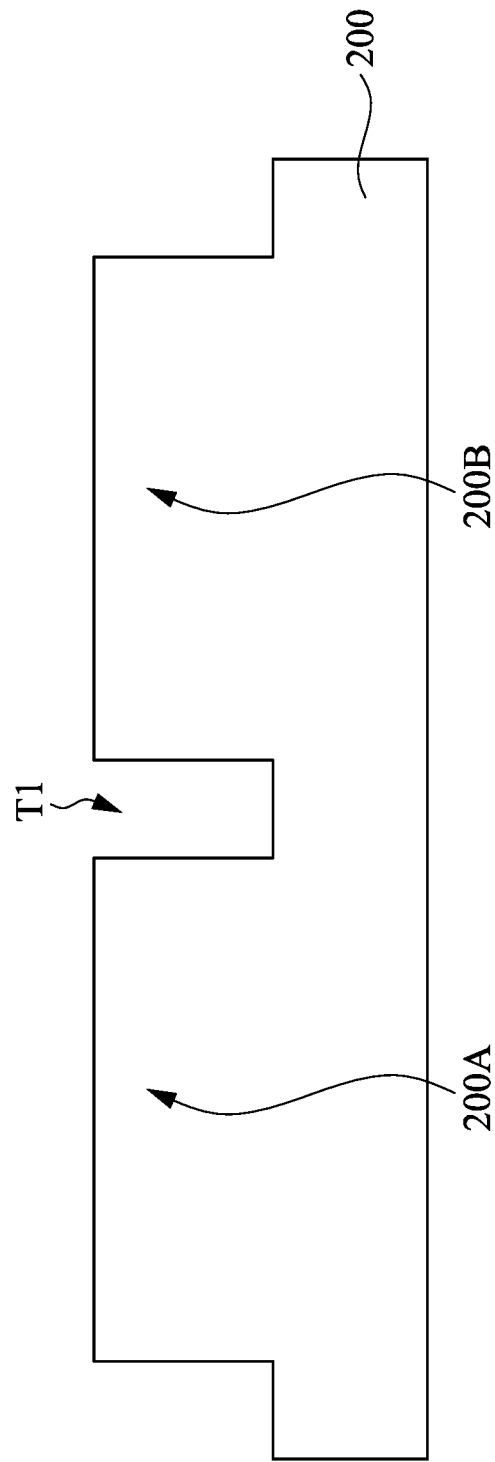

Reference is made to FIG. 17. The photoresist layer 205 is removed. In some embodiments, the photoresist layer 205 may be removed by a striping process.

Figure 18:
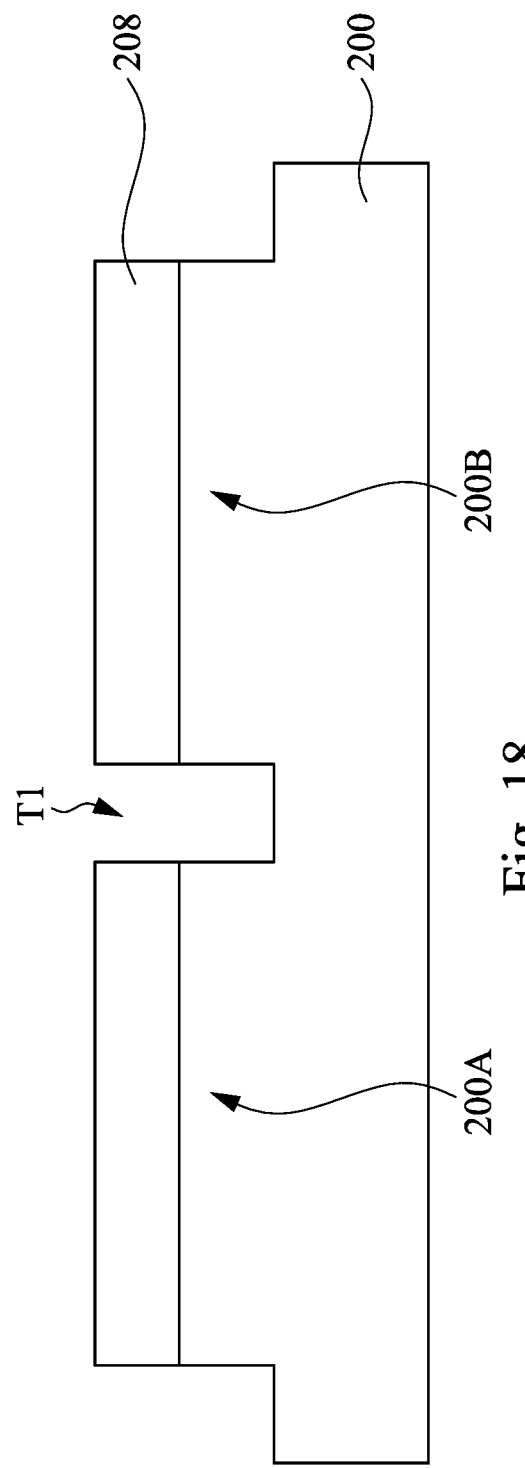

Reference is made to FIG. 18. A patterned mask layer 208 is formed over the first protrusion portion 200A and the second protrusion portion 200B of the substrate 200. In some embodiments, the patterned mask layer 208 may be a photoresist or may be a hard mask, and may be patterned using suitable photolithography process.

Figure 19:
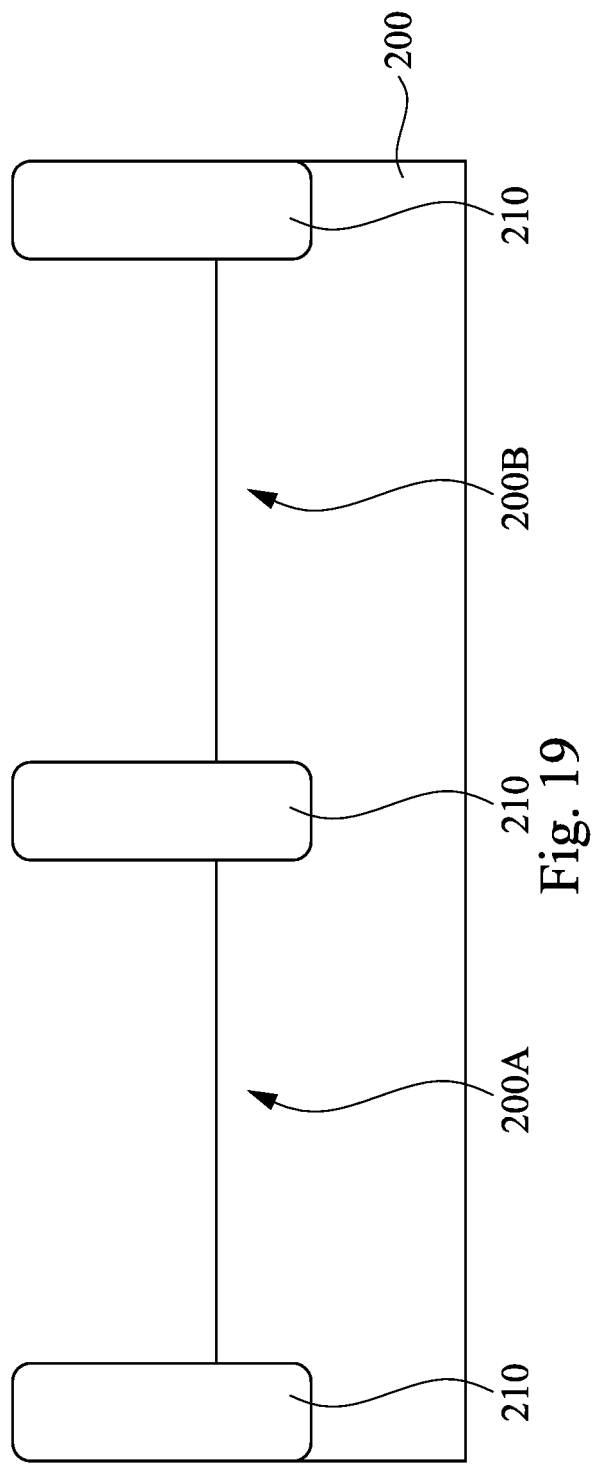

Reference is made to FIG. 19. Shallow trenches isolation (STI) structures 210 are formed in the trenches T1 of the substrate 200. After the STI structures 210 are formed, the patterned mask layer 208 is removed, such that the STI structures 210 protrudes from top surfaces of the first protrusion portion 200A and the second protrusion portion 200B of the substrate 200. In some embodiments, the STI structures 210 may be made of oxide, such as silicon oxide ($SiO_2$).

Figure 20:
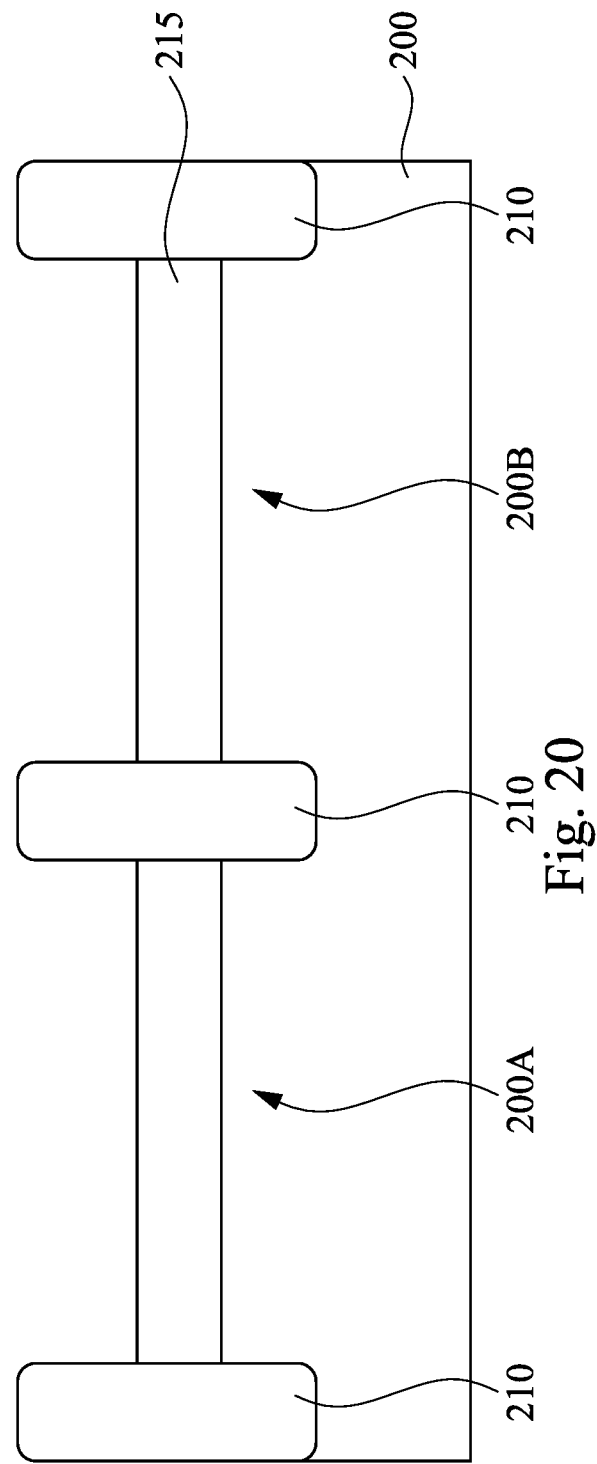

Reference is made to FIG. 20. Dielectric layers 215 are formed over the first protrusion portion 200A and the second protrusion portion 200B of the substrate 200, respectively. In some embodiments, the dielectric layers 215 may be made of nitride, such as silicon nitride ($Si_3N_4$).

Figure 21:
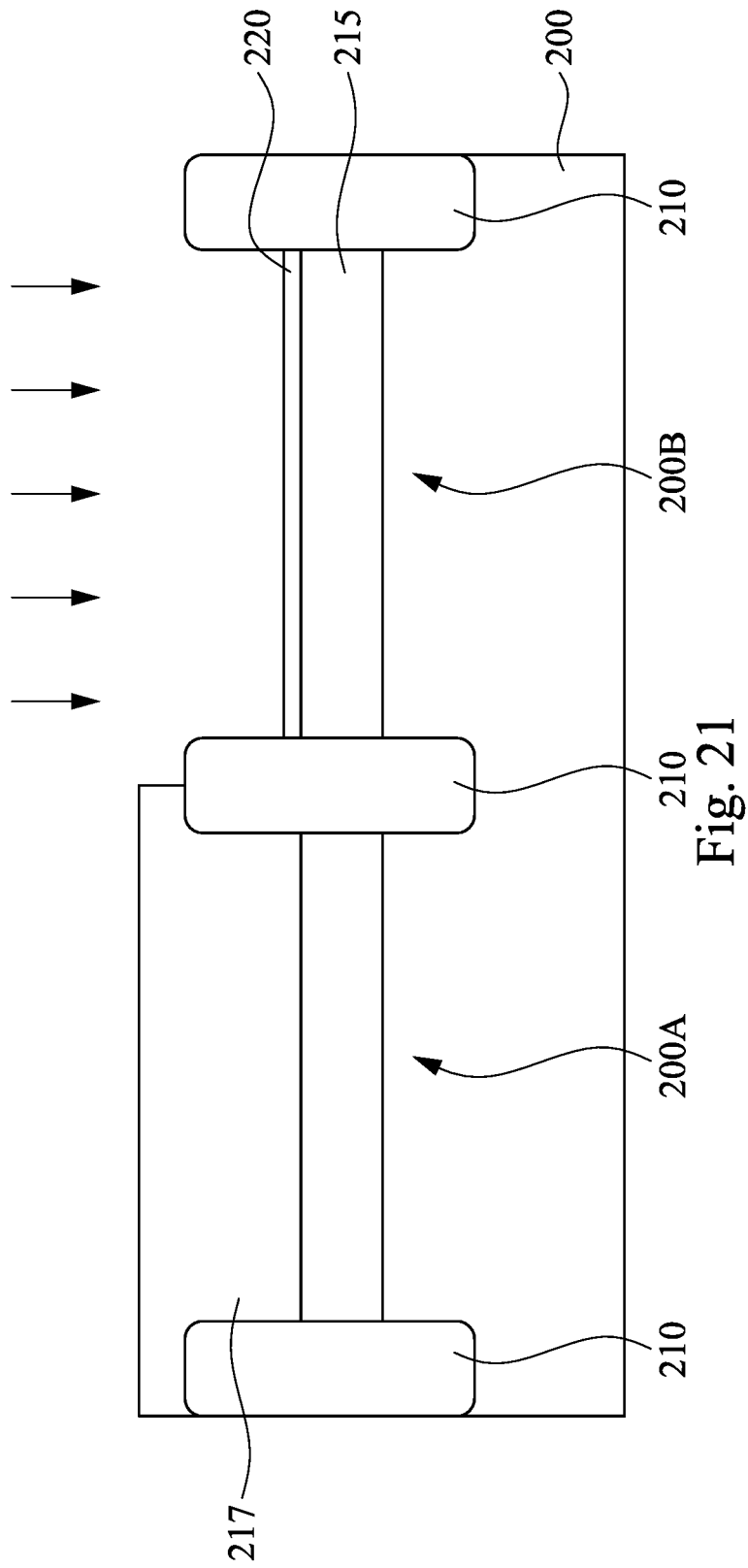

Reference is made to FIG. 21. A patterned mask 217 is formed covering the protrusion portion 200A of the substrate 200, while exposing the protrusion portion 200B of the substrate 200. Afterwards, a 2-D material layer 220 is formed over the protrusion portion 200B of the substrate 200. The 2-D material layer 220 may be formed by a similar method for forming the 2-D material layer 110 as discussed in FIGS. 1A to 8.

Figure 22:
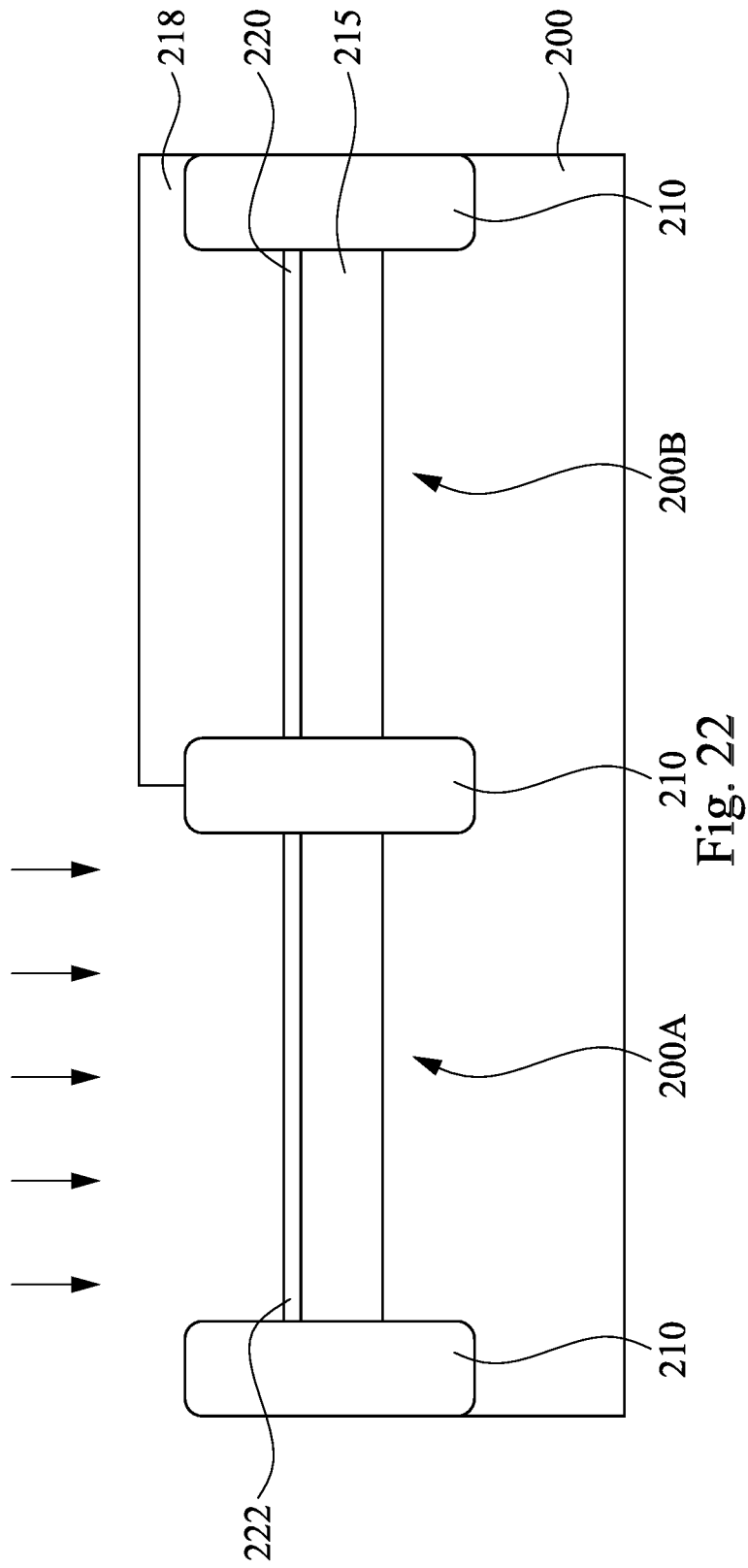

Reference is made to FIG. 22. After the 2-D material layer 220 is formed, the patterned mask 217 is removed, and a patterned mask 218 is formed covering the 2-D material layer 220, while exposing the protrusion portion 200A of the substrate 200. Afterwards, a 2-D material layer 222 is formed over the protrusion portion 200A of the substrate 200. The 2-D material layer 222 may be formed by a similar method for forming the 2-D material layer 110 as discussed in FIGS. 1A to 8. In some embodiments, the 2-D material layers 220 and 222 are made of different 2-D materials. For example, the 2-D material layer 222 is made of $WS_2$, while the 2-D material layer 220 is made of $MoS_2$. In some embodiments, the 2-D material layer 222 made of $WS_2$ can be used for a P-type device, such as P-FET, while the 2-D material layer 220 made of $MoS_2$ can be used for a N-type device, such as N-FET. In some embodiments, treating processes may be performed to the 2-D material layer 222 made of $WS_2$ to make the 2-D material layer 222 exhibit different conductivity than the 2-D material layer 220. The treating processes include thinning (namely, reducing the thickness of the 2-D material layer 222), doping, or straining.

Figure 23:
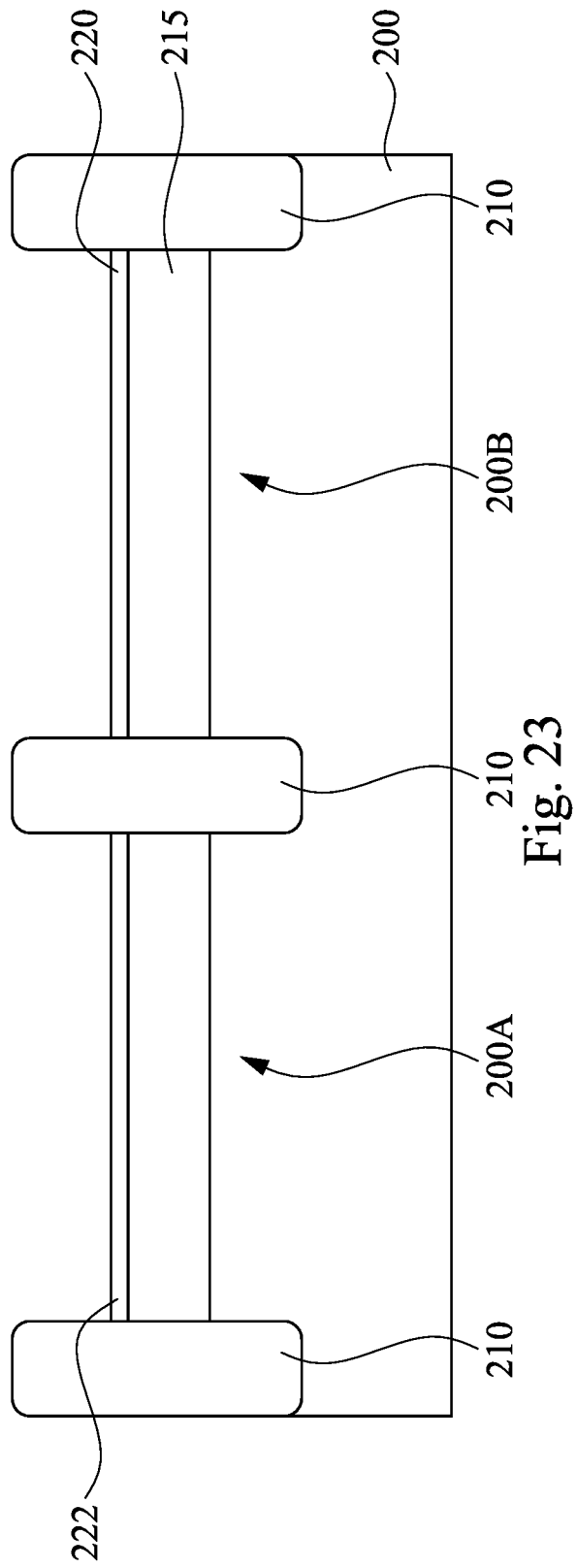
Figure 24:
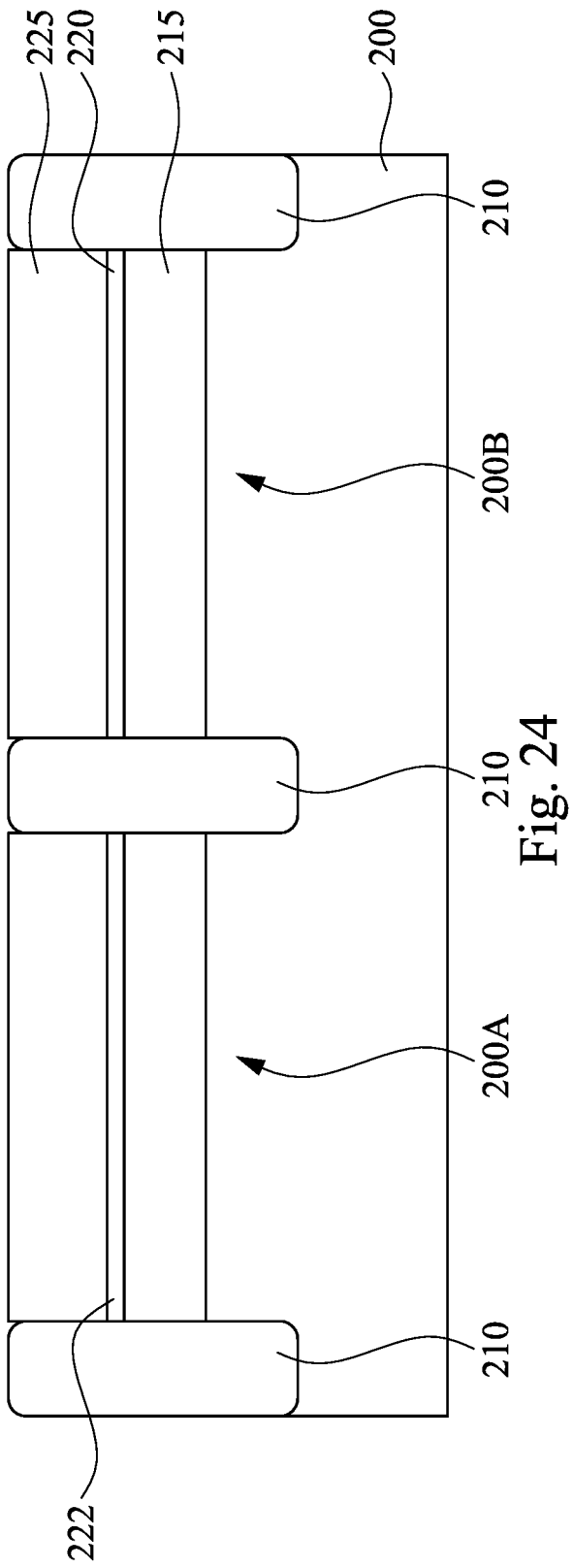

Reference is made to FIG. 23. After the 2-D material layer 222 is formed, the patterned mask 218 is removed. Reference is made to FIG. 24. A photoresist layer 225 is formed over the substrate 200 and covering the protrusion portions 200A and 200B of the substrate 200.

Figure 25:
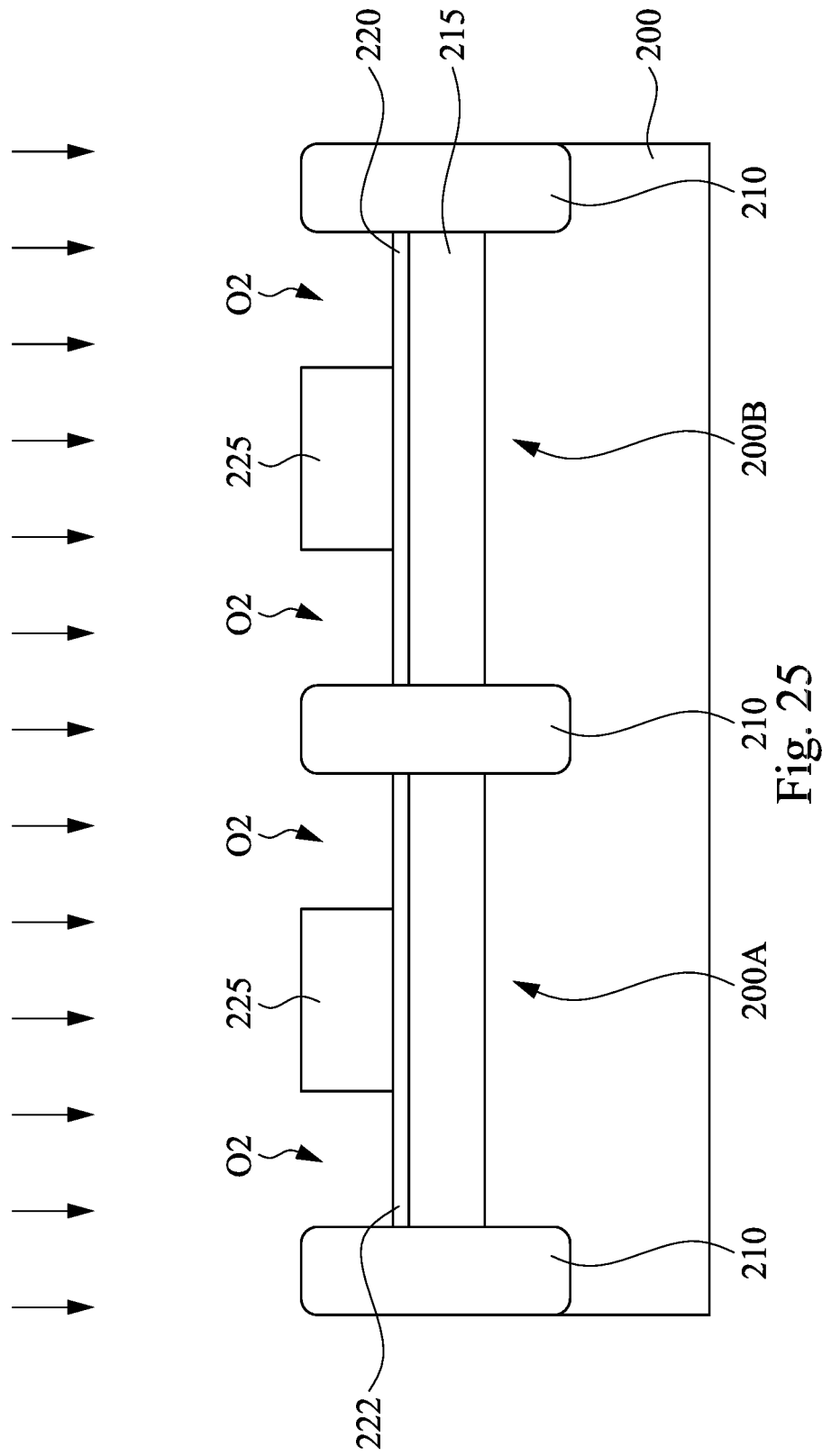

Reference is made to FIG. 25. The photoresist layer 225 is patterned to form openings O2 that exposed portions of the 2-D material layer 220 and 222. In greater details, the openings O2 may expose source/drain regions of the 2-D material layers 220 and 222, respectively.

Figure 26:
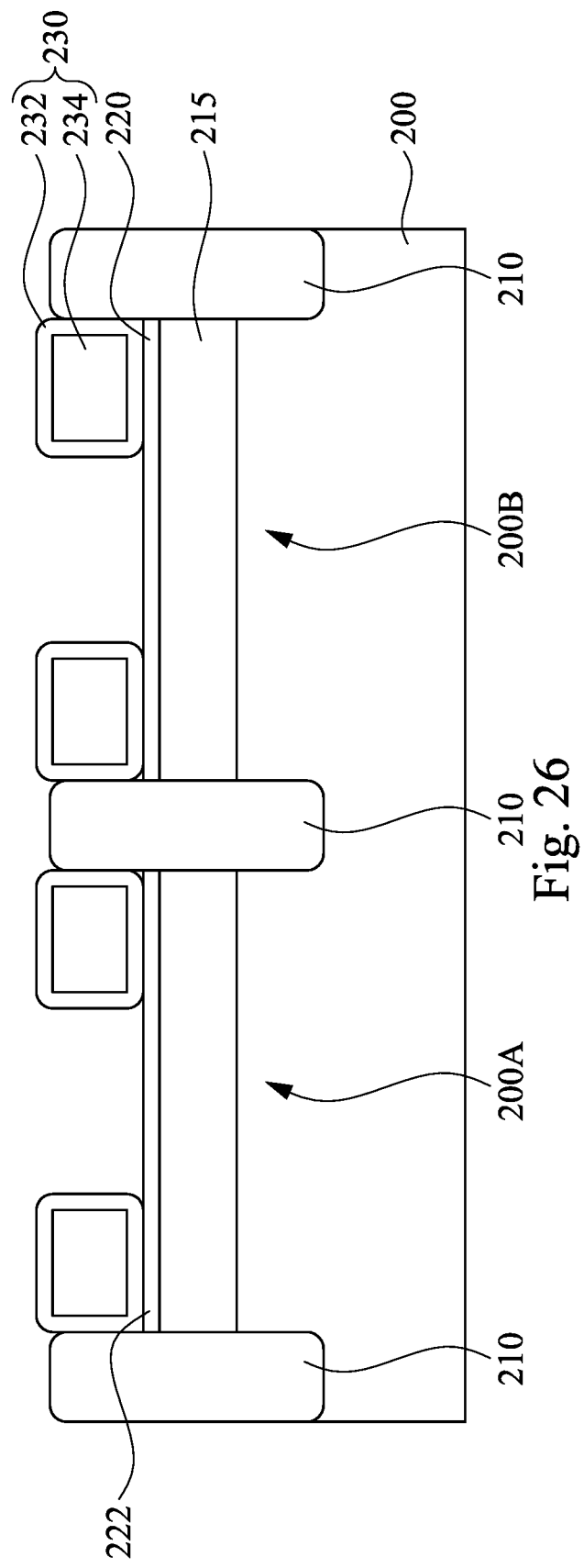

Reference is made to FIG. 26. Source/drain contacts 230 are formed in the openings O2 of the photoresist layer 225 and in contact with the source/drain regions of the 2-D material layers 220 and 222, respectively. In greater details, each of the source/drain contacts 230 includes a first metal layer 232 and a second metal layer 234. The source/drain contacts 230, the first metal layer 232, and the second metal layer 234 may be similar to the source/drain contacts 140, the first metal layer 122, and the second metal layer 130 as described in FIGS. 1A to 8, and the formation method thereof can be similar to the processes as described in FIGS. 1A to 8.

For example, a first deposition process is performed to deposit the first metal layer 232, and then a second deposition process is performed to deposit the second metal layer 234 having a higher melting point than the first metal layer 232. During the second deposition process, the second metal layer 234 with high deposition temperature may re-melt the first metal layer 232, and cause the melted first metal layer 232 coated on surfaces of the second metal layer 234. After the source/drain contacts 230 are formed, the photoresist layer 225 is removed by suitable process, such as a lift-off process. In some embodiments, the source/drain contacts 230 may include thicknesses in a range from about 30 nm to about 60 nm.

Figure 27:
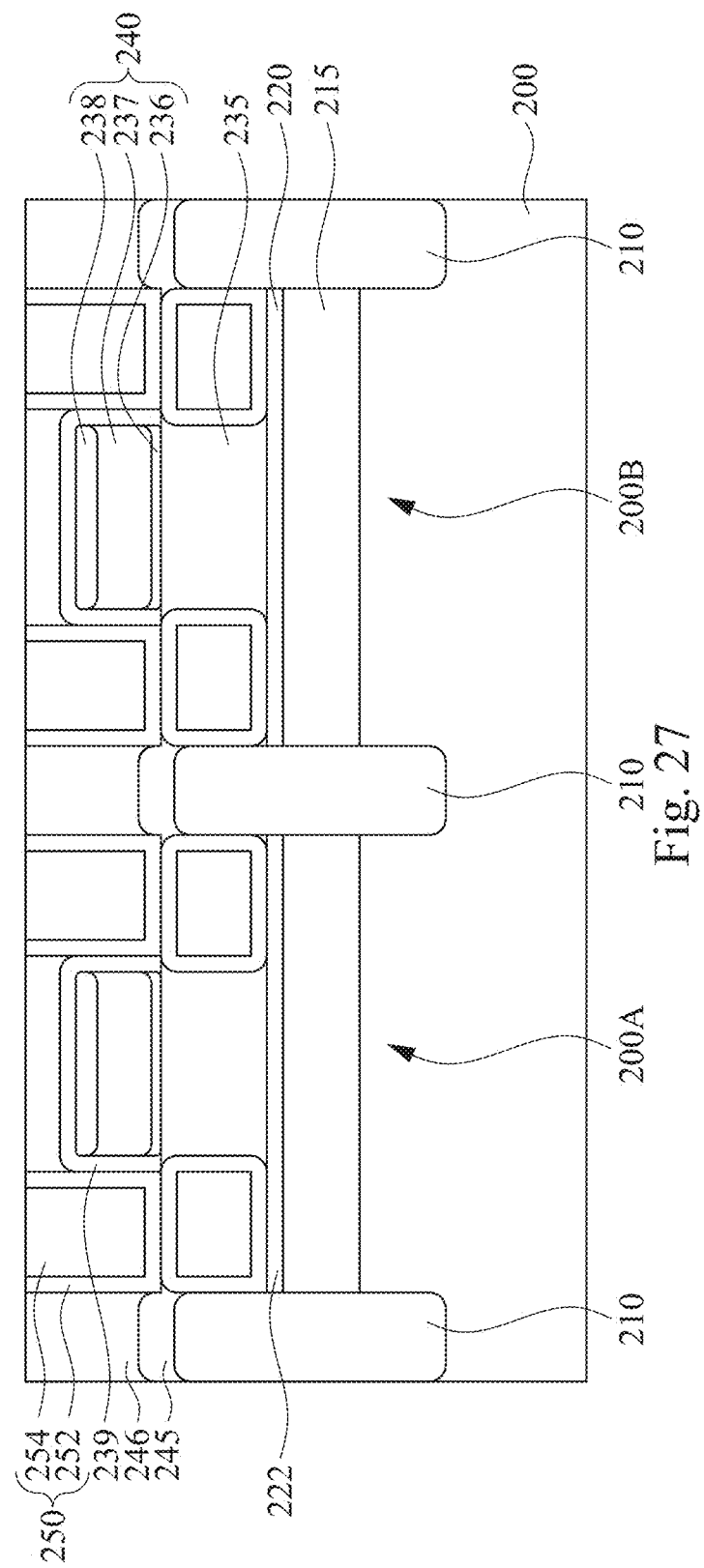

Reference is made to FIG. 27. Gate dielectric layers 235 are formed over the exposed portions of the 2-D material layers 220 and 222, respectively. In greater details, the gate dielectric layers 235 may be in contact with channel regions of the 2-D material layers 220 and 222, and may be in contact with sidewalls of the source/drain contacts 230, respectively. In some embodiments, the gate dielectric layers 235 may be similar to the gate dielectric layer 152 as described in FIGS. 1A to 8. The gate dielectric layers 235 may be formed by suitable deposition process and may be patterned using suitable lithography process. In some embodiments, the gate dielectric layer 235 has a thickness in a range from about 10 nm to about 100 nm.

Work function metal layers 236, gate electrodes 237, and hard masks 238 are formed over the gate dielectric layers 235, respectively. In some embodiments, the work function metal layers 236, the gate electrodes 237, and the hard masks 238 may be formed by, for example, sequentially depositing materials of the work function metal layers 236, the gate electrodes 237, and the hard masks 238 over the substrate 200, and patterning the materials to form the work function metal layers 236, the gate electrodes 237, and the hard masks 238.

In some embodiments, each gate dielectric layer 235 and the overlying work function metal layer 236 and the gate electrode 237 can be collectively referred to as a gate structure 240. Therefore, one gate structure 240 is formed over the protrusion portion 200A of the substrate 200, and one gate structure 240 is formed over the protrusion portion 200B of the substrate 200. The 2-D material layer 222, the gate structure 240, and the source/drain contacts 230 over the protrusion portion 200A of the substrate 200 may collectively form a first transistor. In some embodiments where the 2-D material layer 220 is made of $MoS_2$, the first transistor may be a N-type transistor, such as N-FET. The 2-D material layer 220, the gate structure 240, and the source/drain contacts 230 over the protrusion portion 200B of the substrate 200 may collectively form a second transistor. In some embodiments where the 2-D material layer 222 is made of $WS_2$, the first transistor may be a P-type transistor, such as P-FET.

In some embodiments, word function metal layers 236 are formed over the gate dielectric layers 235, respectively. In some embodiments, the work function metal layer 236 may include an n-type, a p-type work function layers, or combinations thereof to obtain a desired work function value. Exemplary p-type work function metals include TIN, TaN, Ru, Mo, Al, WN, $ZrSi_2$, $MoSi_2$, $TaSi_2$, $NiSi_2$, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. In some embodiments, the gate electrodes 237 may include tungsten (W). In some other embodiments, the gate electrodes 237 includes aluminum (Al), copper (Cu) or other suitable conductive material. In some embodiments, hard masks 238 may be oxide.

A plurality of gate spacers 239 are disposed on opposite sides of the gate structures 240. In some embodiments, the gate spacers 239 may include $SiO_2$, $Si_3N_4$, $SiO_xN_y$, SiC, SiCN films, SiOC, SiOCN films, and/or combinations thereof.

A contact etch stop layer (CESL) 245 is disposed over the STI structures 210 and over the hard masks 238. An interlayer dielectric (ILD) layer 246 is disposed over the CESL 245 and laterally surrounds the gate structures 240. In some embodiments, the CESL 245 includes silicon nitride, silicon oxynitride or other suitable materials. The CESL 245 can be formed using, for example, plasma enhanced CVD, low pressure CVD, ALD or other suitable techniques. In some embodiments, the ILD layer 246 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 246 may be formed using, for example, CVD, ALD, spin-on-glass (SOG) or other suitable techniques.

Conductive features 250 are formed in the ILD layer 246 and contact the source/drain contacts 230. In some embodiments, each conductive feature 250 includes a liner 252 and a plug 254. The liner 252 is between plug 254 and the underlying source/drain contacts 230. In some embodiments, the liner 252 assists with the deposition of plug 254 and helps to reduce diffusion of a material of plug 254 through the gate spacers 239. In some embodiments, the liner 252 includes titanium (Ti), titanium nitride (TiN), tantalum (Ta), tantalum nitride (TaN), or another suitable material. The Plug 254 includes a conductive material, such tungsten (W), copper (Cu), aluminum (Al), ruthenium (Ru), cobalt (Co), molybdenum (Mo), nickel (Ni), or other suitable conductive material.

Figure 28:
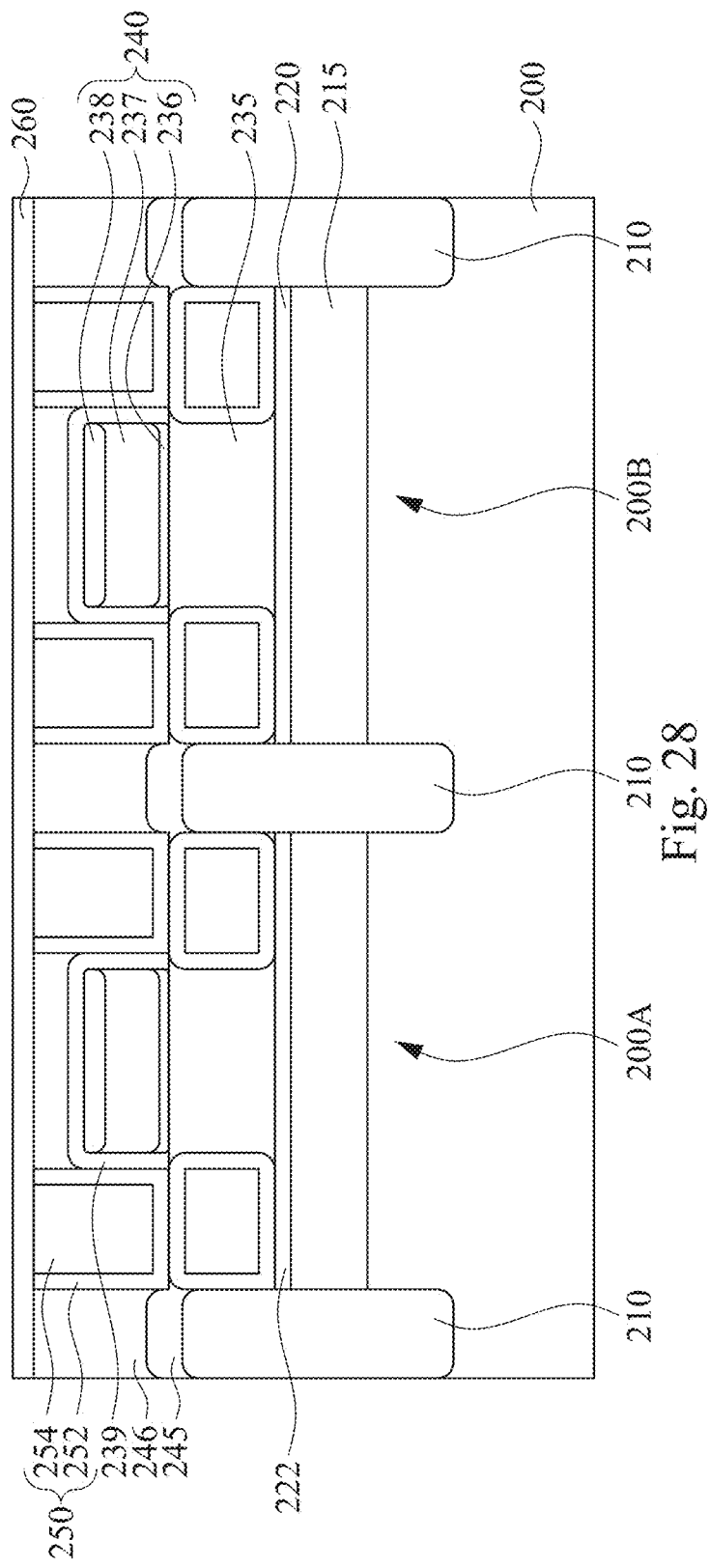
Figure 29:
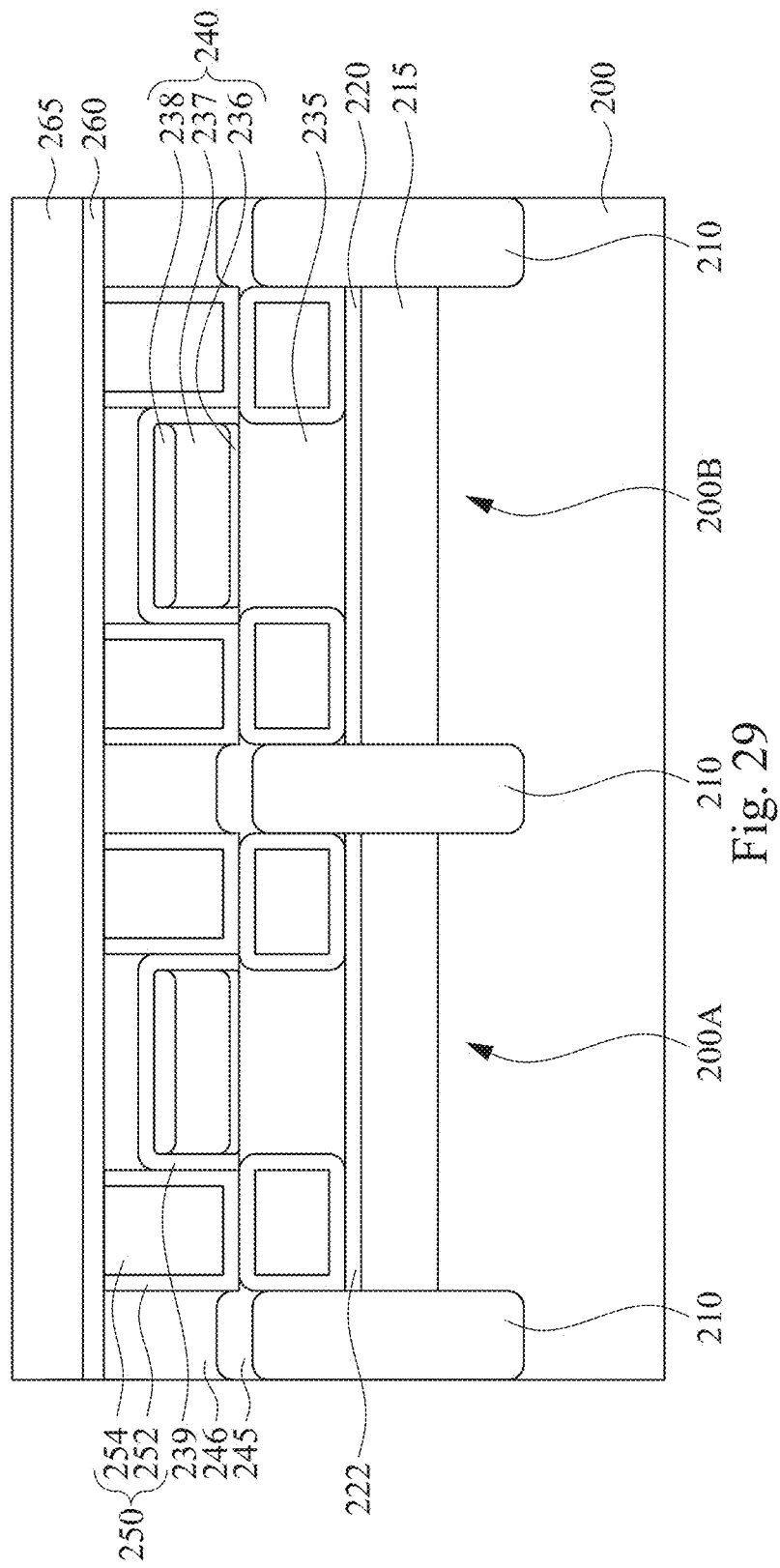

Reference is made to FIG. 28. An etch stop layer (ESL) 260 is formed over the ILD layer 246 and the conductive features 250. Reference is made to FIG. 29. An inter-metal dielectric (IMD) layer 265 is disposed over the ESL 260. The material and the formation method of the ESL 260 are similar to those of the CESL 245. Moreover, the material and the formation method of the IMD layer 265 are similar to those of the ILD layer 246.

Figure 30:
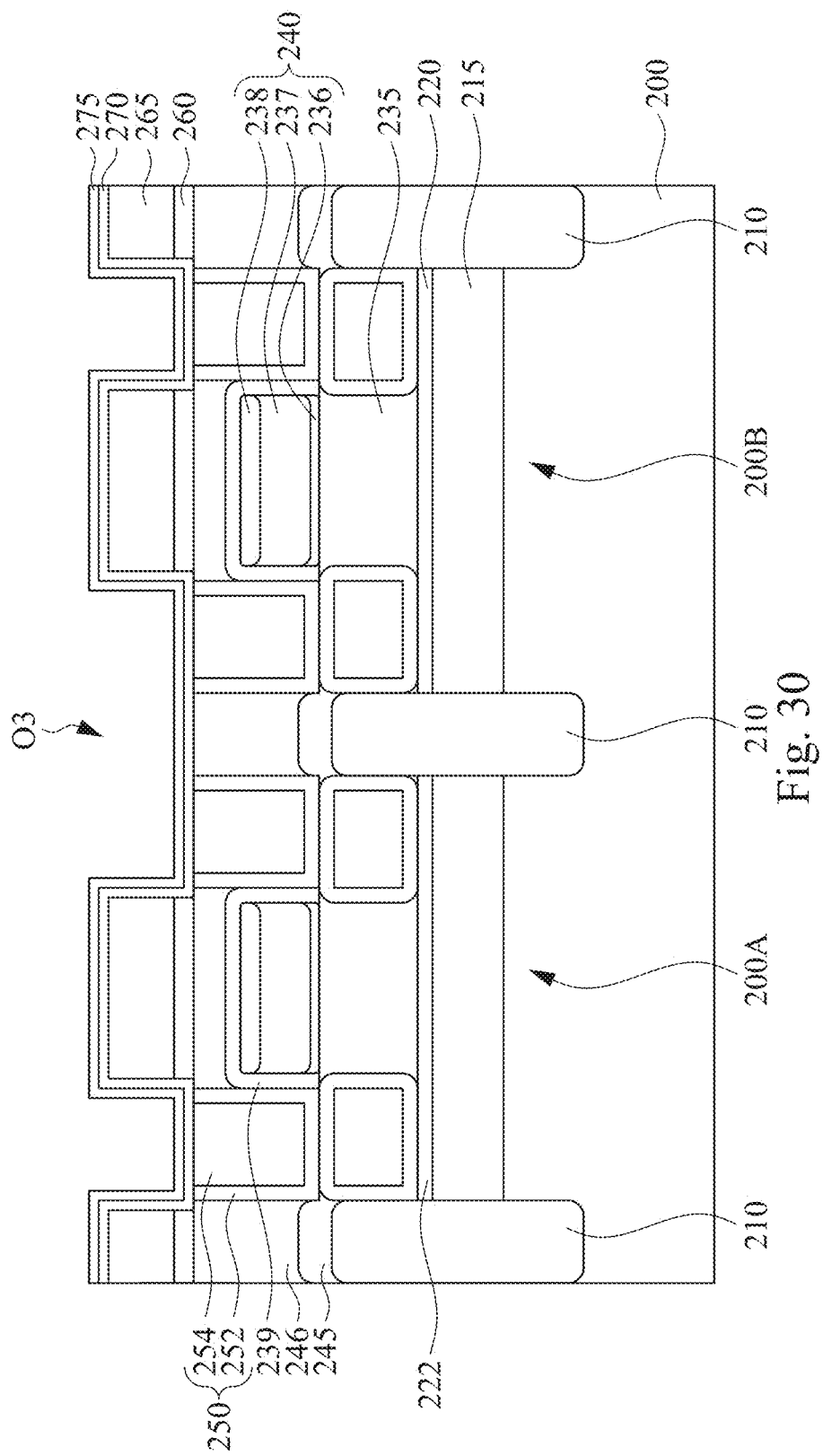

Reference is made to FIG. 30. The ESL 260 and the IMD layer 265 are patterned to form openings O3. Then, a liner 270 and a metal seed layer 275 are formed in the openings O3. In some embodiments, the liner 270 includes titanium (Ti), titanium nitride (TiN), tantalum (Ta), tantalum nitride (TaN), or another suitable material. The metal seed layer 275 may be copper (Cu), cobalt (Co), nickel (Ni), ferrum (Fe), or suitable conductive materials.

Figure 31:
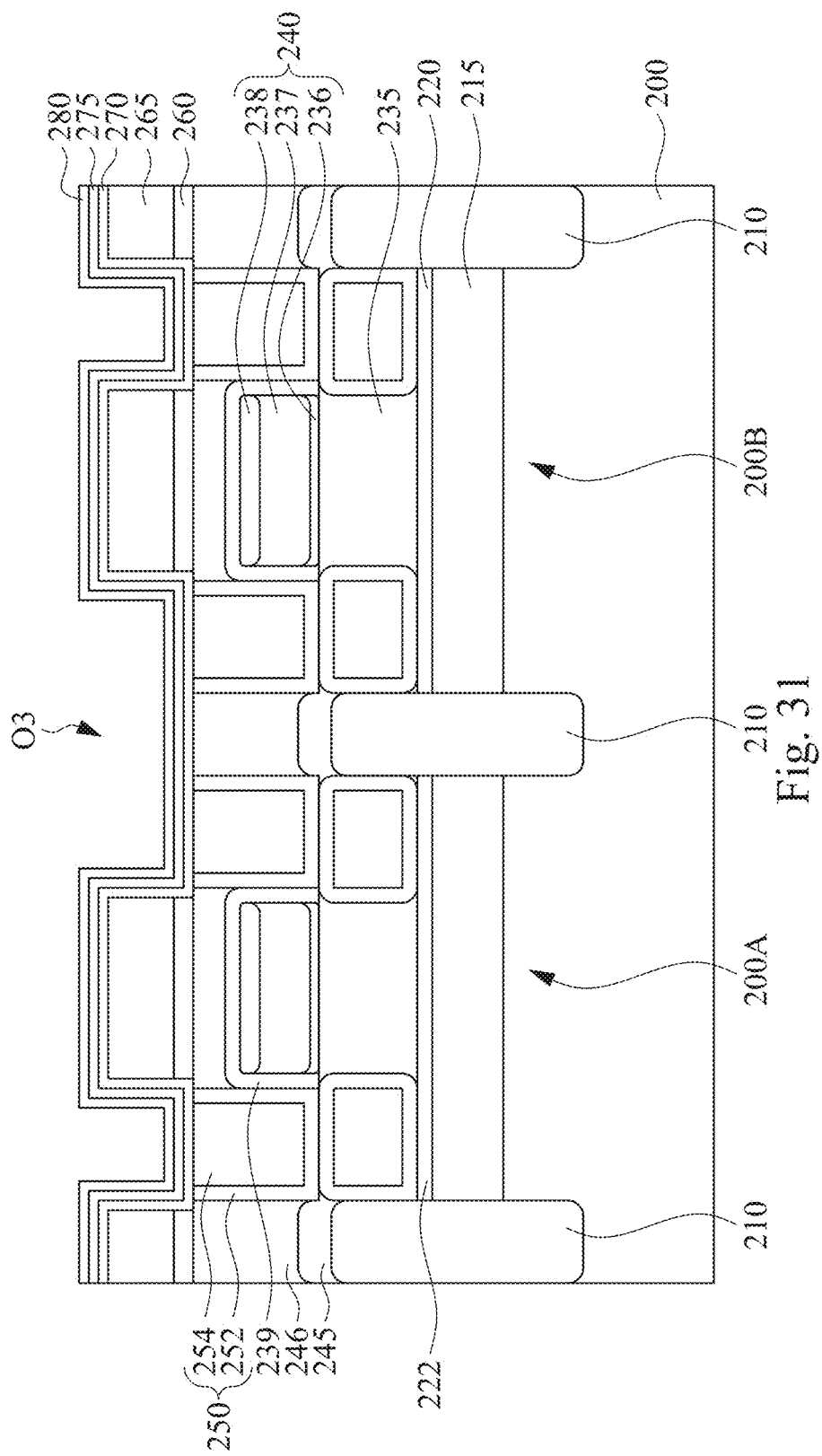

Reference is made to FIG. 31. A graphene layer 280 is deposited over the metal seed layer 275. The graphene layer 280 may be formed by epitaxial graphene growth. In some embodiments, a silicon carbide dielectric is used as a seed layer to promote the epitaxial growth of the graphene on the substrate 200. In some embodiments, another exemplary technique for forming a graphene layer utilizes CVD (chemical vapor deposition) directly on the substrate 200. In some other embodiments, graphene layer may be formed on a backing material (such as an adhesive tape), the backing material can be adhered to the substrate 200. Then, the backing material can be removed while leaving the graphene layer on the substrate 200. In some other embodiments, graphene is formed by reacting a metal film with silicon carbide to form a metal carbide. The metal carbide is annealed to produce a metal silicide and graphene from the remaining carbon. In yet other exemplary embodiments, graphene layer is deposited using an aqueous solution of graphene oxide.

Figure 32:
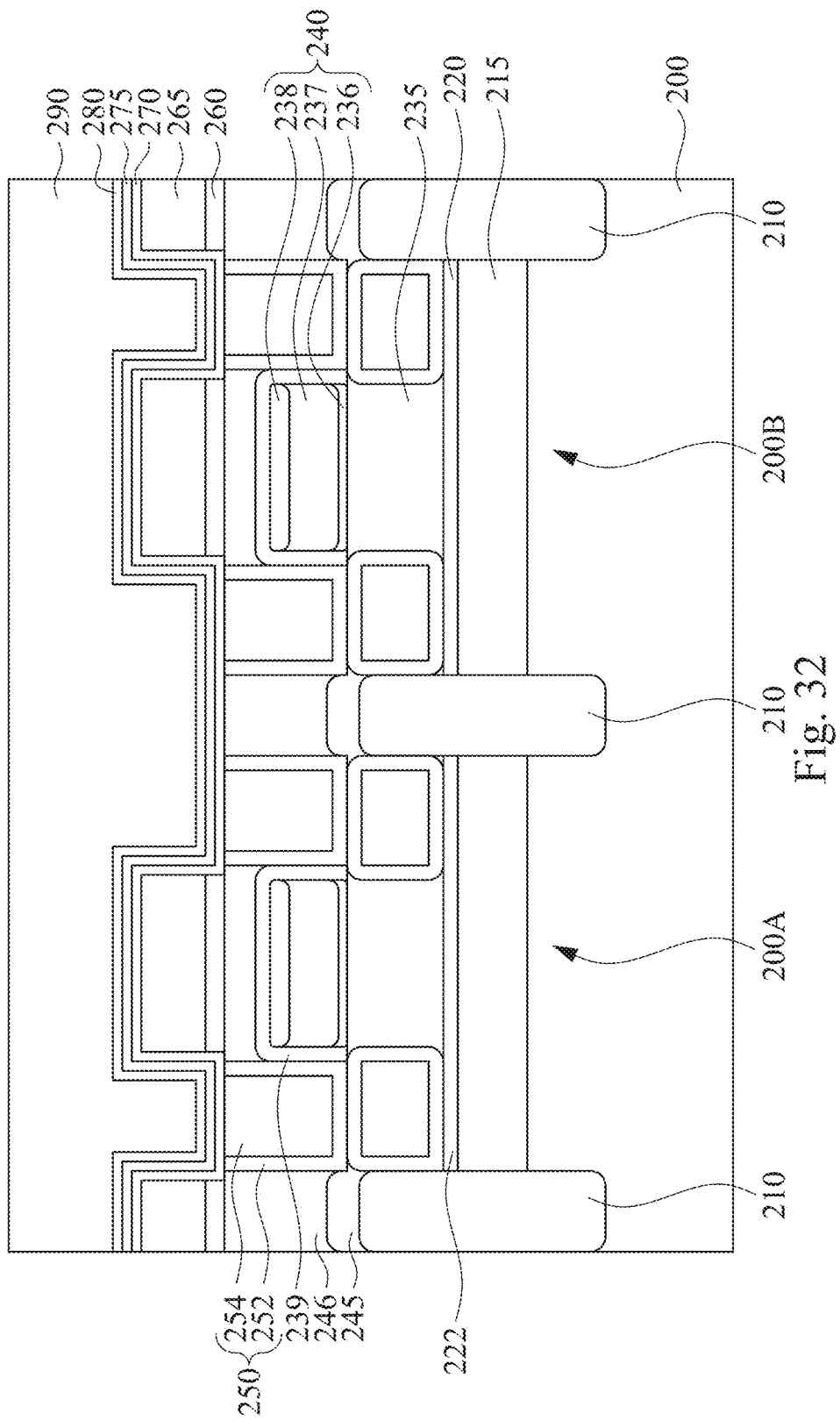

Reference is made to FIG. 32. A filling metal 290 is deposited over the graphene layer 280 and fills the openings O3. In some embodiments, the material of the filling metal 290 may be similar to the metal seed layer 275. In some embodiments, the filling metal 290 may be formed by, for example, PVD, CVD, ALD, electroplating, or suitable processes. In some embodiments, an annealing process may be performed after forming the filling metal 290.

Figure 33:
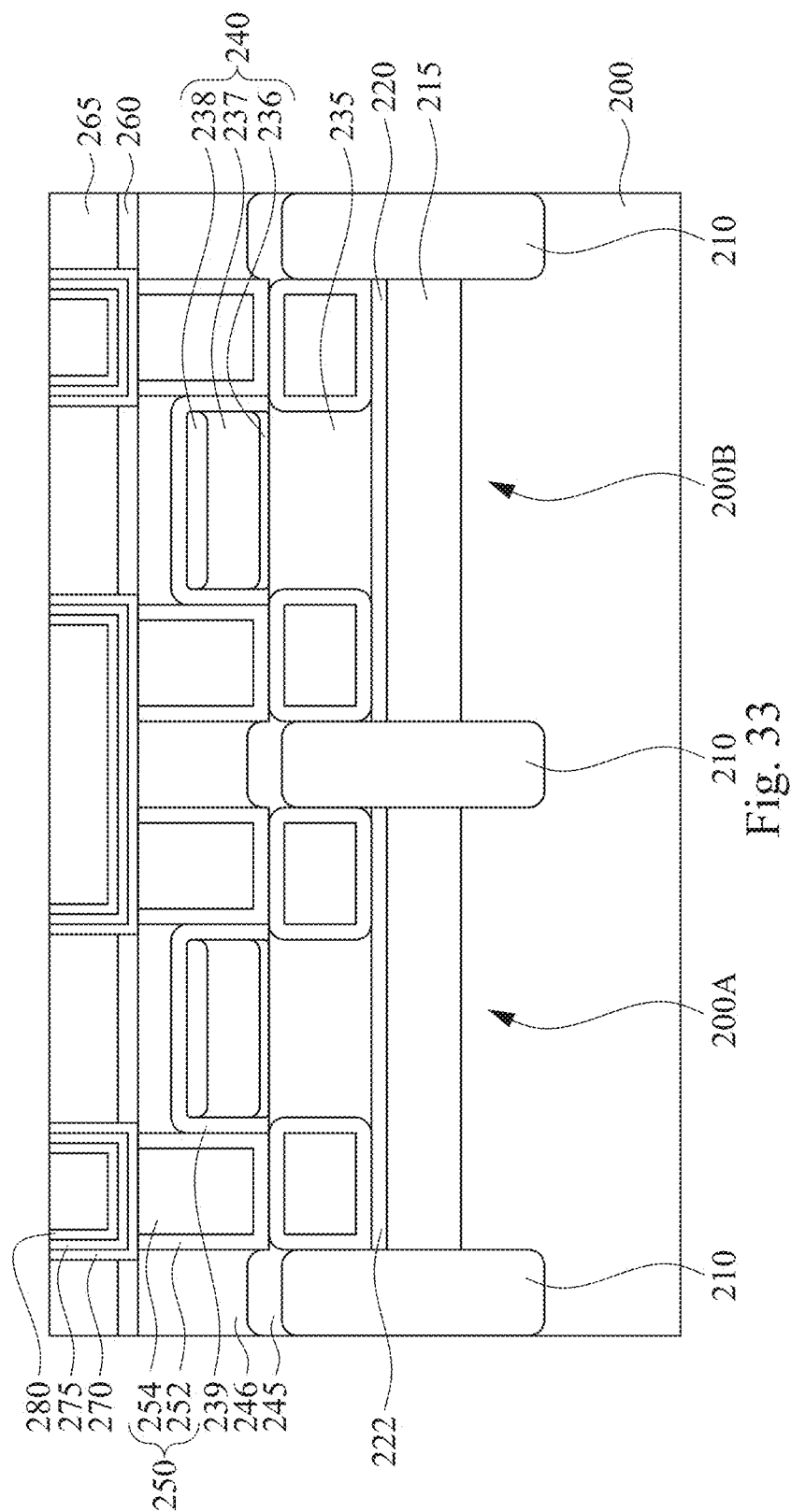

Reference is made to FIG. 33. A chemical mechanical polishing (CMP) process is performed to remove excessive materials of the filling metal 290, the graphene layer 280, the metal seed layer 275, and the liner 270 until the IMD layer 265 is exposed. In some embodiments, the remaining filling metal 290, the graphene layer 280, the metal seed layer 275, and the liner 270 can be referred to as metal-1 (M1) layer in a back end of line (BEOL) process.

Figure 34:
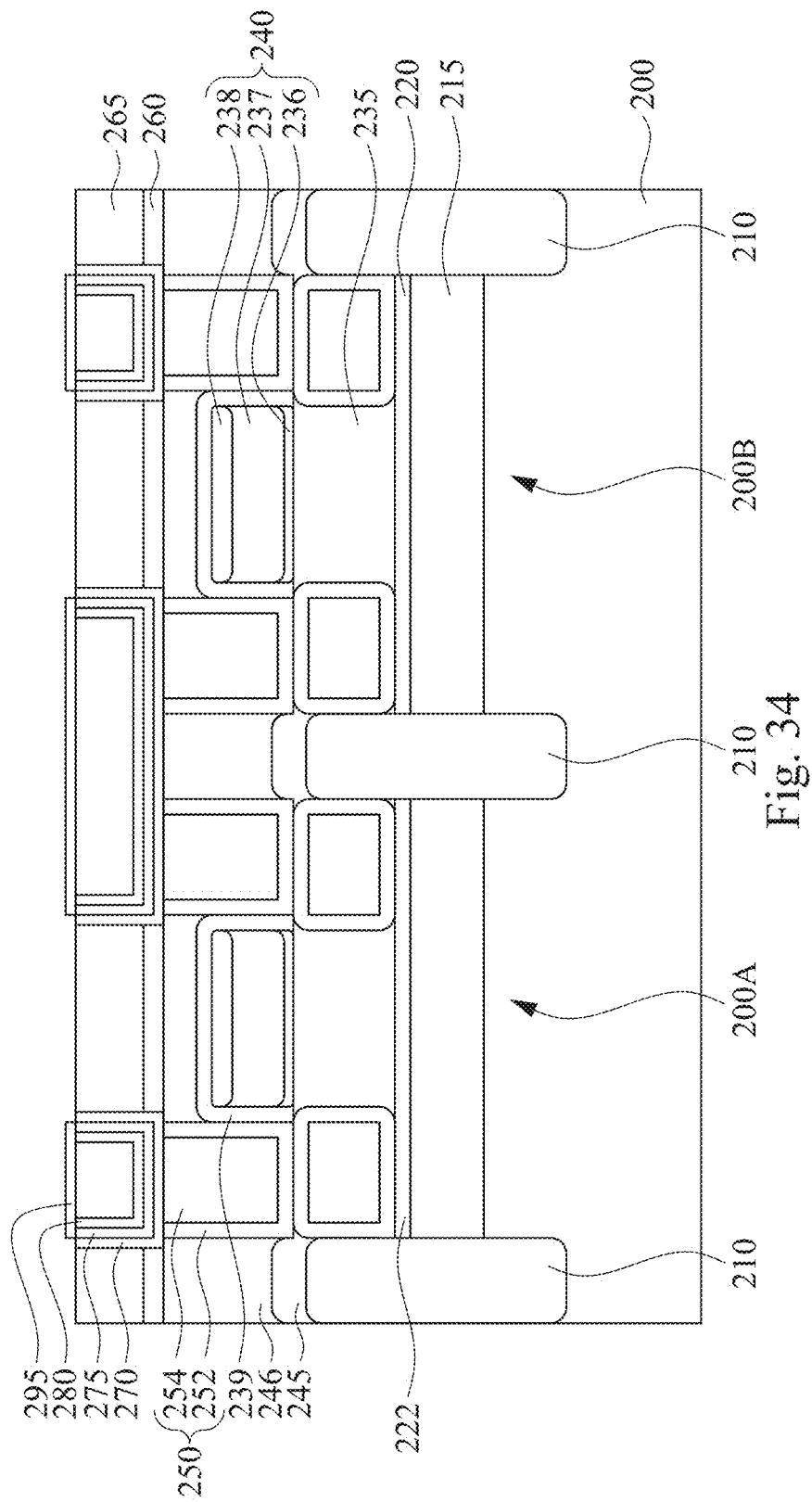

Reference is made to FIG. 34. A plurality of graphene layers 295 are deposited on the remaining filling metal 290, the graphene layer 280, the metal seed layer 275, and the liner 270. In some embodiments, the graphene layers 295 tend to grow on a graphene surface and/or a metal surface rather than on a dielectric surface. As an example in FIG. 34, the graphene layers 295 is selectively formed on the filling metal 290, the graphene layer 280, the metal seed layer 275, and the liner 270, while the graphene layers 295 is not formed on the IMD layer 265.

Figure 35:
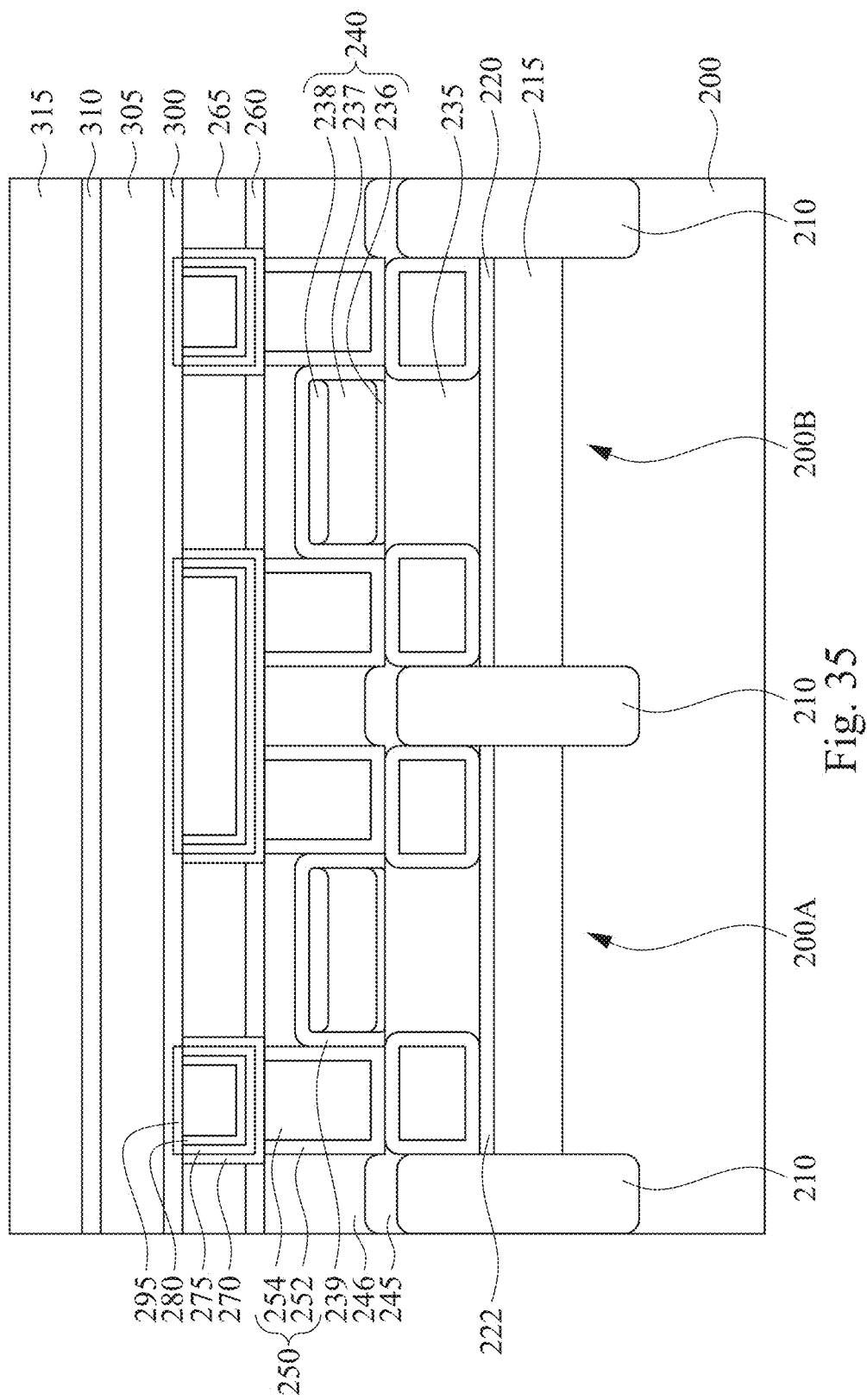

Reference is made to FIG. 35. An ESL 300, an IMD layer 305, an ESL 310, and an IMD layer 315 are formed sequentially over the IMD layer 265. The ESLs 300 and 310 are similar to the ESL 260, the IMD layers 305 and 315 are similar to the IMD layer 265, and thus relevant details will not be repeated for brevity.

Figure 36:
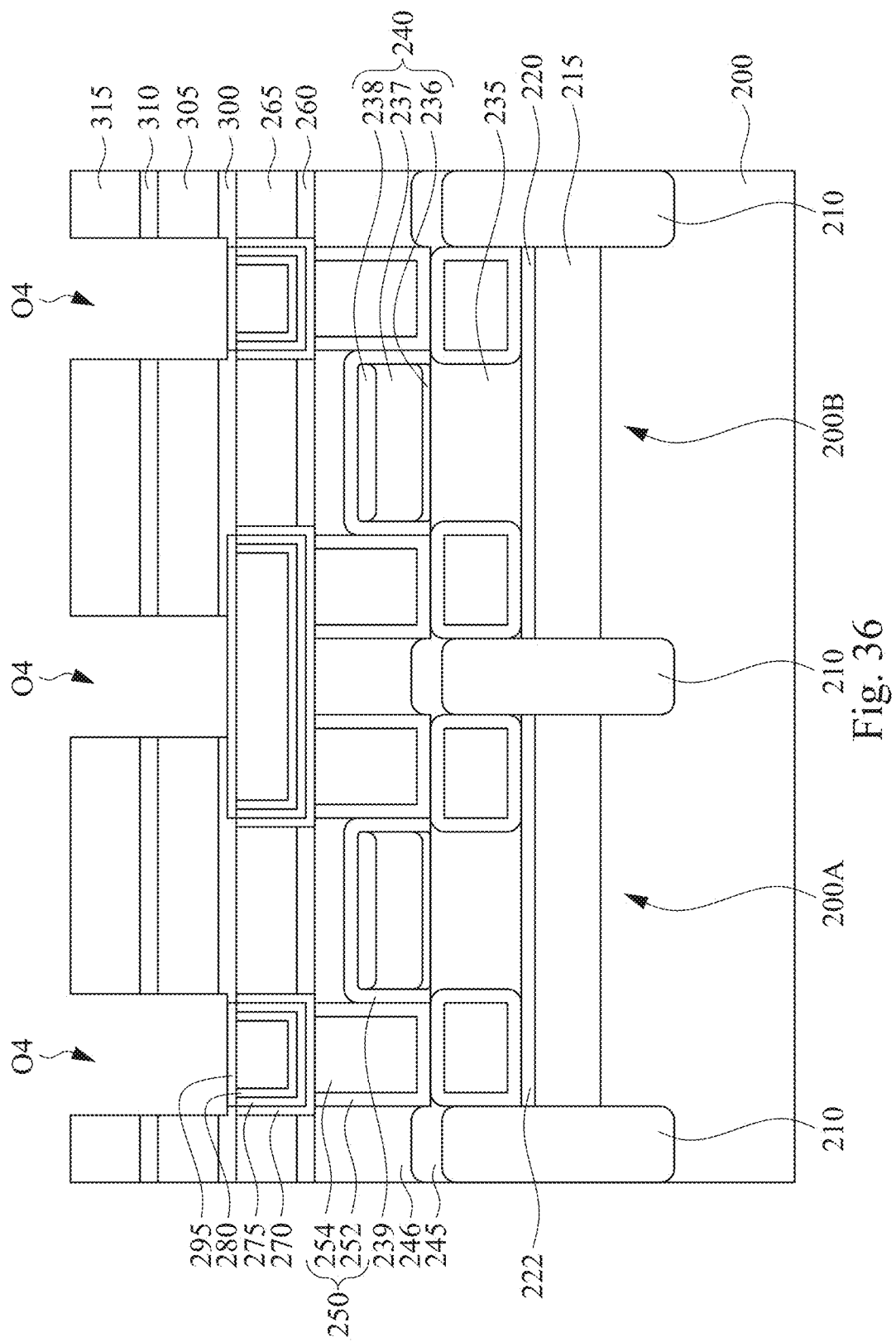

Reference is made to FIG. 36. The ESL 300, the IMD layer 305, the ESL 310, and the IMD layer 315 are patterned to form via openings O4. In some embodiments, the via openings O4 are aligned with and expose the graphene layer 295. In some embodiments, via openings O4 may be formed by, for example, forming a patterned photoresist layer over the IMD layer 315, followed by an etching process to remove portions of the ESL 300, the IMD layer 305, the ESL 310, and the IMD layer 315, and then removing the photoresist layer.

Figure 37:
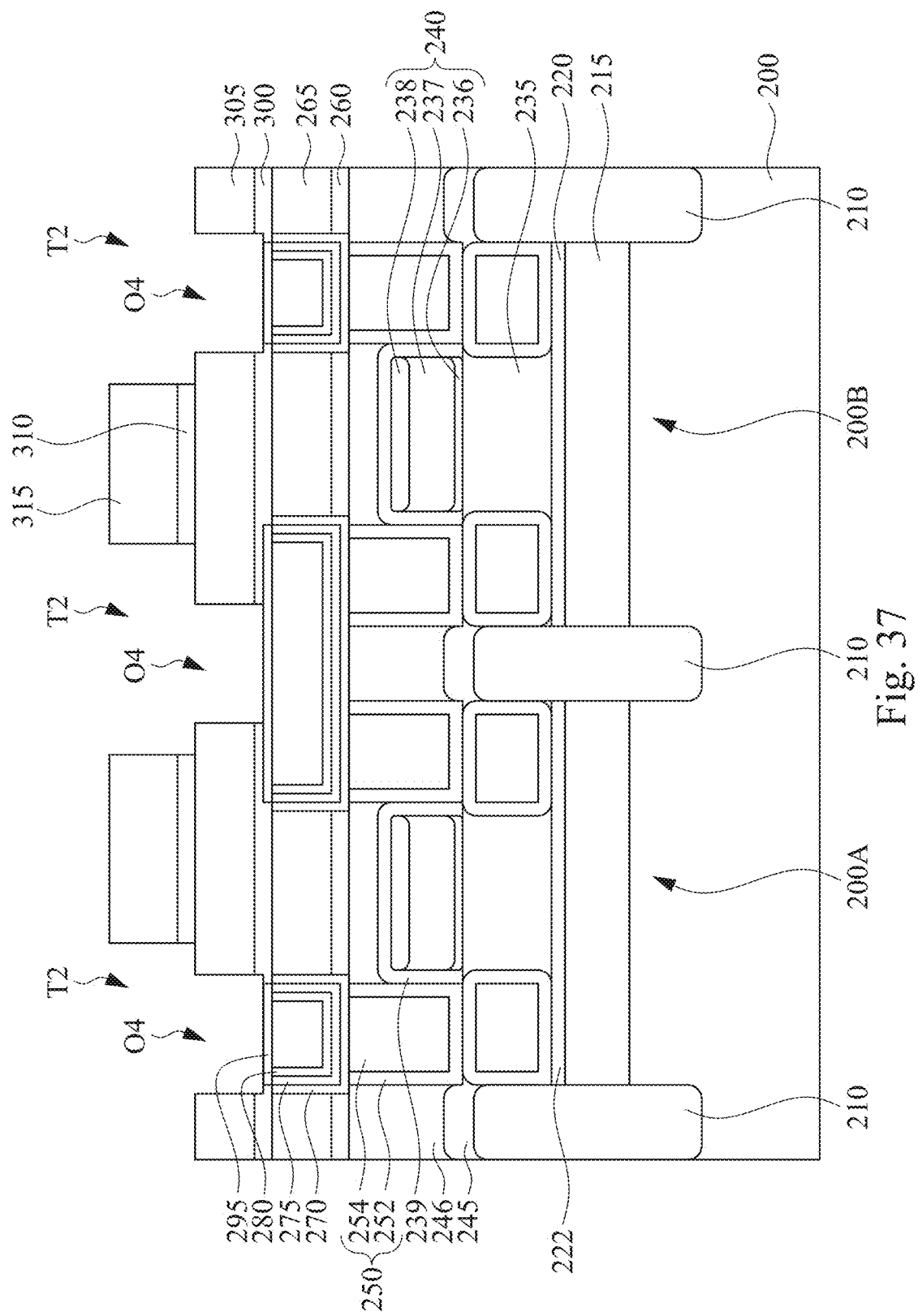

Reference is made to FIG. 37. The ESL 310, and the IMD layer 315 are patterned to form trenches T2 that are aligned above via openings O4. In some embodiments, trenches T2 may be formed by, for example, forming a patterned photoresist layer over the IMD layer 315, followed by an etching process to remove portions of the ESL 310, and the IMD layer 315, and then removing the photoresist layer.

Figure 38:
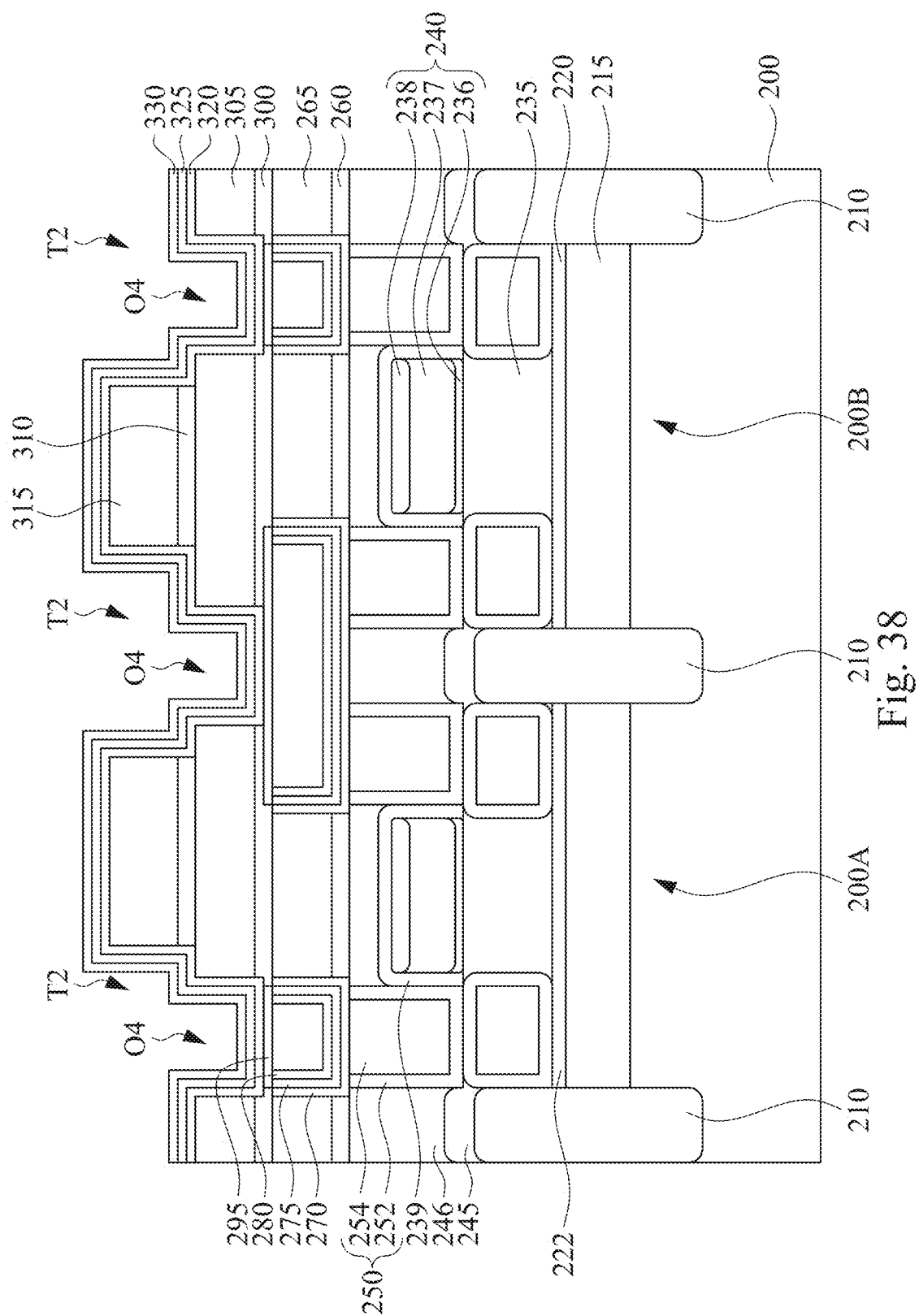

Reference is made to FIG. 38. A liner 320, a metal seed layer 325, and a graphene layer 330 are formed sequentially over the IMD layer 315 and in the via openings O4 and the trenches T2. The liner 320 and the metal seed layer 325 are similar to the liner 270 and the metal seed layer 275, respectively, and thus relevant details will not be repeated for brevity. The graphene layer 330 is similar to the graphene layer 295, and thus relevant details will not be repeated for brevity.

Figure 39:
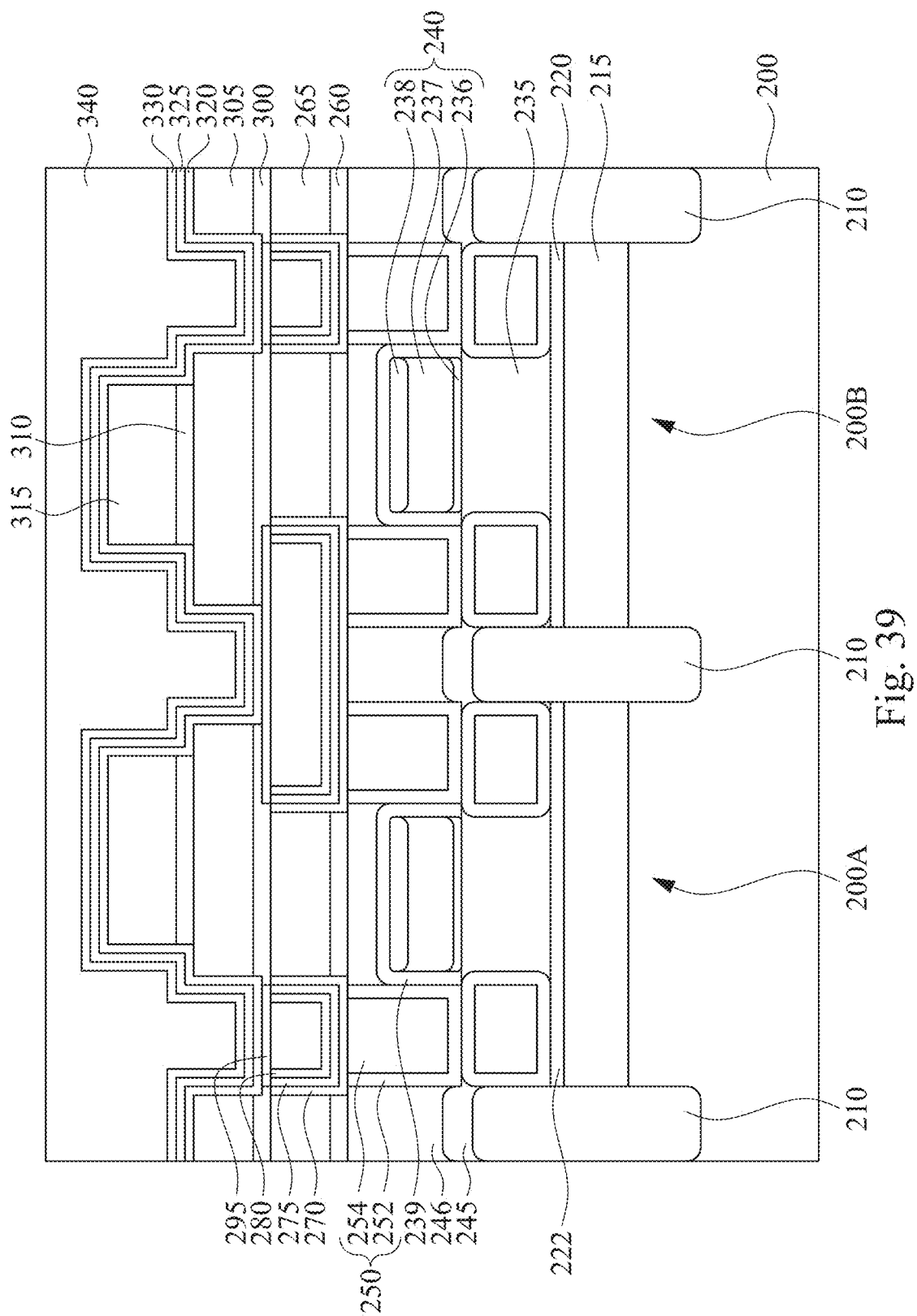

Reference is made to FIG. 39. A filling metal 340 is deposited over the graphene layer 330 and fills the via openings O4 and trenches T2. The filling metal 340 is similar to the filling metal 290, and thus relevant details will not be repeated herein after.

Figure 40:
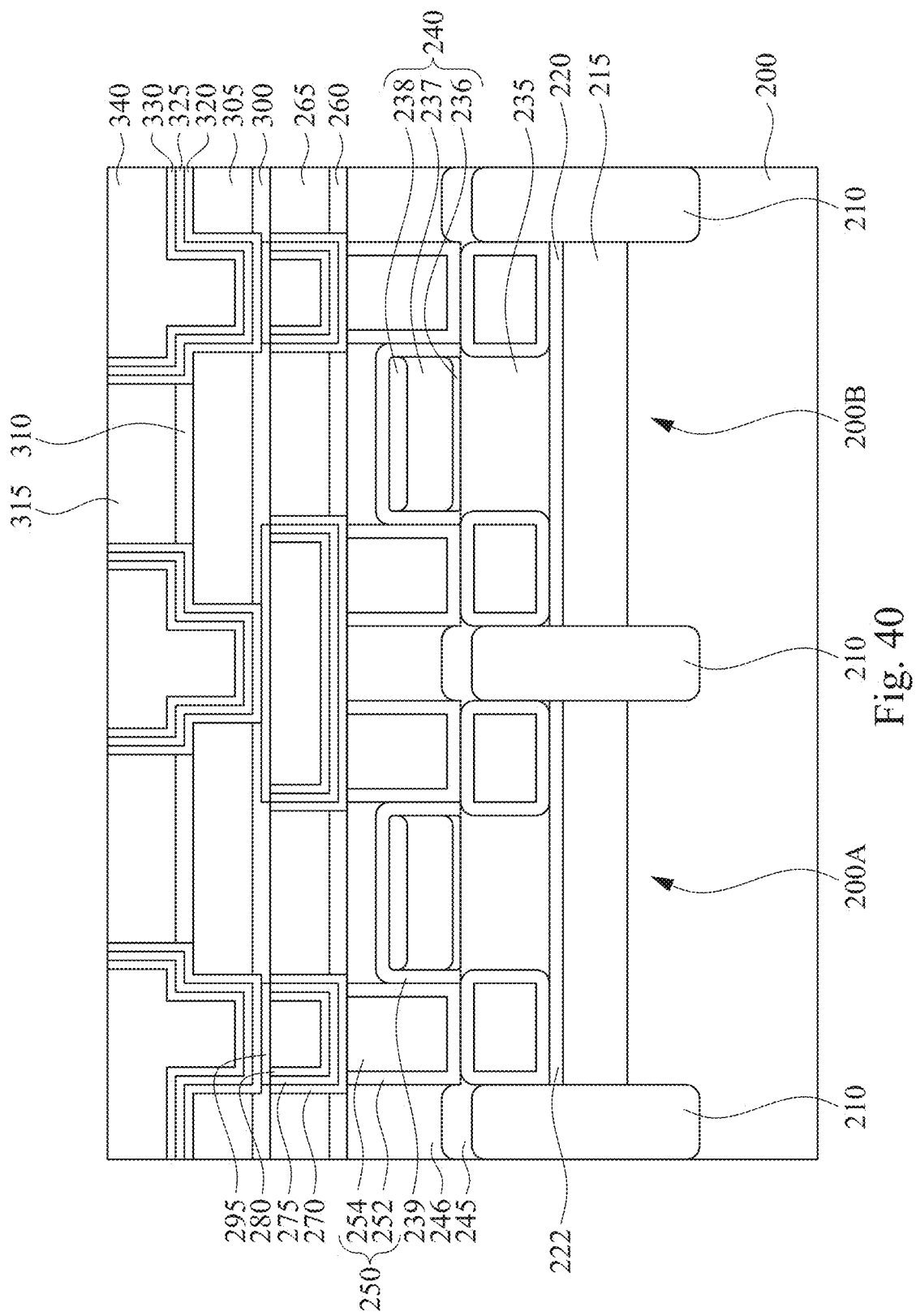

Reference is made to FIG. 40. A chemical mechanical polishing (CMP) process is performed to remove excessive materials of the filling metal 340, the graphene layer 330, the metal seed layer 325, and the liner 320 until the IMD layer 315 is exposed. In some embodiments, the remaining filling metal 340, the graphene layer 330, the metal seed layer 325, and the liner 320 can be referred to as metal-2 (M2) layer in a back end of line (BEOL) process.

FIGS. 41A to 41E illustrate semiconductor devices in accordance with some embodiments of the present disclosure. It is noted that some elements described in FIGS. 41A to 41E may be similar to those described in FIGS. 1A to 8, and thus relevant details will not be repeated for brevity. FIGS. 41A to 41E are examples of "top gate" semiconductor device, in which source/drain contacts are in direct contact with top surface of a 2-D material channel layer.

Figure 41A:
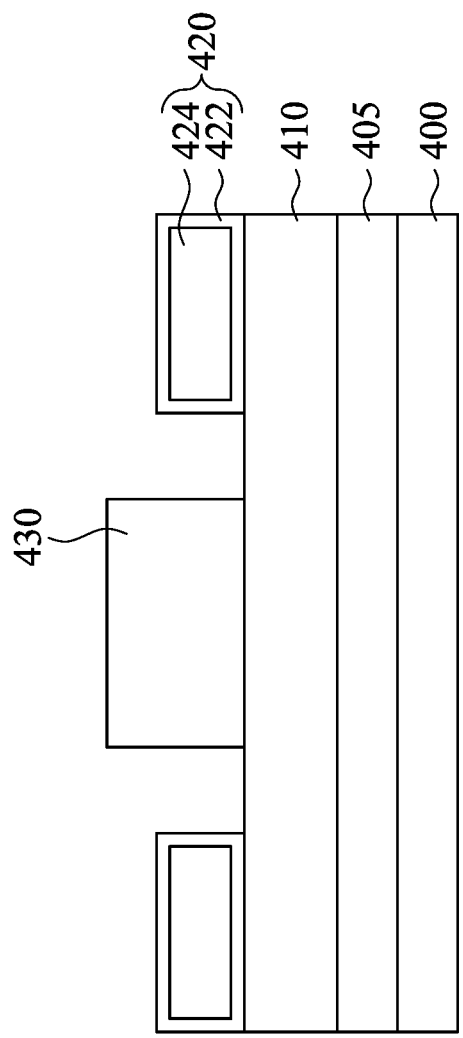

Reference is made to FIG. 41A. The device includes a substrate 400, a dielectric layer 405 over the substrate 400, a 2-D material channel layer 410 over the substrate 400, source/drain contacts 420 over source/drain regions of the 2-D material channel layer 410, and a gate structure 430 over channel region of the 2-D material channel layer 410.

In some embodiments, each of the source/drain contacts 420 includes a first metal layer 422 and a second metal layer 424. The source/drain contacts 420, the first metal layer 422, and the second metal layer 424 may be similar to the source/drain contacts 140, the first metal layer 122, and the second metal layer 130 as described in FIGS. 1A to 8, and the formation method thereof can be similar to the processes as described in FIGS. 1A to 8.

Reference is made to FIG. 41B. The gate structure 430 includes a gate dielectric layer 432 and a gate electrode 434 over the gate dielectric layer 432. In some embodiments, the gate dielectric layer 432 has a thickness in a range from about 1 nm to about 10 nm. In some embodiments, the gate electrode 434 does not overlap the source/drain contacts 420.

Reference is made to FIG. 41C. The gate structure 430 includes a gate dielectric layer 432 and a gate electrode 435 over the gate dielectric layer 432. Different from the gate electrode 434 of FIG. 41B, the gate electrode 435 overlaps the source/drain contacts 420.

Figure 41D:
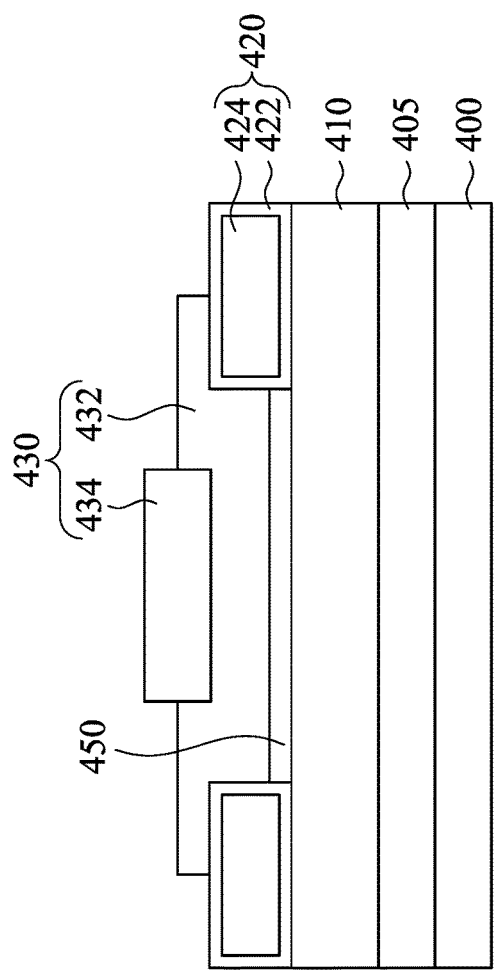

Reference is made to FIG. 41D. FIG. 41D is similar to FIG. 41B, the difference between FIG. 41D and FIG. 41B is that a spacer 450 is disposed between the gate dielectric layer 432 of the gate structure 430 and the 2-D material channel layer 410. In some embodiments, the spacer 450 has a thickness in a range from about 0.4 nm to about 0.8 nm. In some embodiments, the spacer 450 may be made of polymethylmethacrylate (PMMA), polydimethylsiloxane (PDMS), or photoresist (PR).

Figure 41E:
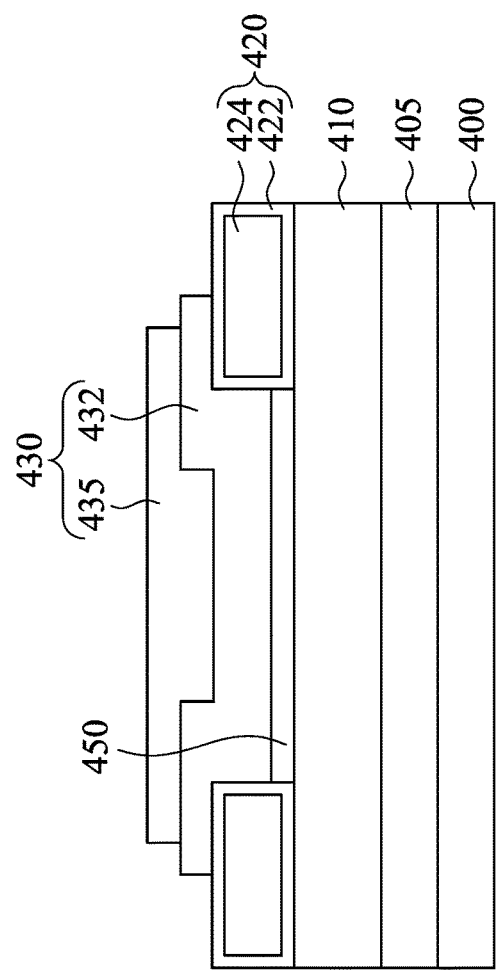

Reference is made to FIG. 41E. FIG. 41E is similar to FIG. 41C, the difference between FIG. 41E and FIG. 41C is that a spacer 450 is disposed between the gate dielectric layer 432 of the gate structure 430 and the 2-D material channel layer 410.

FIGS. 42A to 42E illustrate semiconductor devices in accordance with some embodiments of the present disclosure. It is noted that some elements described in FIGS. 42A to 42E may be similar to those described in FIGS. 1A to 8, and thus relevant details will not be repeated for brevity. FIGS. 42A to 42E are examples of "top gate" semiconductor device, in which source/drain contacts are in contact with edges of a 2-D material channel layer.

Figure 42A:
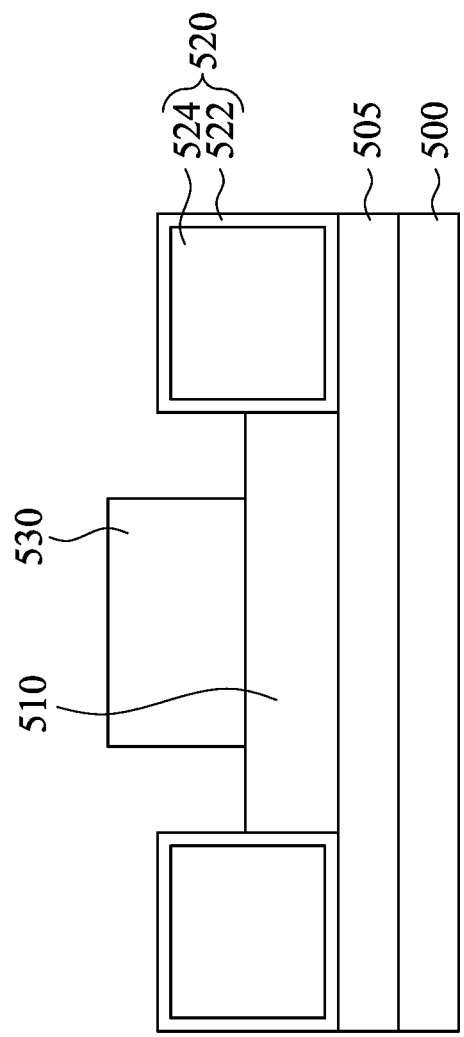

Reference is made to FIG. 42A. The device includes a substrate 500, a dielectric layer 505 over the substrate 500, a 2-D material channel layer 510 over the substrate 500, source/drain contacts 520 in contact with source/drain regions of the 2-D material channel layer 510, and a gate structure 530 over channel region of the 2-D material channel layer 510. In some embodiments, the source/drain contacts 520 are in contact with the 2-D material channel layer 510 through edges of the 2-D material channel layer 510.

In some embodiments, each of the source/drain contacts 520 includes a first metal layer 522 and a second metal layer 524. The source/drain contacts 520, the first metal layer 522, and the second metal layer 524 may be similar to the source/drain contacts 140, the first metal layer 122, and the second metal layer 130 as described in FIGS. 1A to 8, and the formation method thereof can be similar to the processes as described in FIGS. 1A to 8.

Figure 42B:
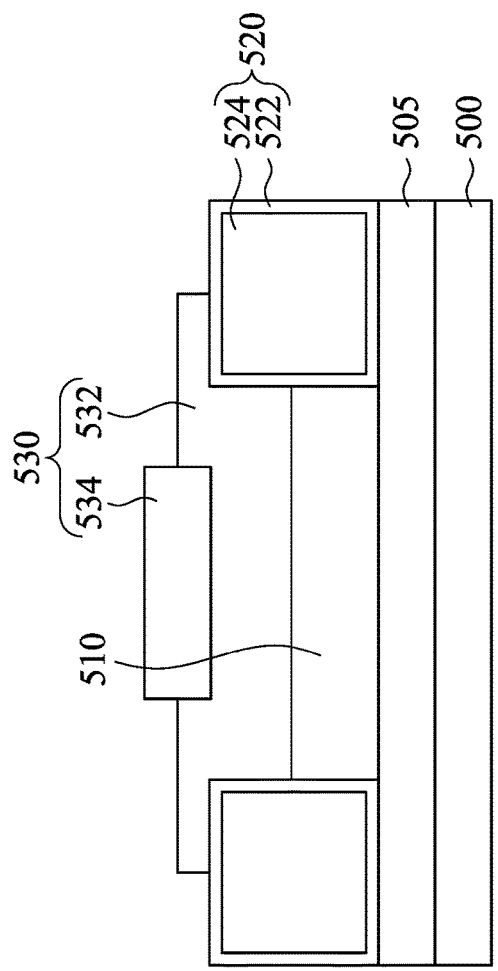

Reference is made to FIG. 42B. The gate structure 530 incudes a gate dielectric layer 532 and a gate electrode 534 over the gate dielectric layer 532. In some embodiments, the gate dielectric layer 532 has a thickness in a range from about 1 nm to about 10 nm. In some embodiments, the gate electrode 534 does not overlap the source/drain contacts 520.

Figure 42C:
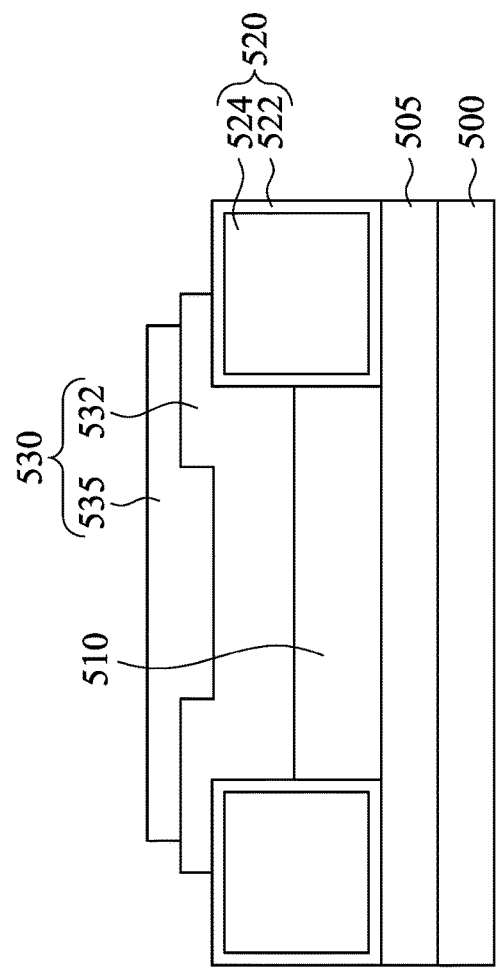

Reference is made to FIG. 42C. The gate structure 530 incudes a gate dielectric layer 532 and a gate electrode 535 over the gate dielectric layer 532. Different from the gate electrode 534 of FIG. 42B, the gate electrode 535 overlaps the source/drain contacts 520.

Reference is made to FIG. 42D. FIG. 42D is similar to FIG. 42B, the difference between FIG. 42D and FIG. 42B is that a spacer 550 is disposed between the gate dielectric layer 532 of the gate structure 530 and the 2-D material channel layer 510. In some embodiments, the spacer 550 has a thickness in a range from about 0.4 nm to about 0.8 nm. In some embodiments, the spacer 550 may be made of polymethylmethacrylate (PMMA), polydimethylsiloxane (PDMS), or photoresist (PR).

Reference is made to FIG. 42E. FIG. 42E is similar to FIG. 42C, the difference between FIG. 42E and FIG. 42C is that a spacer 550 is disposed between the gate dielectric layer 532 of the gate structure 530 and the 2-D material channel layer 510.

FIGS. 43A to 43E illustrate semiconductor devices in accordance with some embodiments of the present disclosure. It is noted that some elements described in FIGS. 43A to 43E may be similar to those described in FIGS. 1A to 8, and thus relevant details will not be repeated for brevity.

FIGS. 43A to 43E are examples of "bottom gate" semiconductor device, in which source/drain contacts are in direct contact with top surface of a 2-D material channel layer.

Figure 43A:
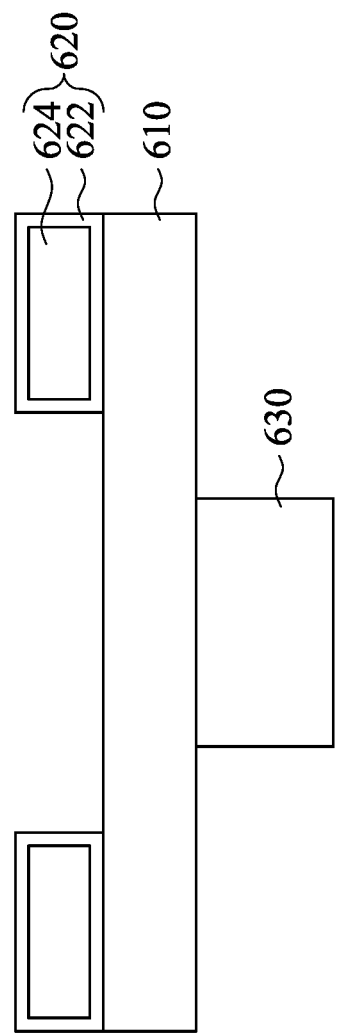

Reference is made to FIG. 43A. The device includes a 2-D material channel layer 610, source/drain contacts 620 disposed on top surface of the 2-D material channel layer 610, and a gate structure 630 disposed on bottom surface of the 2-D material channel layer 610.

In some embodiments, each of the source/drain contacts 620 includes a first metal layer 622 and a second metal layer 624. The source/drain contacts 620, the first metal layer 622, and the second metal layer 624 may be similar to the source/drain contacts 140, the first metal layer 122, and the second metal layer 130 as described in FIGS. 1A to 8, and the formation method thereof can be similar to the processes as described in FIGS. 1A to 8.

Figure 43B:
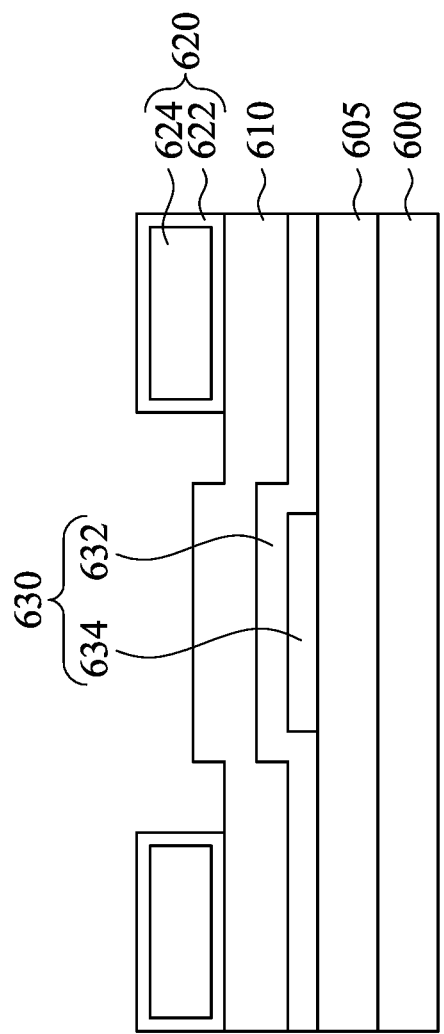

Reference is made to FIG. 43B. A dielectric layer 605 is disposed over a substrate 600. The gate structure 630 is disposed over the dielectric layer 605. The 2-D material channel layer 610 is disposed over the gate structure 630. The source/drain contacts 620 are disposed over the 2-D material channel layer 610. The gate structure 630 incudes a gate dielectric layer 632 and a gate electrode 634 below the gate dielectric layer 632. In some embodiments, the gate dielectric layer 632 has a thickness in a range from about 1 nm to about 10 nm. In some embodiments, the gate electrode 634 does not overlap the source/drain contacts 620.

Figure 43C:
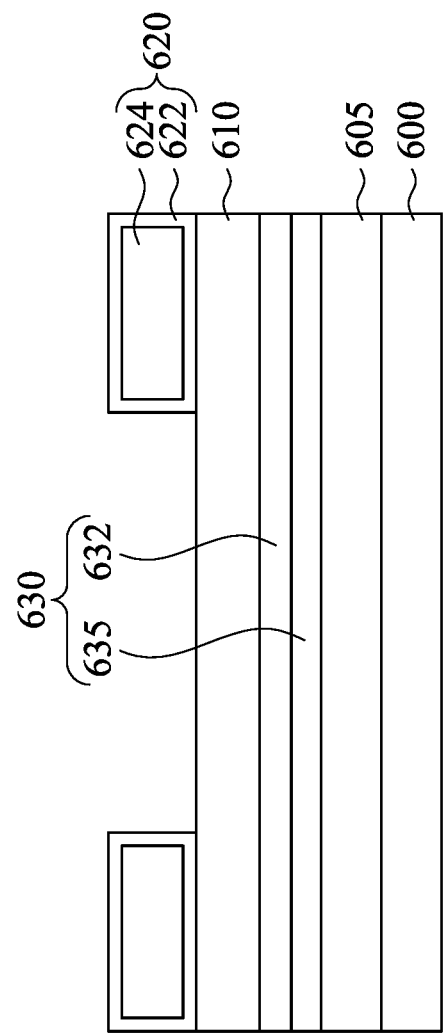

Reference is made to FIG. 43C. The gate structure 630 incudes a gate dielectric layer 632 and a gate electrode 635 below the gate dielectric layer 632. Different from the gate electrode 634 of FIG. 43B, the gate electrode 635 overlaps the source/drain contacts 620.

Reference is made to FIG. 43D. FIG. 43D is similar to FIG. 43B, the difference between FIG. 43D and FIG. 43B is that a spacer 650 is disposed over the 2-D material channel layer 610. In some embodiments, the spacer 450 has a thickness in a range from about 0.4 nm to about 0.8 nm. In some embodiments, the spacer 450 may be made of polymethylmethacrylate (PMMA), polydimethylsiloxane (PDMS), or photoresist (PR).

Reference is made to FIG. 43E. FIG. 43E is similar to FIG. 43C, the difference between FIG. 43E and FIG. 43C is that a spacer 650 is disposed over the 2-D material channel layer 610.

FIGS. 44A to 44E illustrate semiconductor devices in accordance with some embodiments of the present disclosure. It is noted that some elements described in FIGS. 44A to 44E may be similar to those described in FIGS. 1A to 8, and thus relevant details will not be repeated for brevity. FIGS. 44A to 44E are examples of "bottom gate" semiconductor device, in which source/drain contacts are in contact with edges of a 2-D material channel layer.

Figure 44A:
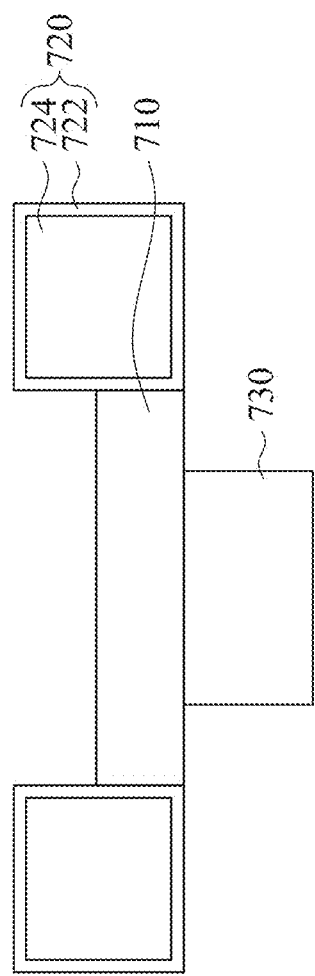

Reference is made to FIG. 44A. The device includes a 2-D material channel layer 710, source/drain contacts 720 disposed on opposite sides of the 2-D material channel layer 710, and a gate structure 730 disposed on bottom surface of the 2-D material channel layer 710. In some embodiments, the source/drain contacts 720 are in contact with the 2-D material channel layer 710 through edges of the 2-D material channel layer 710.

In some embodiments, each of the source/drain contacts 720 includes a first metal layer 722 and a second metal layer 724. The source/drain contacts 720, the first metal layer 722, and the second metal layer 724 may be similar to the source/drain contacts 140, the first metal layer 122, and the second metal layer 130 as described in FIGS. 1A to 8, and the formation method thereof can be similar to the processes as described in FIGS. 1A to 8.

Reference is made to FIG. 44B. A dielectric layer 705 is disposed over a substrate 700. The gate structure 730 is disposed over the dielectric layer 705. The 2-D material channel layer 710 is disposed over the gate structure 730. The source/drain contacts 720 are disposed on opposite sides of the 2-D material channel layer 710. The gate structure 730 incudes a gate dielectric layer 732 and a gate electrode 734 below the gate dielectric layer 732. In some embodiments, the gate dielectric layer 732 has a thickness in a range from about 1 nm to about 10 nm. In some embodiments, the gate electrode 734 does not overlap the source/drain contacts 720.

Reference is made to FIG. 44C. The gate structure 730 incudes a gate dielectric layer 732 and a gate electrode 735 below the gate dielectric layer 732. Different from the gate electrode 734 of FIG. 43B, the gate electrode 735 overlaps the source/drain contacts 720.

Reference is made to FIG. 44D. FIG. 44D is similar to FIG. 44B, the difference between FIG. 44D and FIG. 44B is that a spacer 750 is disposed over the 2-D material channel layer 710. In some embodiments, the spacer 750 has a thickness in a range from about 0.4 nm to about 0.8 nm. In some embodiments, the spacer 750 may be made of polymethylmethacrylate (PMMA), polydimethylsiloxane (PDMS), or photoresist (PR).

Reference is made to FIG. 44E. FIG. 44E is similar to FIG. 44C, the difference between FIG. 44E and FIG. 44C is that a spacer 750 is disposed over the 2-D material channel layer 710.

FIGS. 45A to 45E illustrate semiconductor devices in accordance with some embodiments of the present disclosure. It is noted that some elements described in FIGS. 45A to 45E may be similar to those described in FIGS. 1A to 8, and thus relevant details will not be repeated for brevity. FIGS. 45A to 45E are examples of "dual gate" semiconductor device, in which source/drain contacts are in contact with top surface of a 2-D material channel layer.

Figure 45A:
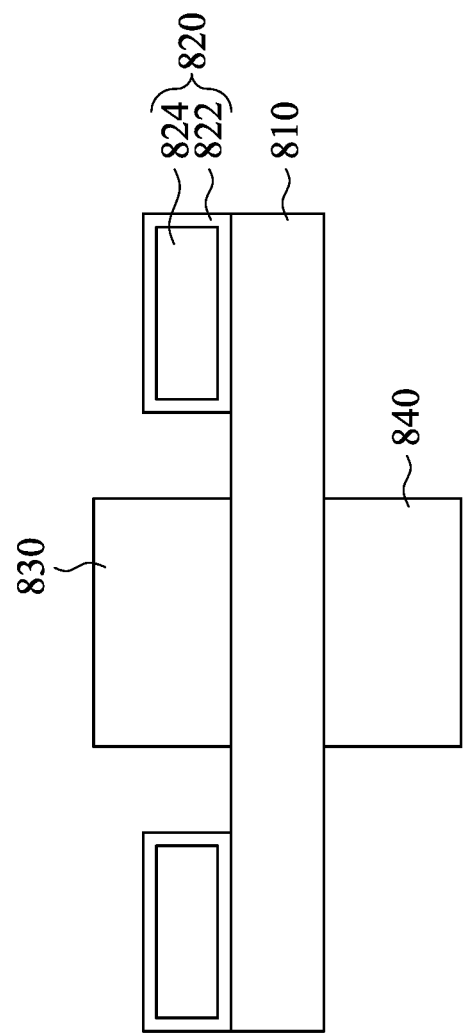
FIGS. 45A to 45E illustrate semiconductor devices in accordance with some embodiments of the present disclosure.

Reference is made to FIG. 45A. The device includes a 2-D material channel layer 810, source/drain contacts 820 disposed on top surface of the 2-D material channel layer 810, and a gate structure 830 disposed on top surface of the 2-D material channel layer 810, and a gate structure 840 disposed on bottom surface of the 2-D material channel layer 810.

In some embodiments, each of the source/drain contacts 820 includes a first metal layer 822 and a second metal layer 824. The source/drain contacts 820, the first metal layer 822, and the second metal layer 824 may be similar to the source/drain contacts 140, the first metal layer 122, and the second metal layer 130 as described in FIGS. 1A to 8, and the formation method thereof can be similar to the processes as described in FIGS. 1A to 8.

Figure 45B:
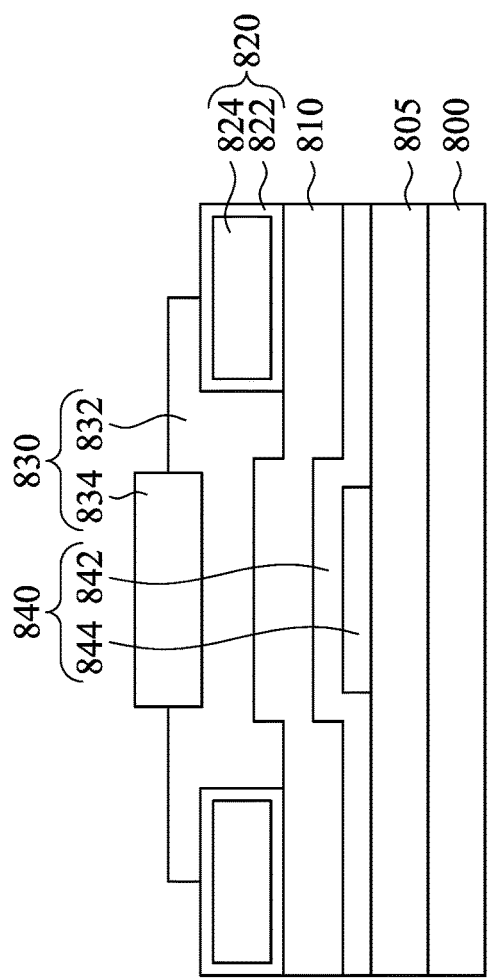

Reference is made to FIG. 45B. A dielectric layer 805 is disposed over a substrate 800. The gate structure 840 is disposed over the dielectric layer 805. The 2-D material channel layer 810 is disposed over the gate structure 840. The source/drain contacts 820 are disposed over the 2-D material channel layer 810. The gate structure 830 is disposed over the 2-D material channel layer 810. The gate structure 830 incudes a gate dielectric layer 832 and a gate electrode 834 over the gate dielectric layer 832. The gate structure 840 incudes a gate dielectric layer 842 and a gate electrode 844 below the gate dielectric layer 842. In some embodiments, the gate dielectric layers 832 and 842 have thicknesses in a range from about 1 nm to about 10 nm. In some embodiments, the gate electrodes 834 and 844 do not overlap the source/drain contacts 820.

Figure 45C:
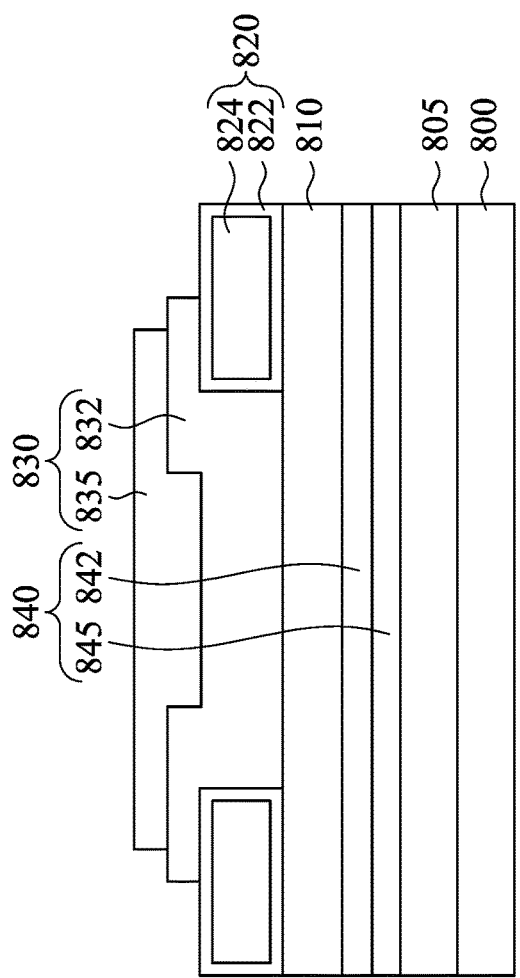

Reference is made to FIG. 45C. The gate structure 830 incudes a gate dielectric layer 832 and a gate electrode 835 over the gate dielectric layer 832. The gate structure 840 incudes a gate dielectric layer 842 and a gate electrode 845 below the gate dielectric layer 842. Different from the gate electrodes 834 and 844 of FIG. 45B, the gate electrodes 835 and 845 overlap the source/drain contacts 820.

Figure 45D:
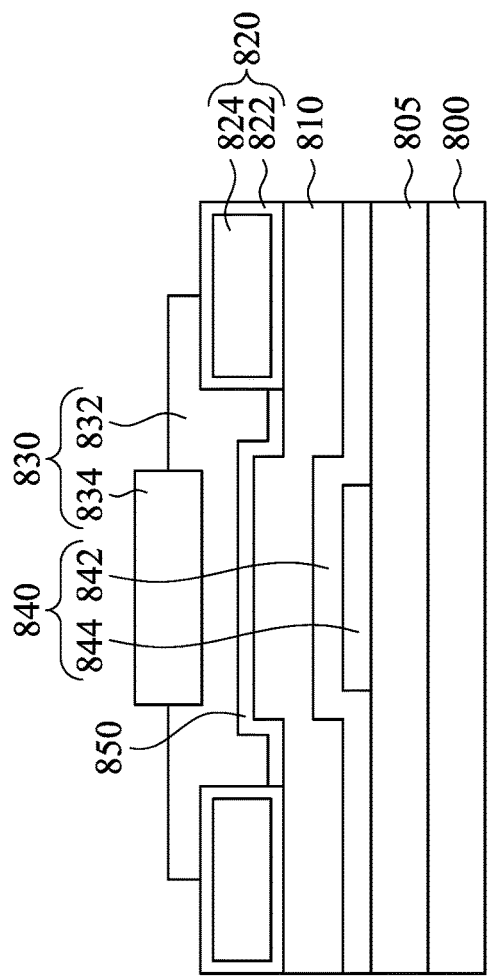

Reference is made to FIG. 45D. FIG. 45D is similar to FIG. 45B, the difference between FIG. 45D and FIG. 45B is that a spacer 850 is disposed between the gate dielectric layer 832 of the gate structure 830 and the 2-D material channel layer 810. In some embodiments, the spacer 850 has a thickness in a range from about 0.4 nm to about 0.8 nm. In some embodiments, the spacer 850 may be made of polymethylmethacrylate (PMMA), polydimethylsiloxane (PDMS), or photoresist (PR).

Figure 45E:
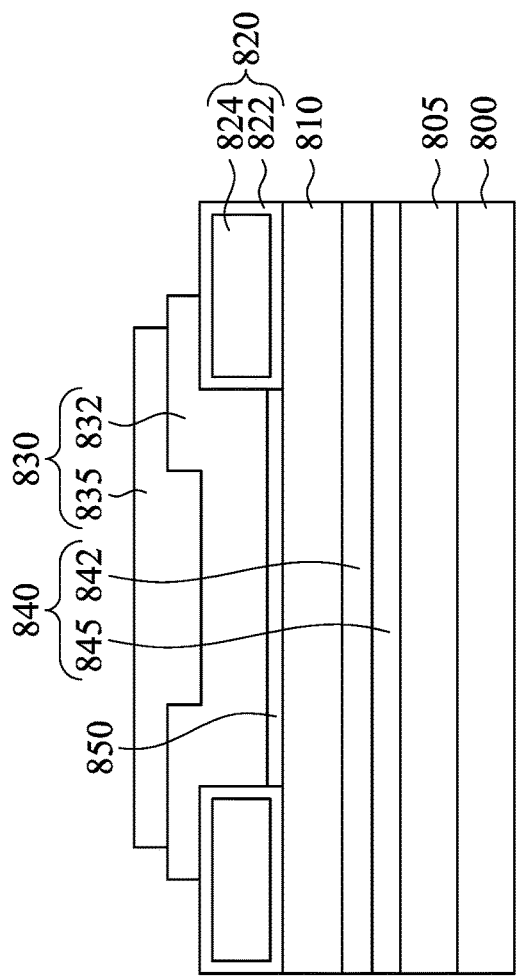

Reference is made to FIG. 45E. FIG. 45E is similar to FIG. 45C, the difference between FIG. 45E and FIG. 45C is that a spacer 850 is disposed between the gate dielectric layer 832 of the gate structure 830 and the 2-D material channel layer 810.

FIGS. 46A to 46E illustrate semiconductor devices in accordance with some embodiments of the present disclosure. It is noted that some elements described in FIGS. 46A to 46E may be similar to those described in FIGS. 1A to 8, and thus relevant details will not be repeated for brevity. FIGS. 46A to 46E are examples of "dual gate" semiconductor device, in which source/drain contacts are in contact with edges of a 2-D material channel layer.

Figure 46A:
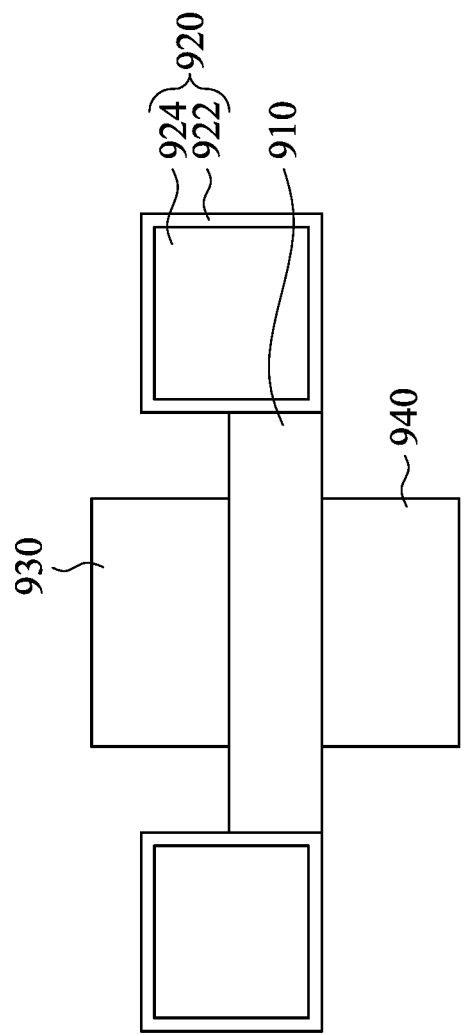
FIGS. 46A to 46E illustrate semiconductor devices in accordance with some embodiments of the present disclosure.

Reference is made to FIG. 46A. The device includes a 2-D material channel layer 910, source/drain contacts 920 disposed on opposite sides of the 2-D material channel layer 910, and a gate structure 930 disposed on top surface of the 2-D material channel layer 910, and a gate structure 940 disposed on bottom surface of the 2-D material channel layer 910. In some embodiments, the source/drain contacts 920 are in contact with the 2-D material channel layer 910 through edges of the 2-D material channel layer 910.

In some embodiments, each of the source/drain contacts 920 includes a first metal layer 922 and a second metal layer 924. The source/drain contacts 920, the first metal layer 922, and the second metal layer 924 may be similar to the source/drain contacts 140, the first metal layer 122, and the second metal layer 130 as described in FIGS. 1A to 8, and the formation method thereof can be similar to the processes as described in FIGS. 1A to 8.

Figure 46B:
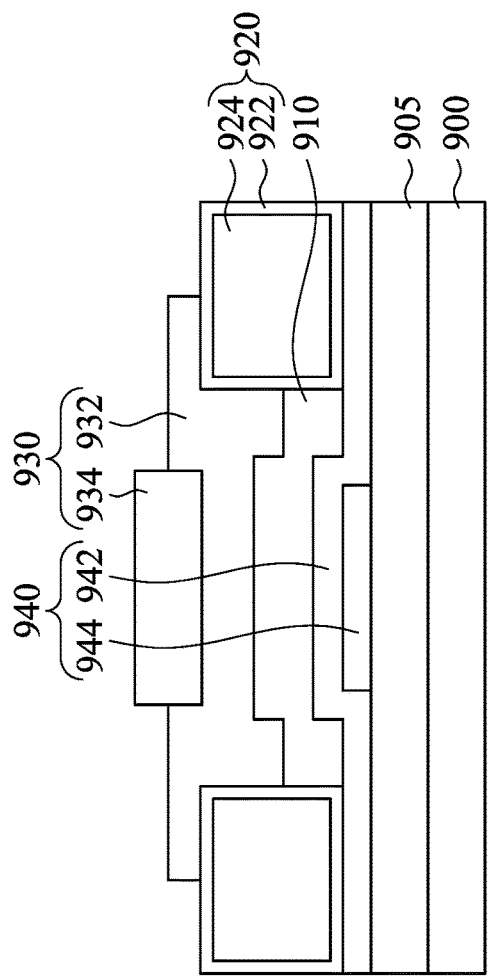

Reference is made to FIG. 46B. A dielectric layer 905 is disposed over a substrate 900. The gate structure 940 is disposed over the dielectric layer 905. The 2-D material channel layer 910 is disposed over the gate structure 940. The source/drain contacts 920 are disposed on opposite sides of the 2-D material channel layer 910. The gate structure 930 is disposed over the 2-D material channel layer 910. The gate structure 930 incudes a gate dielectric layer 932 and a gate electrode 934 over the gate dielectric layer 932. The gate structure 940 incudes a gate dielectric layer 942 and a gate electrode 944 below the gate dielectric layer 942. In some embodiments, the gate dielectric layers 932 and 942 have thicknesses in a range from about 1 nm to about 10 nm. In some embodiments, the gate electrodes 934 and 944 do not overlap the source/drain contacts 920.

Figure 46C:
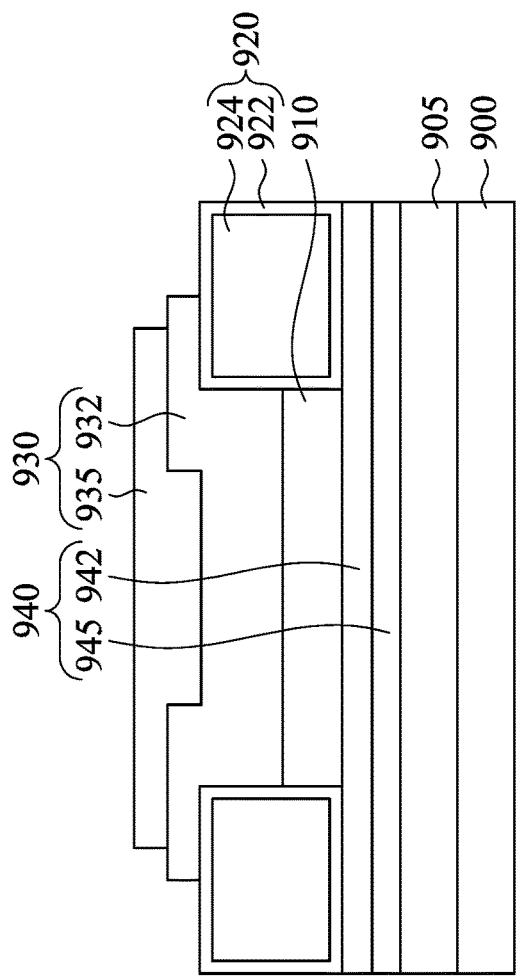

Reference is made to FIG. 46C. The gate structure 930 incudes a gate dielectric layer 932 and a gate electrode 935 over the gate dielectric layer 932. The gate structure 840 incudes a gate dielectric layer 942 and a gate electrode 945 below the gate dielectric layer 942. Different from the gate electrodes 934 and 944 of FIG. 46B, the gate electrodes 935 and 945 overlap the source/drain contacts 920.

Figure 46D:
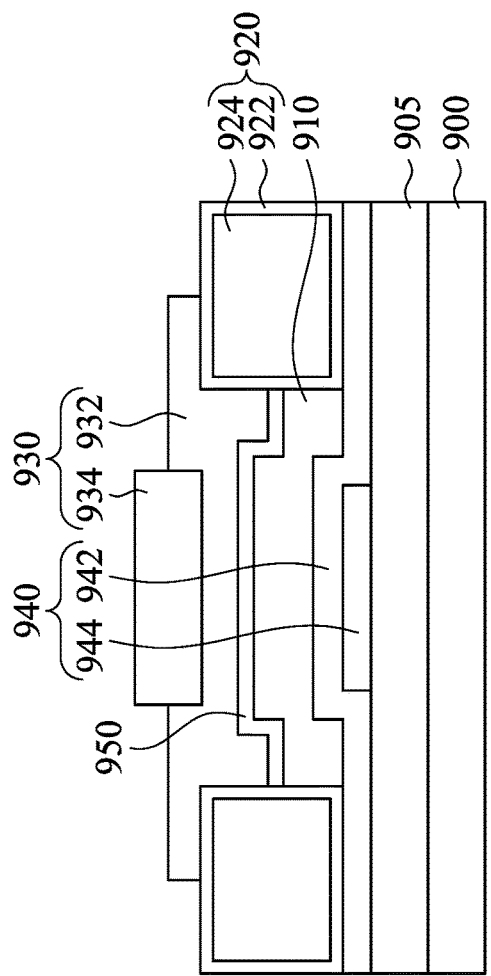

Reference is made to FIG. 46D. FIG. 46D is similar to FIG. 46B, the difference between FIG. 46D and FIG. 46B is that a spacer 950 is disposed between the gate dielectric layer 932 of the gate structure 930 and the 2-D material channel layer 910. In some embodiments, the spacer 950 has a thickness in a range from about 0.4 nm to about 0.8 nm. In some embodiments, the spacer 950 may be made of polymethylmethacrylate (PMMA), polydimethylsiloxane (PDMS), or photoresist (PR).

Figure 46E:
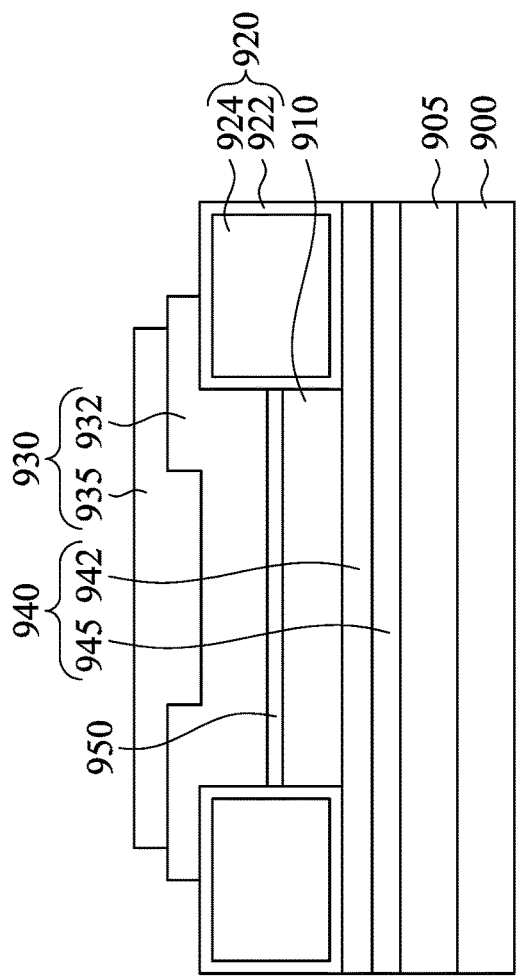

Reference is made to FIG. 46E. FIG. 46E is similar to FIG. 46C, the difference between FIG. 46E and FIG. 46C is that a spacer 950 is disposed between the gate dielectric layer 932 of the gate structure 930 and the 2-D material channel layer 910.

Based on the above discussions, it can be seen that the present disclosure offers advantages. It is understood, however, that other embodiments may offer additional advantages, and not all advantages are necessarily disclosed herein, and that no particular advantage is required for all embodiments. A first deposition process is performed to deposit a first metal layer, and then a second deposition process is performed to deposit a second metal layer having a higher melting point than the first metal layer. Accordingly, during the second deposition process, the second metal layer may re-melt the first metal layer, and cause the melted first metal layer coated on surfaces of the second metal layer. An advantage of the present disclosure is that the melted first metal layer can act as a buffer layer to prevent the second metal layer from causing thermal damage. Furthermore, the resulting source/drain contacts may include better crystallinity and adhesion, which in turn will lower the contact resistance. Moreover, the source/drain contacts can be formed without using additional cooling system. Accordingly, the device performance may be improved.

In some embodiments of the present disclosure, a method includes forming a 2-D semiconductor material layer over a substrate; forming source/drain contacts over source/drain regions of the 2-D semiconductor material layer; and forming a gate structure over a channel region of the 2-D semiconductor material layer. Forming the source/drain contacts includes performing a first deposition process to deposit a first metal layer over the 2-D semiconductor material layer; and after the first deposition process is completed, performing a second deposition process to deposit a second metal layer over the first metal layer, in which the second metal layer has a higher melting point than the first metal layer.

In some embodiments, the second deposition process is performed such that the first metal layer is melted, and the melted first metal layer is conformally coated on the second metal layer.

In some embodiments, the gate structure is in contact with the first metal layer and separated from the second metal layer.

In some embodiments, forming the source/drain contacts further includes forming a mask layer over the 2-D semiconductor material layer; patterning the mask layer to form openings in the mask layer that expose the source/drain regions of the 2-D semiconductor material layer; and removing the mask layer after the second deposition process is completed.

In some embodiments, the second deposition process is performed such that the first metal layer is melted, and the melted first metal layer separates the second metal layer from the mask layer.

In some embodiments, the method further includes forming a dielectric layer over the substrate prior to forming the 2-D semiconductor material layer.

In some embodiments, the first metal layer is made of tin (Sn), bismuth (Bi), or indium (In), and the second metal layer is made of gold (Au), platinum (Pt), or palladium (Pd).

In some embodiments of the present disclosure, a method includes forming a 2-D semiconductor material layer over a substrate; forming a patterned mask over the substrate, in which the pattern mask includes openings that expose source/drain regions of the 2-D semiconductor material layer; depositing a first metal in the openings of the patterned mask; after depositing the first metal, depositing a second metal in the openings of the patterned mask; removing the patterned mask, while leaving portions of the first metal and the second metal over the 2-D material layer to form source/drain contacts, in which each of the source/drain contacts includes an inner portion and an outer portion wrapping the inner portion, and an atomic concentration of the first metal at the outer portion is higher than an atomic concentration of the second metal at the outer portion; and forming a gate structure over a channel region of the 2-D semiconductor material layer.

In some embodiments, the first metal has a lower melting point than the second metal.

In some embodiments, the first metal is re-melted during depositing the second metal.

In some embodiments, the atomic concentration of the first metal at the outer portion of each of the source/drain contacts is higher than an atomic concentration of the first metal at the inner portion of each of the source/drain contacts.

In some embodiments, the atomic concentration of the second metal at the outer portion of each of the source/drain contacts is lower than an atomic concentration of the second metal at the inner portion of each of the source/drain contacts.

In some embodiments, an atomic concentration of the first metal at the inner portion of each of the source/drain contacts is lower than an atomic concentration of the second metal at the inner portion of each of the source/drain contacts.

In some embodiments, first and second metal are deposited by an e-gun evaporation process.

In some embodiments of the present disclosure, a device includes a substrate, a 2-D semiconductor material layer over the substrate, a first conductive contact in contact with a first region of the 2-D semiconductor material layer, a second conductive contact in contact with a second region of the 2-D semiconductor material layer spaced apart from the first region of the 2-D semiconductor material layer, a gate structure over the 2-D semiconductor material layer and laterally between the first conductive contact and the second conductive contact. The first conductive contact is a mixture of a first metal and a second metal, and the first metal has a higher atomic concentration in an outer portion of the first conductive contact than in an inner portion of the first conductive contact.

In some embodiments, the second conductive contact is also a mixture of the first metal and the second metal, and the first metal has a higher atomic concentration in an outer portion of the second conductive contact than in an inner portion of the second conductive contact.

In some embodiments, the first metal has a lower melting point than the second metal.

In some embodiments, the first metal is made of tin (Sn), bismuth (Bi), or indium (In), and the second metal is made of gold (Au), platinum (Pt), or palladium (Pd).

In some embodiments, the device further includes a dielectric layer between the substrate and the 2-D semiconductor material layer.

In some embodiments, the gate structure includes a gate dielectric layer extending to top surfaces of the first and second conductive contacts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a 2-D semiconductor material layer over a substrate;
    forming source/drain contacts over source/drain regions of the 2-D semiconductor material layer, wherein forming the source/drain contacts comprises:
        performing a first deposition process to deposit a first metal layer over the 2-D semiconductor material layer; and
        after the first deposition process is completed, performing a second deposition process to deposit a second metal layer over the first metal layer, wherein the second metal layer has a higher melting point than the first metal layer, and wherein the second deposition process is performed such that the first metal layer is melted to conformally coat on four sides of the second metal layer in a cross-sectional view; and
    forming a gate structure over a channel region of the 2-D semiconductor material layer.

2. The method of claim 1, wherein the gate structure is in contact with the first metal layer and separated from the second metal layer.

3. The method of claim 1, wherein forming the source/drain contacts further comprises:
    forming a mask layer over the 2-D semiconductor material layer;
    patterning the mask layer to form openings in the mask layer that expose the source/drain regions of the 2-D semiconductor material layer; and
    removing the mask layer after the second deposition process is completed.

4. The method of claim 3, wherein the melted first metal layer separates the second metal layer from the mask layer.

5. The method of claim 1, further comprising forming a dielectric layer over the substrate prior to forming the 2-D semiconductor material layer.

6. The method of claim 1, wherein the first metal layer is made of tin (Sn), bismuth (Bi), or indium (In), and the second metal layer is made of gold (Au), platinum (Pt), or palladium (Pd).

7. A method, comprising:
forming a 2-D semiconductor material layer over a substrate;
forming a patterned mask over the substrate, wherein the pattern mask comprises openings that expose source/drain regions of the 2-D semiconductor material layer;
depositing a first metal in the openings of the patterned mask and in contact with the source/drain regions of the 2-D semiconductor material layer;
after depositing the first metal, depositing a second metal in the openings of the patterned mask;
removing the patterned mask, while leaving portions of the first metal and the second metal over the 2-D semiconductor material layer to form source/drain contacts, wherein each of the source/drain contacts comprises an inner portion and an outer portion wrapping four sides of the inner portion in a cross-sectional view, and an atomic concentration of the first metal at the outer portion is higher than an atomic concentration of the second metal at the outer portion; and
forming a gate structure over a channel region of the 2-D semiconductor material layer.

8. The method of claim 7, wherein the first metal has a lower melting point than the second metal.

9. The method of claim 7, wherein the first metal is re-melted during depositing the second metal.

10. The method of claim 7, wherein the atomic concentration of the first metal at the outer portion of each of the source/drain contacts is higher than an atomic concentration of the first metal at the inner portion of each of the source/drain contacts.

11. The method of claim 7, wherein the atomic concentration of the second metal at the outer portion of each of the source/drain contacts is lower than an atomic concentration of the second metal at the inner portion of each of the source/drain contacts.

12. The method of claim 7, wherein an atomic concentration of the first metal at the inner portion of each of the source/drain contacts is lower than an atomic concentration of the second metal at the inner portion of each of the source/drain contacts.

13. The method of claim 7, wherein the first and second metals are deposited by an e-gun evaporation process.

14. A method, comprising:
forming a 2-D semiconductor material layer over a substrate;
forming a first conductive contact in contact with a first region of the 2-D semiconductor material layer and a second conductive contact in contact with a second region of the 2-D semiconductor material layer spaced apart from the first region of the 2-D semiconductor material layer, wherein the first conductive contact is a mixture of a first metal and a second metal, and the first metal has a higher atomic concentration in an outer portion of the first conductive contact than in an inner portion of the first conductive contact, the outer portion wrapping four sides of the inner portion in a cross-sectional view, and wherein the outer portion is thinner than the inner portion; and
forming a gate structure over the 2-D semiconductor material layer and laterally between the first conductive contact and the second conductive contact.

15. The method of claim 14, wherein the second conductive contact is also a mixture of the first metal and the second metal, and the first metal has a higher atomic concentration in an outer portion of the second conductive contact than in an inner portion of the second conductive contact.

16. The method of claim 14, wherein the first metal has a lower melting point than the second metal.

17. The method of claim 14, wherein the first metal is made of tin (Sn), bismuth (Bi), or indium (In), and the second metal is made of gold (Au), platinum (Pt), or palladium (Pd).

18. The method of claim 14, further comprising forming a dielectric layer over the substrate prior to forming the 2-D semiconductor material layer.

19. The method of claim 14, wherein the gate structure comprises a gate dielectric layer extending to top surfaces of the first and second conductive contacts.

20. The method of claim 14, wherein forming the first conductive contact comprises:
depositing the first metal over the first region and the second region of the 2-D semiconductor material layer; and
after depositing the first metal, depositing the second metal over the first metal, wherein during depositing the second metal, the first metal is melted.

* * * * *